(12) United States Patent
Yagi et al.

(10) Patent No.: US 6,340,891 B1
(45) Date of Patent: Jan. 22, 2002

(54) METHOD OF DIAGNOSING DETERIORATION OF THE INSULATION OF AN ELECTRIC POWER CABLE

(75) Inventors: Yukihiro Yagi; Hideo Tanaka, both of Tokyo (JP)

(73) Assignee: Furukawa Electric Co., Ltd. (JP)

( * ) Notice: Subject to any disclaimer, the term of this patent is extended or adjusted under 35 U.S.C. 154(b) by 0 days.

(21) Appl. No.: 09/445,798

(22) PCT Filed: Apr. 7, 1999

(86) PCT No.: PCT/JP99/01847

§ 371 Date: Dec. 10, 1999

§ 102(e) Date: Dec. 10, 1999

(87) PCT Pub. No.: WO99/53329

PCT Pub. Date: Oct. 21, 1999

(30) Foreign Application Priority Data

Apr. 14, 1998 (JP) .......................................... 10-102362
Aug. 3, 1998 (JP) .......................................... 10-219230
Nov. 9, 1999 (JP) .......................................... 10-317804

(51) Int. Cl.[7] .......................... G01R 31/02; G01R 31/12
(52) U.S. Cl. ..................... 324/551; 324/544; 324/76.13
(58) Field of Search ................................ 324/541, 544, 324/551, 76.13, 76.14

(56) References Cited

U.S. PATENT DOCUMENTS 4,099,117 A * 7/1978 Erath .......................... 324/557
4,638,242 A * 1/1987 Matsuno ...................... 324/551
4,857,830 A * 8/1989 Matsuno ...................... 324/544
4,929,903 A * 5/1990 Saigo et al. ................. 324/544
5,117,191 A * 5/1992 Saigo et al. ................. 324/551

* cited by examiner

Primary Examiner—Glenn W. Brown
(74) Attorney, Agent, or Firm—Bierman, Muserlian and Lucas

(57) ABSTRACT

The diagnosis method of deterioration of electric power cable is that which diagnoses the deterioration accurately without a especial effort to reduce the harmonics in an electric power source equipment for test.

Loss current component, which is obtained by rejecting the capacitive component of frequency f1 contained in the total current flowing in the insulation of the electric power cable, when superimposing a first voltage V1 of frequency f1 and a second voltage V2 of frequency f2 (V1≧V2) to an electric power cable, is measured. Further the current components and the frequency components contained in the current is investigated. The deterioration diagnosis is implemented by frequency components excepting the frequency f1, f2 and the their harmonic. As combinations of frequency f1 and f2 of the AC voltage a combination that frequency f2 is two times of the frequency f1 is used, and the current components of frequency components of four times of the first voltage in the frequency components are measured, and the deterioration are diagnosed by the current components and the superimposed phases θ4.

12 Claims, 55 Drawing Sheets

| f1,f2 | f1,3xf1,5xf1 | f1,3xf2, 5xf2 | DETERIORATION SIGNAL | |
|---|---|---|---|---|
| | | | f2+2×f1 | \|f2−2×f1\| |
| 50, 100(2xf1) | 50, 150, 250 | 100, 300, 500 | 200 | 0 |
| 50, 25(f1/2) | 50, 150, 250 | 25, 75, 125 | 125 | 75 |
| 50, 16.7(f1/3) | 50, 150, 250 | 16.7, 50, 83.3 | 116.7 | 83.3 |
| 50, 12.5(f1/4) | 50, 150, 250 | 12.5, 37.5, 62.5 | 112.5 | 87.5 |
| 50, 10(f1/5) | 50, 150, 250 | 10, 30, 50 | 110 | 90 |

: Deterioration signal is same with the third of fifth harmonic wave of applied voltage Fig.3
(a)
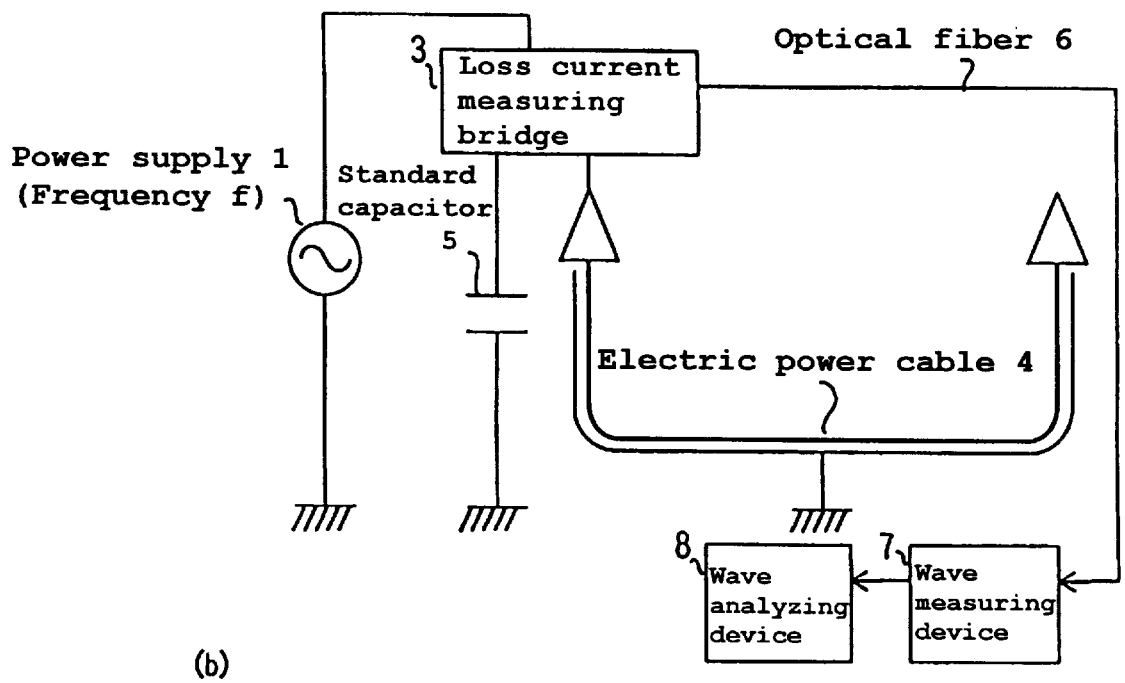
(b)
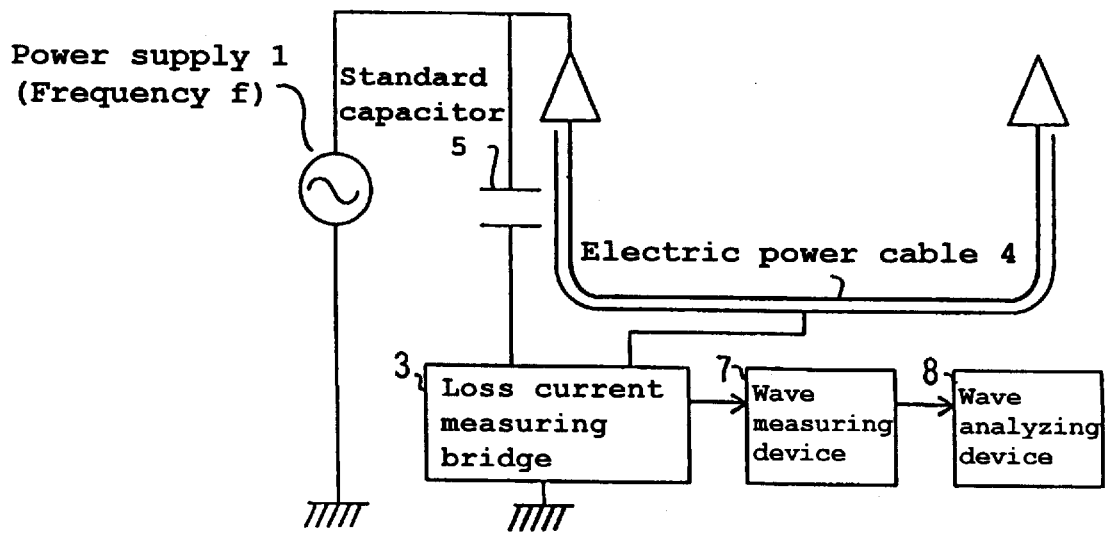

| Current /<br>Applied voltage<br>f1+f2 | 0.1Hz+0.15Hz | 0.1Hz+0.2Hz | 0.1Hz+0.25Hz |
|---|---|---|---|
| 0.05Hz | 13.5% | <1% | 15.8% |
| 0.10Hz | 100% (126nA) | 100% (118nA) | 100% (121nA) |
| 0.15Hz | 36.5% | <1% | <1% |
| 0.20Hz | <1% | 50.4% | <1% |
| 0.25Hz | <1% | <1% | 60.3% |
| 0.30Hz | 19.9% | 17.5% | 18.2% |
| 0.35Hz | 15.9% | <1% | <1% |
| 0.40Hz | <1% | 15.1% | <1% |
| 0.45Hz | 11.7% | <1% | 14.3% |

: Frequency of applied voltage
: The third harmonic of the applied voltage
: Specifically occurred frequency

Fig. 21

| Frequency of V1,V2 | Frequency at which deterionation signels occur | Rate of deterioration signal to components of 50Hz  % | |
|---|---|---|---|
| | | New one | Deteriorated one |
| f1=50Hz, f2=25Hz (f1/2) | 75Hz ( \|f2-2xf1\| ) | 13.2 | 14.6 |
| | 125Hz (f2+2xf1) | 13.7 | 15.6 |
| f1=50Hz, f2=16.7Hz (f1/3) | 83.3Hz ( \|f2-2xf1\| ) | 12.5 | 14.1 |
| | 116.7Hz (f2+2xf1) | 1.6 | 15.3 |
| f1=50Hz, f2=12.5Hz (f1/4) | 87.5Hz ( \|f2-2xf1\| ) | 2.0 | 14.5 |
| | 112.5Hz (f2+2xf1) | 1.9 | 13.9 |
| f1=50Hz, f2=10Hz (f1/5) | 90Hz ( \|f2-2xf1\| ) | 1.7 | 14.8 |
| | 110Hz (f2+2xf1) | 1.9 | 15.1 |

[....] : Parts to the third or fifth harmonic of f2

Fig.24

| Cable kind | The amplitude of the third harmonic current |
|---|---|
| New one | 32 nA |
| Light deterioration one | 0.566 μA |
| Heavy deterioration one | 1.39 μA |

Fig.29

| Cable kind | The amplitude of the third harmonic current |
|---|---|
| New one | 1. 2 8 $\mu$ A |
| Light deterioration one | 1. 4 1 $\mu$ A |
| Heavy deterioration one | 1. 3 6 $\mu$ A |

Fig.35

|  | The amplitude of the third harmonic current | Superimposing phase of the third harmonic current |
|---|---|---|
| New one | 32 nA | −57.3° |
| Light deterioration one | 0.566 μA | −42.8° |
| Heavy deterioration one | 1.39 μA | −11.3° |

Fig.38

|  | The amplitude of the third harmonic current | Superimposing phase of the third harmonic current |
|---|---|---|
| New one | 1.28 μA | −45.9° |
| Light deterioration one | 1.41 μA | −46.3° |
| Heavy deterioration one | 1.36 μA | −43.7° |

Fig.41

| Sample | θv2 [°] | θ4 [°] | Breakdown voltage [kV] |
|---|---|---|---|
| 1 | -73.2 | 9.3 | over 300 |
| 2 | 43.5 | -21.7 | over 300 |
| 3 | 12.4 | -36.4 | over 300 |
| 4 | -56.7 | 23.5 | 200 |
| 5 | -13.2 | -35.7 | 195 |
| 6 | 1.3 | -30.3 | 130 |
| 7 | 39.3 | -14.2 | 175 |
| 8 | -29.6 | -41.0 | 130 |
| 9 | -86.3 | 23.2 | 120 |
| 10 | 68.8 | 17.9 | 85 |
| 11 | -48.1 | -27.3 | 40 |
| 12 | -40.5 | -29.9 | 70 |
| 13 | 59.4 | 21.7 | 50 |
| 14 | 32.7 | -5.0 | 80 |
| 15 | -20.2 | -23.1 | 45 |

Fig.43

| Sample | $\theta v2$ [°] | $\theta 4$ [°] | Breakdown voltage [kV] |
|---|---|---|---|
| 1 | 0 | -44.5 | over 300 |
| 2 | 0 | -43.4 | over 300 |
| 3 | 0 | -42.6 | over 300 |
| 4 | 0 | -38.2 | 200 |
| 5 | 0 | -29.1 | 195 |
| 6 | 0 | -30.9 | 130 |
| 7 | 0 | -33.8 | 175 |
| 8 | 0 | -26.2 | 130 |
| 9 | 0 | -23.7 | 120 |
| 10 | 0 | -16.5 | 85 |
| 11 | 0 | -3.2 | 40 |
| 12 | 0 | -9.6 | 70 |
| 13 | 0 | -8.0 | 50 |
| 14 | 0 | -21.3 | 80 |
| 15 | 0 | -13.0 | 45 |

Fig. 48

|  | I4[μA] | θ4[°] | Breakdown voltage [kV] |
|---|---|---|---|
| Sample A | 2.133 | -9.6 | 70kV |
| Sample B | 0.762 | -13.0 | 45kV |

Fig.53

|     |                       | Field aged cable | New cable |
|-----|-----------------------|------------------|-----------|
| [1] | 50Hz/3kV              | 290nA            | 320nA     |
| [2] | 50Hz/2kV+100Hz/0.6kV  | 187nA            | 16nA      |
| [3] | 50Hz/1kV+100Hz/0.3kV  | 51nA             | 12nA      |

Fig.54

| Basic voltage | Field aged cable | New cable | S/N ratio |
|---|---|---|---|
| 0.1kV | 11nA | 9nA | 1.22 |
| 0.2kV | 10nA | 10nA | 1.00 |
| 0.3kV | 9nA | 10nA | 0.90 |
| 0.4kV | 12nA | 9nA | 1.33 |
| 0.5kV | 16nA | 11nA | 1.45 |
| 0.6kV | 21nA | 10nA | 2.10 |
| 0.7kV | 27nA | 11nA | 2.45 |
| 0.8kV | 31nA | 12nA | 2.59 |
| 0.9kV | 42nA | 13nA | 3.23 |
| 1.0kV | 51nA | 12nA | 4.25 |

Fig.55

| Maximum output voltage of fundamental voltage | 1kV | 2kV | 3kV | 5kV | 10kV | 15kV |
|---|---|---|---|---|---|---|
| Net weight | 0.8t | 1.2t | 1.5t | 2.7t | 3.8t | 6.2t |

METHOD OF DIAGNOSING DETERIORATION OF THE INSULATION OF AN ELECTRIC POWER CABLE

TECHNICAL FIELD

The present invention relates to a diagnosis method of deterioration of insulators such as rubber or plastic electric power cables, which diagnoses accurately the deterioration without a particular countermeasures for harmonics in an electric power source equipment for the test.

BACKGROUND ART

In the prior art, the diagnosis of the deterioration is that which applies the alternative voltage of commercial supply frequency to the electric power cables (in the following, called cables) insulated by the rubber or plastic and measures loss current components contained in current flowing in a ground conductor. In this case, the deterioration of the insulation is diagnosed by examining a third harmonic component contained in the loss current.

There are the following problems in the above mentioned prior art diagnoses of the deterioration.

(1) When the harmonics contained in the applied voltage waves are suppressed thoroughly, the deterioration diagnoses by examining the third harmonic in the conventional method can be performed precisely. But, when harmonics, particularly the third harmonic, are contained in the applied waves, the harmonics in the applied wave are respectively contained in the detected loss current. Since these harmonic signals in the loss current are squared by the harmonic degree other than the original one, for example, the third harmonic is magnified nine times compared to the original harmonic in the applied wave and this magnified third harmonic is contained in the waves of the loss current as noise. Consequently, the precise deterioration diagnosis by examining the third harmonic in the loss current cannot be performed.

Using a power supply in which harmonics are suppressed thoroughly is good for the countermeasures, but, for realizing the power supply which the containing ratio of the harmonics is reduced, connecting filters to high voltage part of a test circuit, using a transformer having inner structures contrived so as to be difficult to occur the harmonics, or using sign wave generator suppressing the containing rate of the harmonics are necessary for an original power supply. So, realizing them is high cost, and the size of the test equipment becomes pretty large, so that it causes a problem that the implementation of the test is difficult.

(2) In prior art, many diagnosis technique under out of hot line, which diagnoses by applying an alternative voltage, all cases proposed in the prior art are carried out under the same voltage value to the operating voltage to ground of the cable. In these prior art techniques, the alternative voltage is applied usually from a test transformer for applying the alternative voltage.

The voltage to ground is 19.1 kV for a line of 33 kV, and 38.1 kV for a line of 66 kV, so that a great electrostatic capacity transformer is necessary for applying such a high voltage to long distance cable in actual power system. The generating voltage of the transformer is not so high, but the capacitance of the object line for applying the voltage is great, so there is a problem that the weight of the set equipment is very great.

For example, a transformer of 20 kV designed for a line of the electrostatic capacitance of 2.5 $\mu F$ and the applied voltage of 19.1 kV has a gross weight over 5 tons.

Generally many electric power cable lines are constructed under grounds of an over crowding city, so there are cases that setting the large equipment for the test is difficult.

Further, in the case that the cables are used in the underground power transmission lines, those of which structures of the terminal ends connection parts are connected directly to a gas insulated switches (GIS) are used usually. The high pressure parts therein is contained in a package insulated by the gas of sulfur six fluoride ($SF_6$) which is good for the insulation.

So, there are not usually exposed high voltage parts in an underground room of building where a transformer substation is settled, apparatuses are settled without considering the distance for insulation thereof, and it makes the transformer substation size itself small.

On the other hand, it obstructs applying externally the voltage to cables for the test. there is not any exposed part of the high voltage, so that, when the voltage is applied to the end terminal of the connection part of the cable, very complex procedures are necessary, such as that SF6 gas in the GIS is retrieved once, and an adapter for applying the voltage for the test is attached, the SF6 gas again is filled, the test is implemented, further, after finishing the test, the gas is again retrieved to detach the adapter for applying the voltage, and GIS is returned.

It needs not only long time but also costs. Generally a million yen are necessary for one diagnosis of the deterioration, and the foregoing gas treatment of the GIS is necessary for the same costs. That is, the same supplementary costs with the essential measurement is caused, so that it brings extremely bad economics.

For resolving the forgoing problems, the applying voltage for the cable is lowered. By this, the capacity of the transformer becomes small, and the small sizing of the transformer is achieved. But, the deterioration signal becomes small by the lowering the test voltage, so that a problem aggravating the sensitivity to detect the deterioration is caused.

Like this, the prior art has problems such that the transformer for the test is big size, the inconvenience for using in a city and necessity of an enormous cost in the execution, and the necessity of the costs of the gas treatment which is necessary for applying the voltage to the GIS line. When the equipment is miniaturized by lowering the test voltage, the sensitivity of the detection signal is deteriorated, and the practicality is lost.

The present invention is developed based on the consideration of the above mentioned problem (1),(2). A first object of the present invention is that which provides the diagnosing method of the deterioration of electric power cables which can diagnose the deterioration without taking an especial countermeasure for the harmonics in the test power supply equipment.

The second object of the present invention is that which provides the diagnosing method of the deterioration of electric power cables which has a sensitivity of the signals detection having a practical level and can reduce a lot of total costs for diagnosing the deterioration.

DISCLOSURE OF THE INVENTION

The above mentioned problems are resolved by following components.

(1) When a first voltage of frequency f1 and a second voltage V2 of frequency f2 (V1≧V2) are superimposed on electric power cables, loss current components which capacitive components of frequency f1 contained in the current in a insulator of the electric power cable is rejected are measured, the current and frequency components contained in the current are investigated, and the deterioration diagnosis is executed by the components excepting the frequency components f1, frequency components f2 and the third harmonic contained thereof.

(2) In the (1), the diagnosis is implemented based frequency component of f2+2×f1 or |f2−2×f1| contained in the loss current.

(3) In the (1) or (2), a combination that frequency f2 is two times of the frequency f1 is used as a combination of f1 and f2 of the two kinds of the alternative voltage.

(4) In the (1) or (2), as combination that f2 is 1/n times of f1 (n is integer over 3) is used as a combination of the f1 and f2.

(5) In the (3), from the frequency components contained in the loss current, a current components of 4 times of the first frequency is measured, and a phase of the voltage of the frequency of 2 times frequency to the first voltage being changed, change of the amplitude of the current components of 4 times of the first frequency is measured to diagnose the deterioration of the cable.

(6) In the (3), from the frequency components contained in the loss current, a current components of 4 times of the first frequency is measured, based on a relation a superimposed phase θv2 of the second voltage V2 to the first voltage V1 and a superimposed phase θ4 of the fourth harmonic components contained in the measured loss current to the first voltage v1, the deterioration of the cable is diagnosed.

(7) In the (6), using that a relation the superimposed phase θv2 of the second voltage v2 to the first voltage v1 and a superimposed phase θ4 of the fourth harmonic components to the first voltage v1 is approximated to a line having a constant inclination decided by the degree of the deterioration, the degree of the deterioration of the electric power cable is diagnosed based on the superimposed phase θ4 of the fourth harmonic measured by a superimposed voltage and the superimposed phase θv2 of the second voltage at the time.

(8) In the (3), the degree of the deterioration of the cable is diagnosed by estimating together both of the amplitude I4 of current components of the fourth harmonic contained in the loss current and the superimposed phase θ4 of the current component of the fourth harmonic to the first voltage V1.

(9) In (3), keeping the rate of the first voltage V1 and second voltage V2 same, the measurement is implemented at least by two kinds of voltages, the degree of the deterioration is diagnosed by estimating the voltage characteristic of the amplitude I4 of the current components of the fourth harmonic, and the voltage characteristic of the superimposed phase θ4 to the first voltage V1 of the current components of the fourth harmonic.

(10) In the (1),(2),(3),(4),(5),(6),(7),(8) and (9), after a first voltage V1 of frequency f1 is applied to the electric power cable, loss current components, which the capacitive components of frequency f1 contained in the current in the electric power cable is rejected, are measured, the current wave forms and frequency components contained in the current are investigated, next, fixing the first voltage same, the loss current components in the case further superimposing the second voltage V2 (V1≧V2) of the frequency f2, and investigating the current wave forms and the frequency components contained in the currents, the diagnosis of the deterioration is executed by the components excepting the frequency components f1, frequency components f2 and the third harmonic contained thereof.

(11) In the (1),(2),(3),(4),(5),(6),(7),(8) and (9), when a first voltage V1 of frequency f1 is applied to the electric power cable, the loss current components, which capacitive components of frequency f1 in the electric power cable are rejected, are measured, next, keeping still the operation rejecting the above mentioned capacity components, and measuring the loss current components in the case that a composed voltage of the second voltage V2 (V1≧V2) of the frequency f2 to the same voltage with the first voltage of frequency f1 is applied instead of the first voltage V1 of frequency f1 is measured, the current and frequency components contained in the current is investigated, and the deterioration is diagnosis by the frequency components excepting the frequency components f1, frequency components f2 and the third harmonic contained thereof in both of loss current.

(12) In the (1),(2),(3),(4),(5),(6),(7),(8),(9),(10) and (11), the first voltage V1 is commercial supply frequency.

As mentioned above, when a first voltage V1 of frequency f1 and a second voltage V2 of frequency f2 (V1≧V2) are superimposed on electric power cables, loss current components which capacitive components of frequency f1 from the current in the electric power cable is rejected are measured, the current component and frequency components contained in the current are investigated, and the deterioration diagnosis is executed by the components excepting the frequency components f1, frequency components f2 and the third harmonic contained thereof, by this, the deterioration of cables is precisely diagnosed without affection of the third harmonic in a power supply. Also selecting the frequency f1 and f2, the high exactitude diagnosis of the deterioration of cables is implemented.

Further, a deterioration diagnosis, having a necessary and sufficient signals detecting sensitivity, is implemented by using a widely usable and portable test equipment, so that the diagnosis of the deterioration which is good working on site and good maneuverability is realized.

BRIEF DESCRIPTION OF DRAWINGS

FIG. 3 shows an example of measuring circuit of loss current in prior art diagnosing method of deterioration.

FIG. 21 shows a result of deteriorated signals occurred in the loss current by the superimposing voltage V1, V2.

FIG. 24 shows measurement result of prior art by a power supply in which containing rate of harmonics is suppressed.

FIG. 29 shows a result of a prior art method by a test power supply in which containing rate of harmonics is not suppressed.

FIG. 35 shows a measured result of a prior art by using an applied voltage which scarcely contain harmonics components.

FIG. 38 shows a result measured by a prior art using an applying voltage containing harmonics components.

FIG. 41 shows a relation of break down voltages and $\theta 4$ measured in condition of phase of superimposing voltage $\theta v2$ which is not kept to any constant value.

FIG. 43 shows a relation of $\theta 4$, which is obtained after the correction of the result measured in condition of phase of superimposing voltage θv2 which is not kept to any constant value, and break down voltages (correction corresponding to θv2=(0°))

FIG. 48 shows measured values of sample A and sample B.

FIG. 53 shows a measured result (the amplitude of the third harmonic and the fourth harmonic) of the measuring example 1.

FIG. 54 shows the amplitude of the fourth harmonic currents at various measured voltages.

FIG. 55 shows a result of estimated weights of test transformers (maximum capacity 3 $\mu$F).

DETAILED DESCRIPTION OF THE INVENTION

Figure 1:
FIG. 1 shows f1, f2 and frequencies of deterioration signals.

In the following, modes for carrying out the present invention are explained.

A. Embodiment 1: The deterioration diagnosis by superimposing Voltage V1 (frequency f1) and voltage V2 (frequency f2) to an electric power cable.

Harmonics which occur in the case of applying one frequency to a circuit are, generally, odd order harmonics such as the third, the fifth, the seventh, . . .

It is explained that these odd order harmonics are generated because the circuit is slightly nonlinear. The harmonics contained in the loss current are generated by the above mentioned theory. That is, when an insulation of cables is deteriorated, the characteristic of voltage-current gets to be further nonlinear, so that the odd order harmonics are magnified. Especially, the low order harmonic, namely the third harmonic, is magnified. Therefore, the deterioration of the insulation of a cable is to be diagnosed by examining the third harmonic in the loss current. But the odd order harmonics are originally generated because of the nonlinear circuit even in the case that insulation is not deteriorated. The precise deterioration diagnosis cannot be fully performed by examining only the odd order harmonics in the loss current with a single frequency.

Then, another diagnosis method has been investigated. In this new method, in addition to the loss current measurement at mono frequency f1 in the prior art, another frequency f2 is superimposed to frequency f1 to the cable and these two frequencies make occur new frequency component, which is not the same with the third harmonic of f1.

But, by applying the voltage having frequency f2, It's goes without saying that the odd order harmonics of the frequency f2 occur, so that an exact diagnosis is not expected from the diagnosis by investigating only the third harmonic of the frequency f2.

Also, the sufficient countermeasure for the suppression of the harmonics is necessary for the power equipment occurring the second frequency f2 (in the following, called as the second voltage), so that the same careful countermeasure with the equipment making the voltage of frequency f1 (in the following, called as the first voltage) is necessary for the power equipment. Because of this, the diagnosis is inutile in practice.

By the way, as mentioned above, the non-linear voltage-current characteristics are caused by the deterioration of the cable insulator, and it is verified that, when the characteristic are expressed by approximation by Taylor' series, in addition to a term which voltages are proportional to currents according to the law of Ohm, a current component proportional to the cube of the voltage is occurred, which is confirmed by experiments.

It is found by theoretical calculation that when an input signal having two frequencies of frequency f1 and f2 to a non-linear system like this, frequency components of f2+2×f1, |f2−2×f1|, f1+2×f2, |f1−2×f2| are output in addition to the f1, f2 (input frequency), 3×f1, 3×f2 (the third harmonic of the input frequency.

In this, it is found that, when V2≧V1 for a voltage V1 of frequency f1 and a voltage V2 of frequency f2, frequency components f2+2×f1, |f2−2×f1| are largely output aside from the input frequency and the third harmonic. Accordingly, selecting the frequency f1 and f2 so as both of the frequencies not to be the third harmonic of input signals, and taking out the frequencies as the deterioration signals, the deterioration diagnosis is implemented with a high sensitivity without affections of harmonic of the power equipment.

For example, when f1=50 Hz, f2=70 Hz, the aforementioned two frequency components are 30 Hz and 170 Hz, it is clear that they are different from both of the third harmonic of frequency f1 and f2, which is 50×3=150 Hz, 70×3=210 Hz.

For observing the frequency current, it is necessary to reject capacity elements included in a ground line current of a cable, alike a usual measurement of the loss current. When implementing the operation, the capacity components of current flowing in the cable insulation is rejected in a state applying only the first voltage by using the same operation with the usual measurement of the loss current. Next, keeping the measuring circuit with a state which has rejected the capacitive current components under the first voltage, the frequency components corresponding to the deterioration signals are appeared by applying the second voltage.

The deterioration of a cable is observed like this without accepting influence of the harmonics included in the power equipment, so that an exactitude diagnosis of the deterioration is implemented, even if an original power supply equipment in which containing rate of the harmonics is great is used.

As mentioned above, concerning to a choice of frequency f1 and f2, if both of f2+2×f1, |f2−2×f1| are not same with both of the third harmonic of f1 and f2, the effects of the present invention are shown by any one of combination of f1 and f2 on the theory. But considering a real measuring on site, when the applied voltages are V1≧V2, it is the most reasonable combination of f1 and f2 that f2 is two times of f1 or 1/n times of f1 (n is a 3 or more integer (≧3)), and f1 is the commercial supply frequency.

This is for the following reason, the first, when both of the f1 and f2 are different from the commercial supply frequency, two devices for generating each frequency (power supply for frequency converter) are necessary, but when the first voltage V1 of frequency f1 is the commercial power supply, the power supply for the frequency converter which is necessary for preparing is one, and a capacity of the power supply for the frequency converter is less than the case of setting f2 as the commercial frequency.

As an averaging treatment is implemented in an occasion obtaining the loss current waves by setting the f2 as a frequency synchronized with the frequency f1, the measurement is implemented with a higher sensitivity.

Because of the two reasons, it is preferable that f1 is the commercial power supply and f2 is integer times of f1 or 1/integer times of f1. Further, a load of the cable is a capacitive load, when the applied voltages is same, a capacitive of the power supply becomes big in proportion to the frequency, considering this, the upper limit of f2 is two times of f1 (commercial supply frequency).

If frequency of three times of f1 is used as the frequency f2, deterioration signals (f2+2×f1=5×f1, |f2−2×f1|=f1) occurred from the principle of the present invention are same with the applied voltage and the fifth harmonic component, so that it does not fit an object of the present embodiment, which transfers the deterioration signals to frequency components which do not influence from noises. Also, if frequency of four times of f1 is used as the f2, the exactitude of the deterioration diagnosis is the same with the use of the frequency of two times of the f1, but when applying the same voltage, the capacity of the power supply becomes two times, so that there are no advantages in practice.

Further, when frequency components f2+2×f1 or |f2−2×f1|generated by the superimposition of a voltage V1 and a voltage V2, which are caused by the deterioration, are selected from frequencies which are not same with f1, f2, and the third harmonic of f1 and f2, or the fifth harmonic, of which influences from noises is great next to the third harmonic, they are shown in FIG. 1. Now, the parts enclosed by dotted lines are deterioration signals corresponding to the third or fifth harmonic of applied voltages.

Shown clearly in FIG. 1, when f2 is frequency of 1/integer times of f1 except 1/2, the frequency components, which the deterioration signal is not influenced to the harmonics of applied voltage, are occurred.

Mentioned above, it is known that, when the frequency f2 is two times of f1 or 1/n (n is a 3 or more integer (≧3)) and frequency of f1 is commercial supply frequency, the combination is the most effective in practice.

When diagnosing the deterioration of the electric power cable as mentioned above, an exact diagnosis is implemented without accepting influences of the harmonics of the power supply. Also selecting the frequency f1 and f2 as mentioned above, a high exact diagnosis of the deterioration is implemented without using power supply equipment of a great capacity.

Next, the present invention is explained by concrete embodiments. Experiments of the present invention are implemented as shown in the following, and the effects are confirmed by comparing with the prior art method.

(1) Supplied sample

In the experiment, a 22 kV XLPE cable of 1×150 mm² (insulation thickness of 6 mm), which has water tree deterioration, is supplied to the measurement. Observing the situation of the occurrence of the water tree by sampling investigation of the cable, it is confirmed that the vented water tree from outer semi-con of the maximum size of 2 mm, of average size of 0.5~1.5 mm are relatively occurred in many numbers. Further, investigating the AC break down voltage, it is confirmed that the distribution is 50~100 kV and the insulation characteristics are inferior. Also, as an object for comparing, a new XLPE cable of the same size is used. The length of all cables in measuring is 20 m.

(2) Prior art measurement (No.1)

At first, a prior art method of the measurement is implemented using an ideal power supply of low containing rate of the harmonics. As an example, the frequency is 50 Hz and the measuring voltage is 12.7 kV which corresponds to a operation voltage to ground of 22 kV XLPE cable. The measurements are implemented for the aforementioned deteriorated cable and a new cable, and they are compared.

Figure 2:
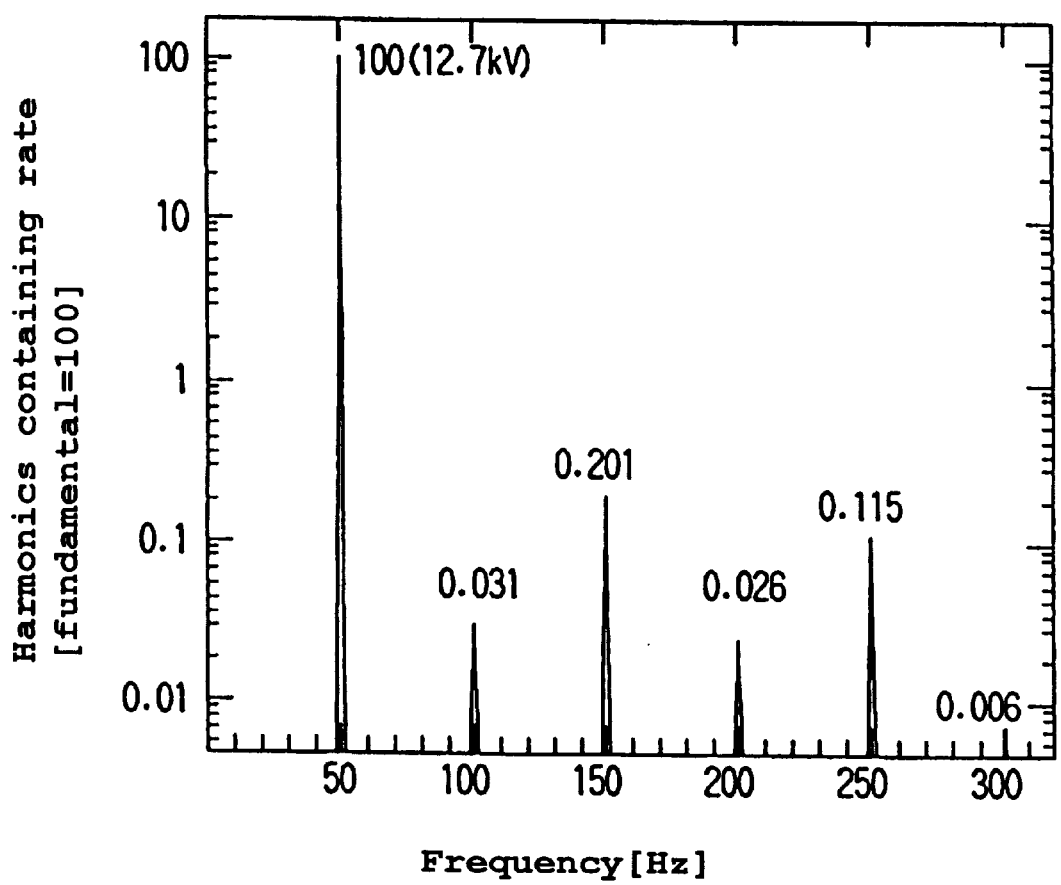
FIG. 2 shows a result of the frequency analysis of alternative voltage of 50 Hz/12.7 kV in which containing rates of harmonics are suppressed.

FIG. 2 shows a result of the frequency analysis of the output wave of the power supply. In the figure, a horizontal axis is frequency, a vertical axis is the containing rate of harmonics (log scale), in which scale 100 is for fundamental (50 Hz) (same in the following drawings). Also, the measurement is executed by a circuit shown in FIG. 3, and the loss current components is measured by rejecting the capacitive current components from the total charged current in the cable. Bridges are used for detecting the current, and bridge connecting methods shown in FIG. 3($a$) and ($b$) are possible.

FIG. 3($a$) shows a case that the detection of the loss current is measured at a high voltage conductor side, that is a loss current measuring bridge 3 is connected to high voltage conductor side, a terminal of a standard capacitor 5 is connected to a loss current measuring bridge 3, and another terminal is connected to an electric power cable 4. Further, applying a voltage to the loss current measuring bridge 3 from the power supply 1 (frequency 1), the loss current components is obtained by rejecting the current components forwarding 90° to the power supply voltage by the standard capacitor 5. The output of the loss current measuring bridge circuit 3 is directed to a wave measuring device 7 through an optical fiber 6, and the waves are analyzed by a wave analyzing device 8. The loss current waves analysis are implemented by a measuring device such as a spectrum analyzer.

Composing the measuring circuit as mentioned above, the charged currents form the cable insulator are gathered to a point to be detected even if the sheath is multi grounded or cross bonded, the deterioration current is detected in the both system of the multi grounded or cross bonded cable.

FIG. 3($b$) shows a case that the loss current measuring bridge is connected between a sheath of cable and a ground, that is a standard capacitor 5 is connected parallel to an electric power cable 4, and a voltage is applied from a power supply 1 (frequency f1), and currents in the insulator of an electric power cable 4 and in a standard capacitor 5 are entered into a loss current measuring bridge 3, and the loss currents are obtained by rejecting current components which the phase forwards 90ūi to the first voltage from the current of the insulator, further, output of the loss current measuring bridge 3 is introduced to a wave measuring device 7, then the loss current analysis are implemented by a wave analyzing device 8 such as a spectrum analyzer.

Figure 4:
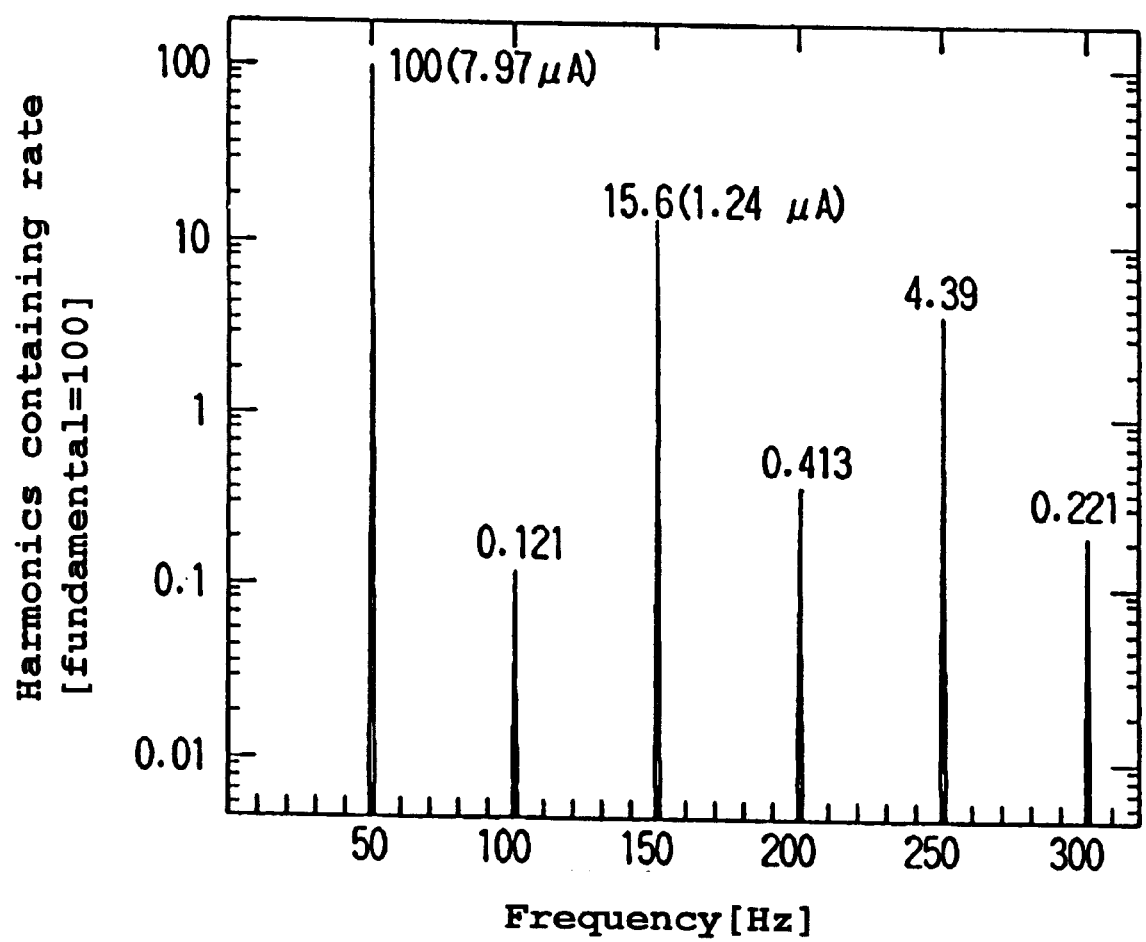
FIG. 4 shows a result of frequency analysis of the loss current measured by applying alternative voltage of 50 Hz/12.7 kV, in which a containing rate of harmonics is suppressed, to a deteriorated cable.
Figure 5:
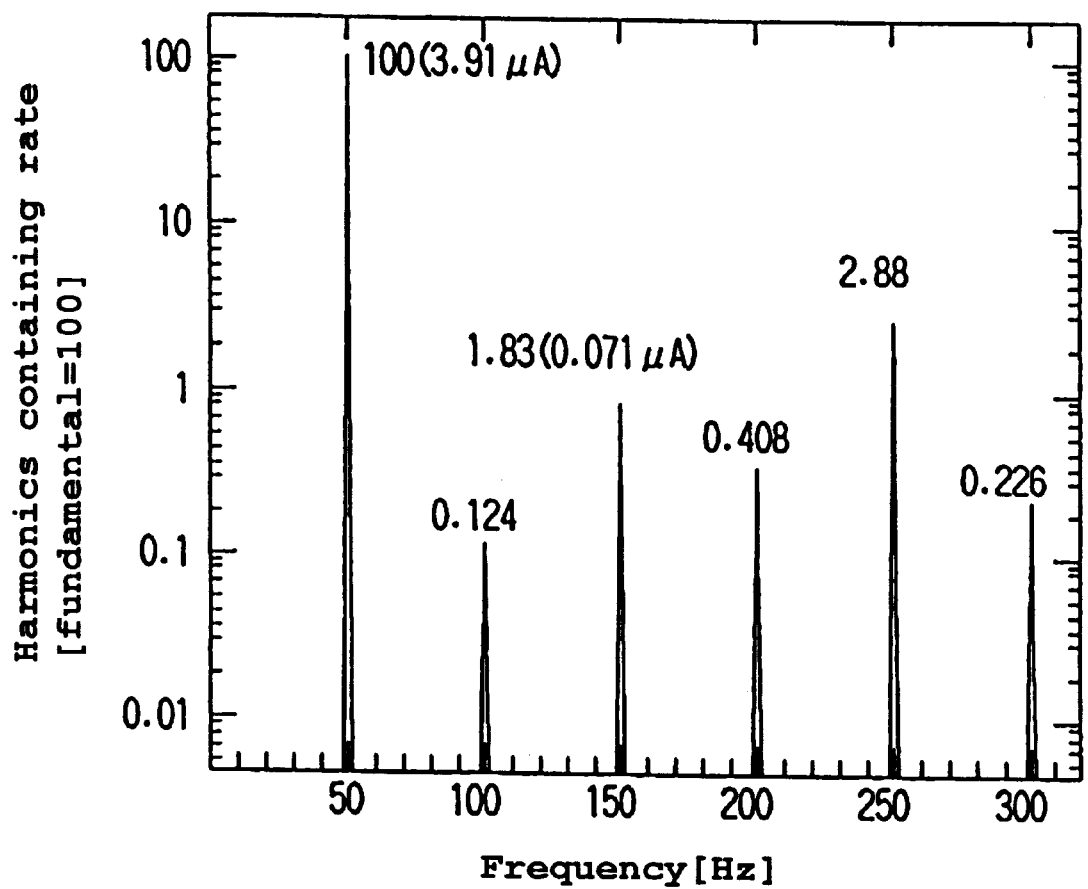
FIG. 5 shows a result of frequency analysis of the loss current measured by applying alternative voltage of 50 Hz/12.7 kV, in which a containing rate of harmonics is suppressed, to a new cable.

Results of the frequency analysis of the current waves obtained by the above mentioned measuring circuit, which is implemented by a spectrum analyzer, are shown in FIG. 4 (a deteriorated one) and in FIG. 5 (a new one). At first referencing FIG. 2, it is shown for the containing rate of the harmonics to be very low. The third harmonic is about 0.2% to the fundamental, so that even if it acts as noises for the loss current, it is only 0.2×9=1.8%.

On the other hand, referencing FIG. 4, a component of 150 Hz is observed no less than 1 μA, and the rate to the fundamental is no less than 15%, for this, in FIG. 5, a component of 150 Hz is small and does not show the phenomena of the deteriorated one. So that, when the harmonics contained in waves of a power supply for applying voltage is suppressed, it is found that a fine diagnosis is implemented by the prior art method.

(3) Prior art measurement (No.2)

Next the prior method of measurement using a general power supply, which the containing rate of the harmonics is not suppressed, is implemented.

In this, as an example, the frequency is 50 Hz and the measuring voltage is 12.7 kV which corresponds to the operating voltage to ground of 22 kV XLPE cable is used too.

Also, measuring a deteriorated one and a new one like (2), the results are compared.

Figure 6:
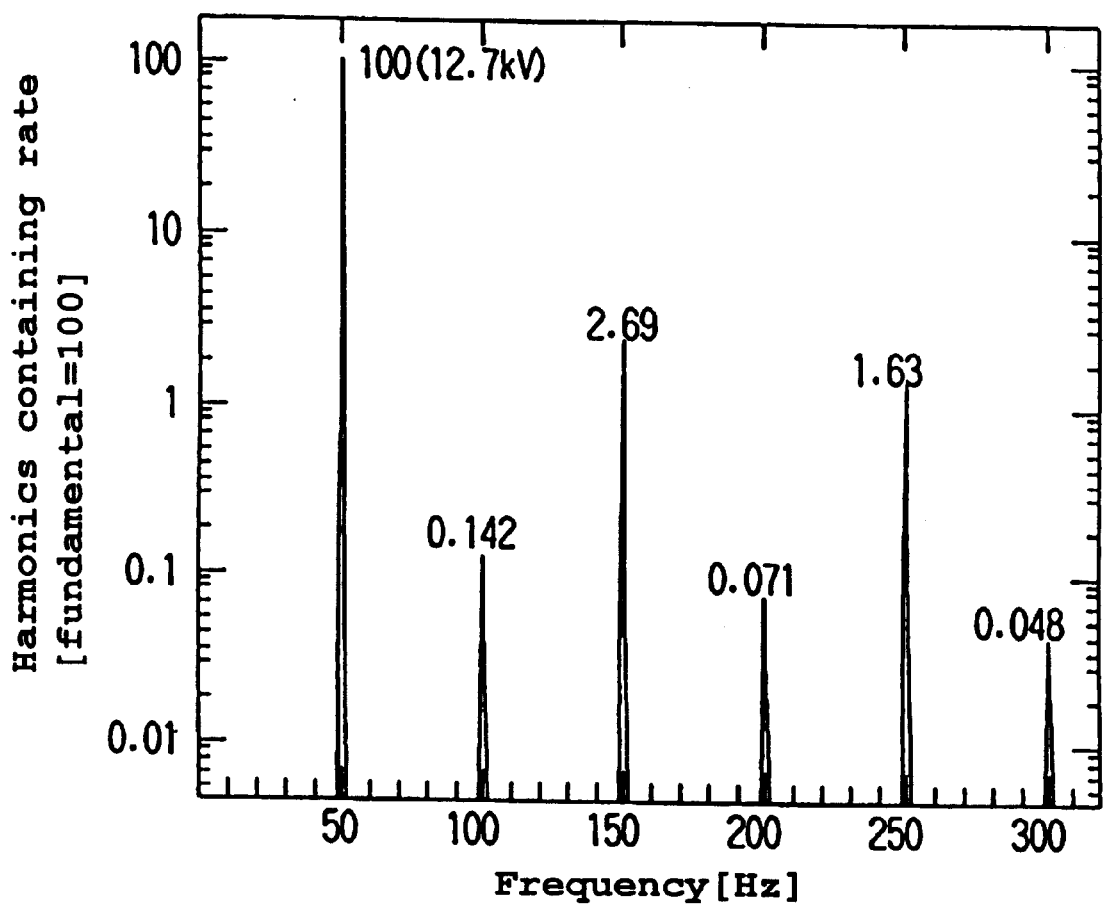
FIG. 6 shows results of the frequency analysis of alternative voltage of 50 Hz/12.7 kV, in which suppression of the containing rate of harmonics is not considered particularly.

The results of the analysis of waves of the power supply output are shown in FIG. 6. The results of the frequency analysis of the loss current waves are shown in FIG. 7 (a deteriorated one) and in FIG. 8 (a new one).

At first, referencing FIG. 6, the containing rate of harmonics is not suppressed particularly, and the third harmonic is contained about 2.7% to the fundamental. Because of this, when it acts as noises to the loss current, it becomes 2.7×9=24% to the fundamental on theory.

Figure 7:
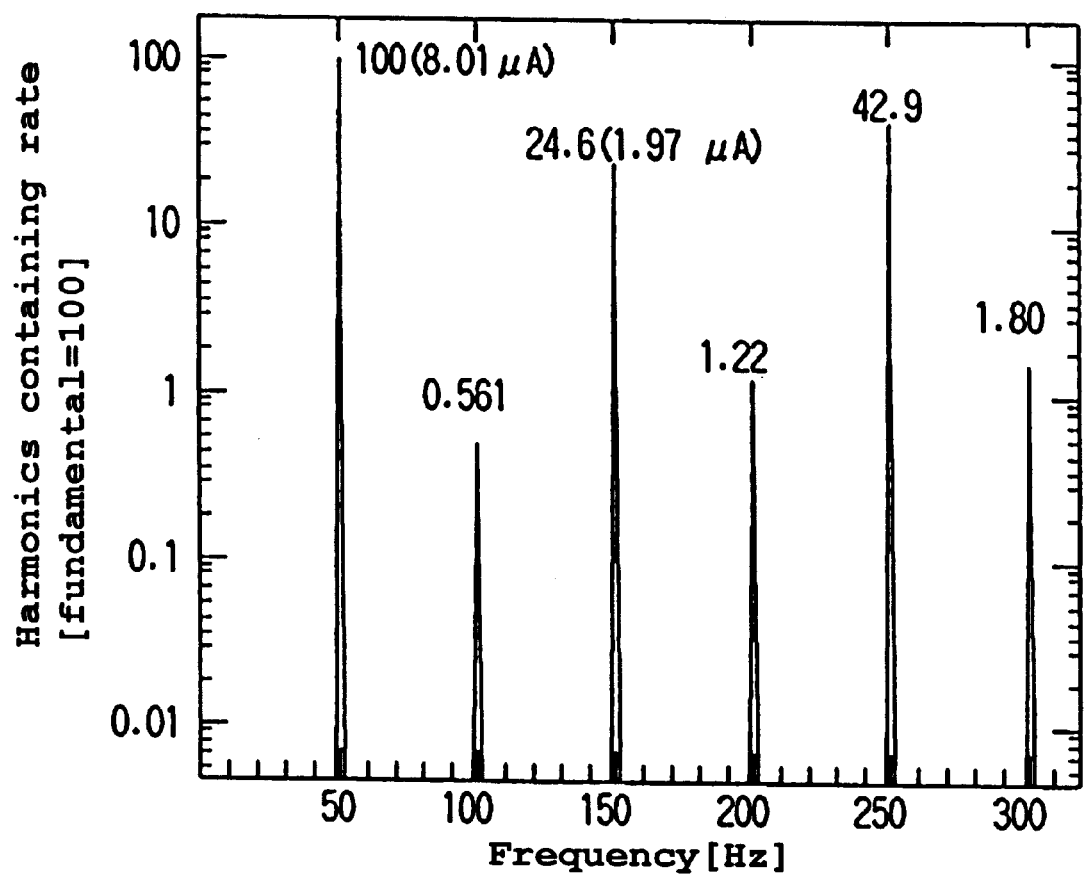
FIG. 7 shows a result of frequency analysis of the loss current measured by applying alternative voltage of 50 Hz/12.7 kV, in which suppression of the containing rate of harmonics is not considered particularly, to a deteriorated cable.
Figure 8:
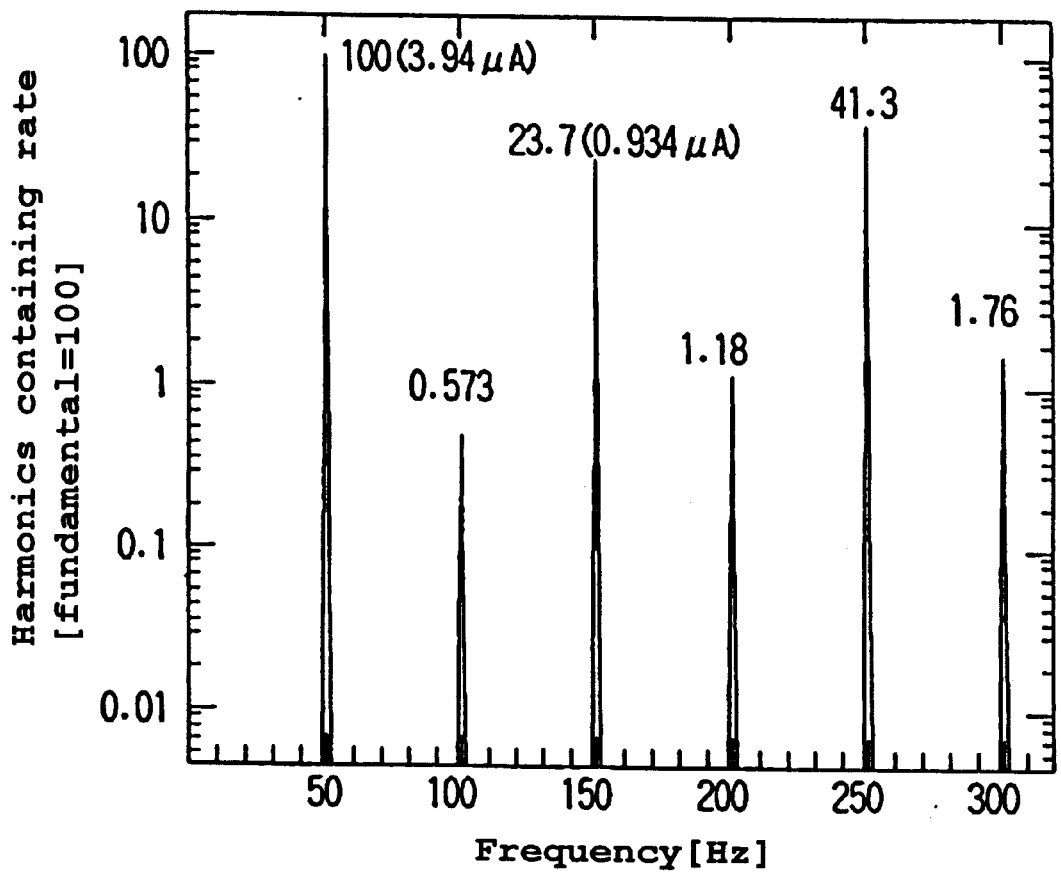
FIG. 8 shows a result of frequency analysis of the loss current measured by applying alternative voltage of 50 Hz/12.7 kV, in which suppression of the containing rate of harmonics is not considered particularly, to a new cable.

Referencing FIG. 7, 150 Hz component is a little more than in FIG. 6, and 150 Hz component of FIG. 8 is near to the measured value in FIG. 7, and the containing rate to the fundamental is about the same value. Because of this, it does not show such a remarkable difference that using a power supply suppressed the harmonics, so that it is not difficult to determine clearly whether the cable is deteriorated or not. That is, it shows that, when the third harmonic is contained in the applied voltage, the fine measurement of the deterioration diagnosis is not implemented.

(4) Method of the present invention (No.1)

Next a measurement by the present invention is implemented. It is implemented by using the same general power supply with that of (3), which the containing rate of harmonics are not suppressed specially, for the first voltage. Because of this, the frequency of 50 Hz and the measuring voltage of 12.7 kV which corresponds to the operating voltage to ground of 22 kV XLPE cable are chosen. Measuring a deteriorated one and a new one, the both results are compared.

These results of the frequency analysis of the power supply output waves are same as shown in FIG. 6. At first, measuring under a condition that only the first voltage is applied is implemented. Of course, the measured results are almost same with FIG. 7 and FIG. 8, distinguishing the new one and the deteriorated one is difficult.

Next keeping the bridge balance of the measuring device to the same condition, the second voltage is superimposed.

Figure 9A:
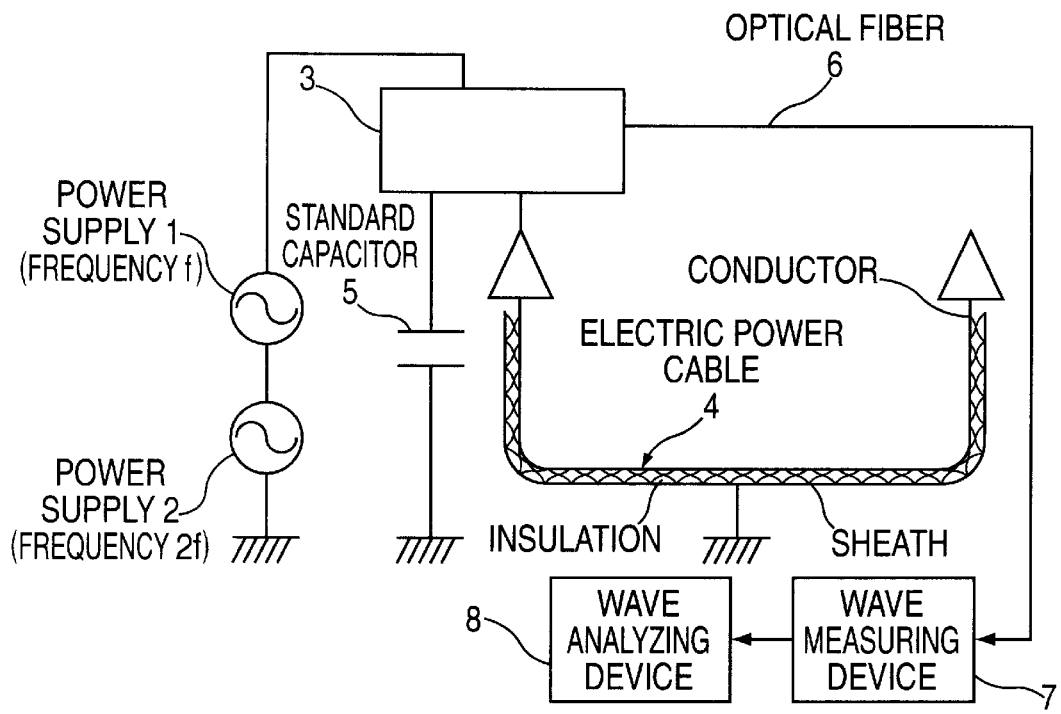
FIG. 9 shows an example of circuits for measuring loss current applying two kinds of voltage by the present invention.
Figure 10:
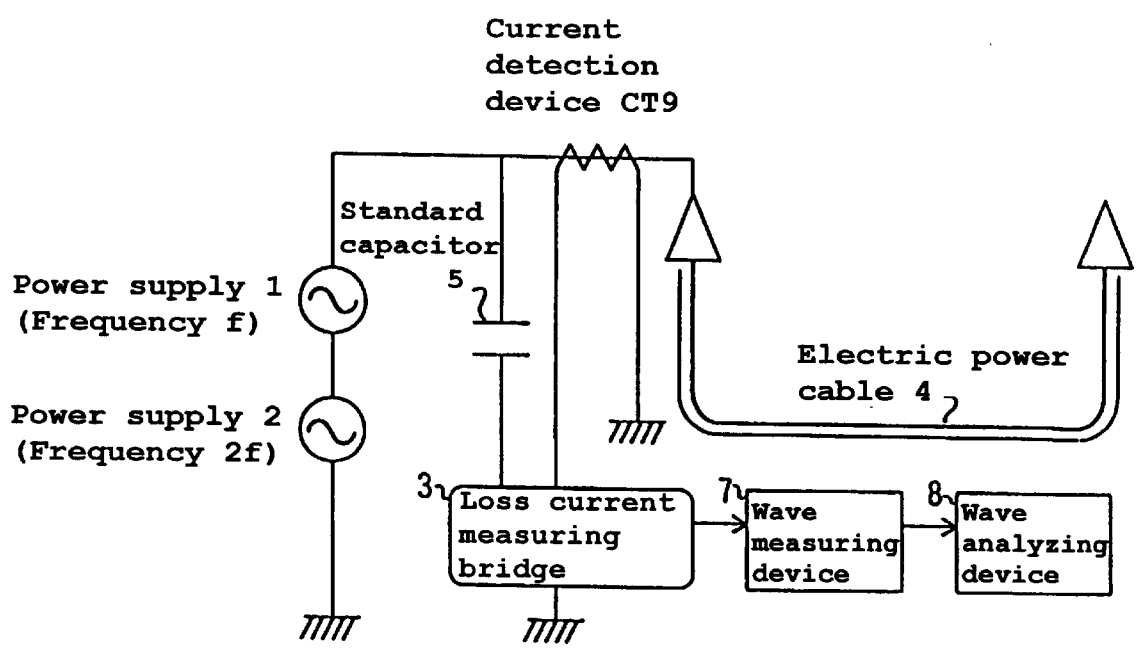
FIG. 10 shows another example of a circuit for measuring the loss current applying two kinds of voltage by the present invention.

Examples of measuring circuits in this case are shown in FIG. 9(a), (b) and FIG. 10.

FIG. 9(a) shows a case that the loss current measurement is implemented in a high voltage conductor side, a loss current measuring bridge 3 is connected to high voltage side, a standard capacitor 5 is connected to a terminal of a loss current measuring bridge 3, and another terminal is connected to a cable 4.

Composing the measuring circuit like FIG. 9(a), the charged currents from the cable insulator are gathered to a point to be detected even if the sheath is multi grounded or cross bonded, the deterioration currents are detected in the both system of the multi grounded or cross bonded cable.

Figure 9B:
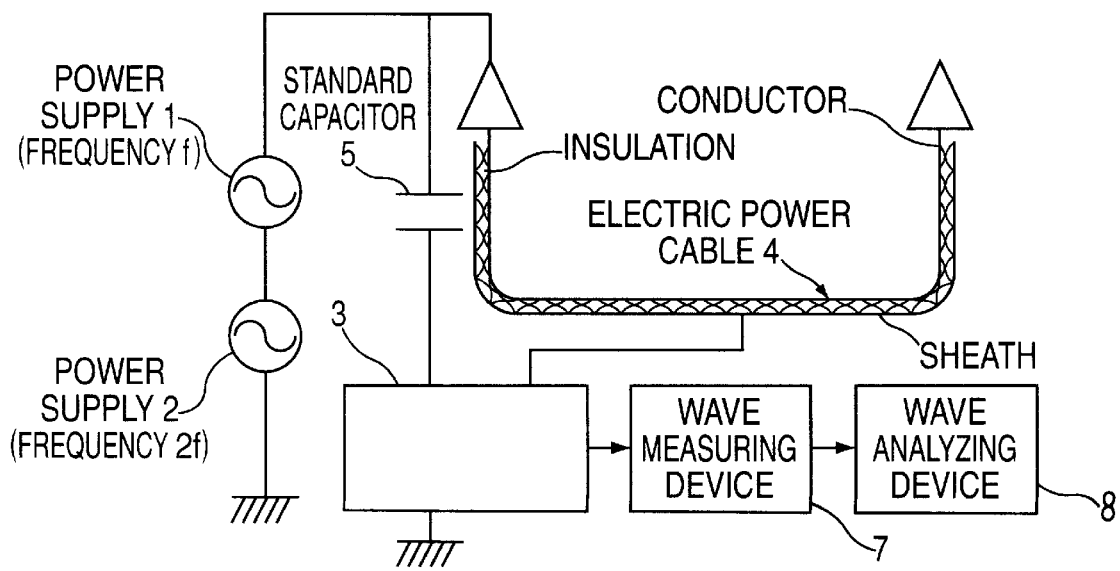

FIG. 9(b) shows a case that a loss current measuring bridge 3 is connected between a sheath of a cable 4 and a ground. After the balance of the loss current measuring bridge 3 balanced by applying the voltage of frequency f1 from the power supply 1, as mentioned above, the voltage of frequency f2 is superimposed from the power supply 2 to measure the fourth harmonic in the loss current.

When the measuring circuit is composed like shown in FIG. 9(b), as the loss current measuring bridge 3 is not connected to the high voltage side, as illustrated in FIG. 9(a), the components of the measuring system is simple and desirable, and it is better to use in a case that the ground point can be gathered to one point.

Further, FIG. 10 shows a case that a current detector CT9 is connected between a cable 4 and a power supply 1, and that an output of the current detector CT9 is connected to a loss current measuring bridge 3, and further, as mentioned above, after the balance of the loss current measuring bridge 3 balanced by applying the voltage of frequency f1 from the power supply 1, the voltage of frequency f2 is superimposed from the power supply 2 to measure the fourth harmonic in the loss current.

Composing the measuring circuit like FIG. 10, the loss current measuring bridge 3 can be connected to the low voltage side, and the same with FIG. 9(a), the deterioration current is detected in the both system of the multi grounded or cross bonded cable.

Figure 11:
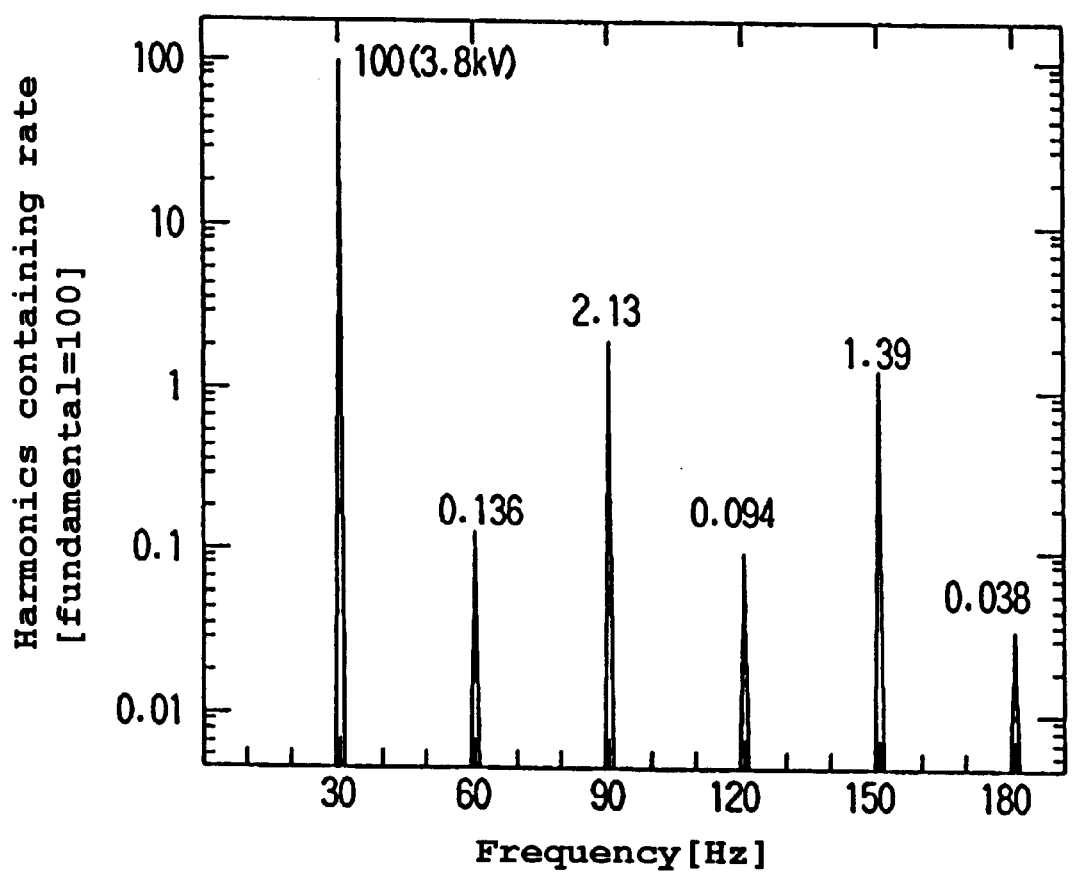
FIG. 11 shows a result of the frequency analysis of alternative voltage of 30 Hz/3.8 kV in which suppression of the containing rate of harmonics is not considered particularly.

As mentioned above, the measuring circuit is not particular difference from FIG. 3(a), (b), and the power supply 2 (frequency f2) of the second voltage V2 is added series to the power supply 1 (frequency f1) of the first voltage V1. Further, as an example of the second voltage V2, f2=30 Hz is chosen, and the second voltage V2 of 3.8 kV is superimposed, which is 30% of the first voltage, as an example. The result of the frequency analysis of the second voltage waves is shown in FIG. 11.

Figure 12:
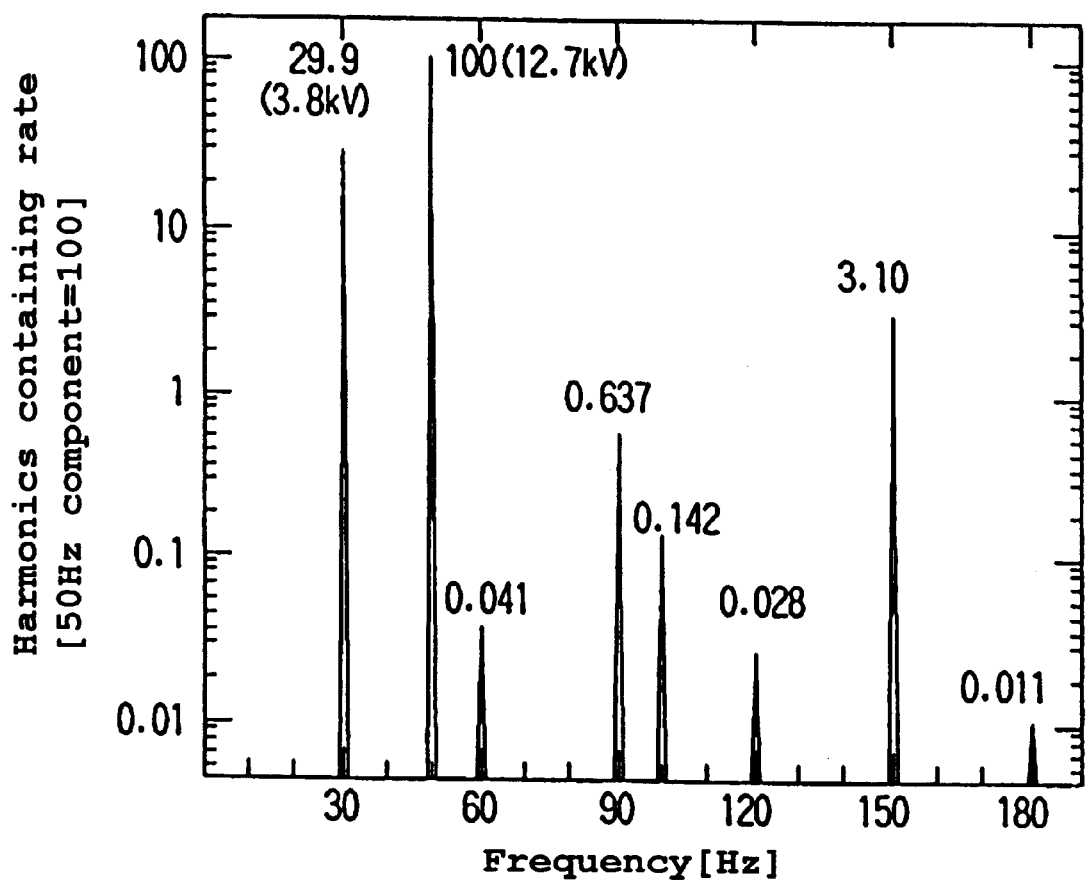
FIG. 12 shows a result of frequency analysis of superposition of alternative voltage of 50 Hz/12.7 kV and alternative voltage of 30 Hz/3.8 kV in which suppression of the containing rate of harmonics is not considered particularly.

The special countermeasure for the harmonics is not considered in this too, so that the containing rate of harmonics is not so much low. Further, the results of the frequency analysis of the first voltage superimposed the second voltage are shown in FIG. 12.

Now, the loss current waves measured by superimposing the voltages is frequency-analyzed. The results of the frequency analysis of the measured loss current are shown in FIG. 13 concerning to the deteriorated cable and in FIG. 14 concerning to the new cable.

Figure 13:
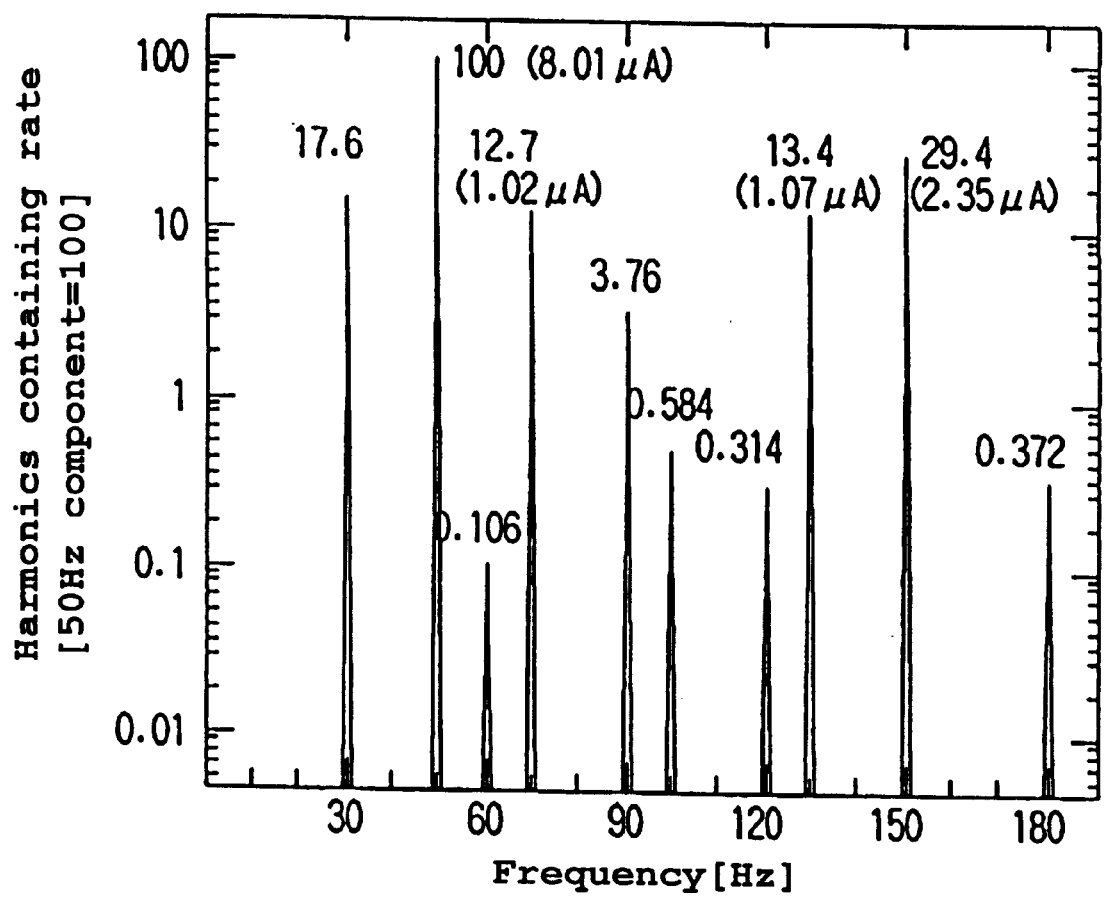
FIG. 13 shows a result of frequency analysis superimposing alternative voltage of 50 Hz/12.7 kV and alternative voltage of 30 Hz/3.8 kV, in which suppression of the containing rate of harmonics is not considered particularly, to a deteriorated cable.
Figure 14:
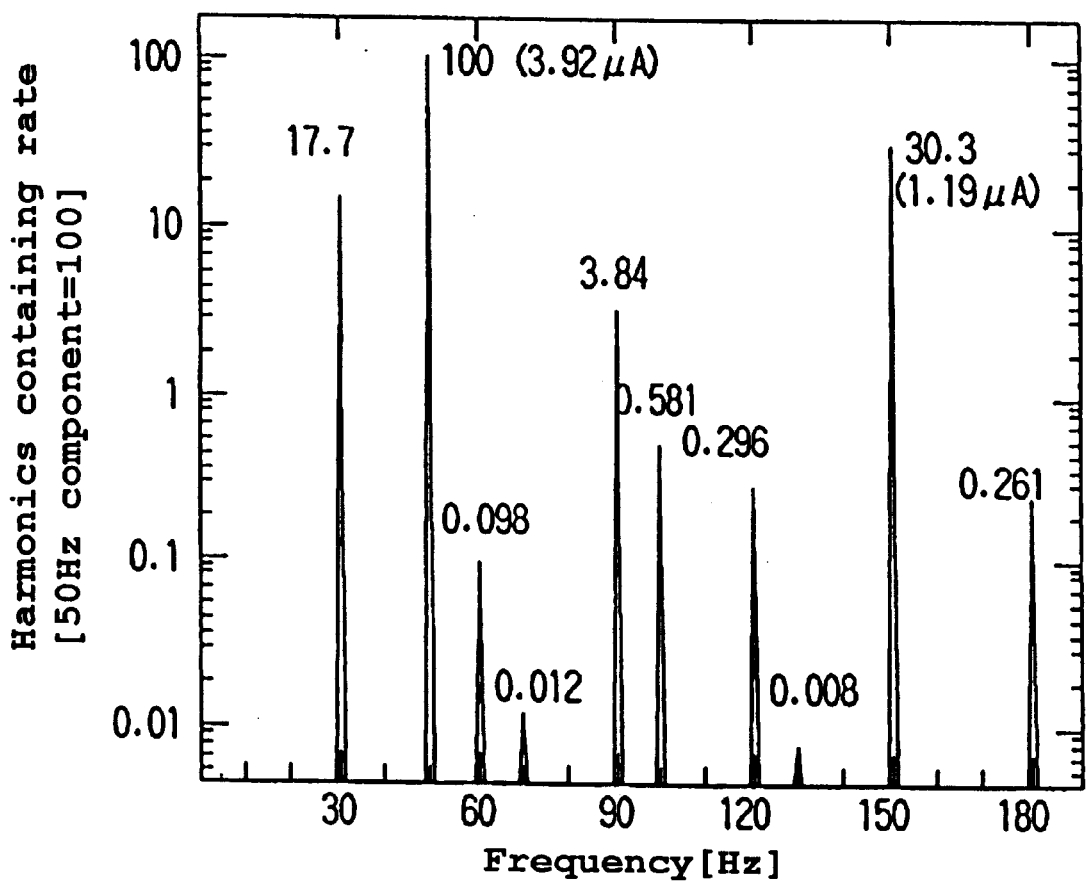
FIG. 14 shows a result of frequency analysis superimposing 50 Hz/12.7 kV and 30 Hz/3.8 keV, in which suppression of the containing rate of harmonics is not considered particularly, to a new cable.

Referring to FIG. 13 and FIG. 14, it is shown that the levels of existing state of the harmonics of the applied frequency f1=50 Hz and f2=30 Hz are same levels. This is because that the countermeasures for the harmonics of the first and second voltages are not taken, so that it is the natural results.

But, investigating in detail the analyzed results, 70 Hz and 130 Hz, which are not frequency components of integer time of 50 Hz and 30 Hz, are observed greatly in the deteriorated ones. This occurred in FIG. 14, but the degree of occurrence in the new one is remarkably smaller than that of the deteriorated ones.

Moreover, as understood from comparing FIG. 7 and FIG. 13 which are results of before and after the superimpose of the second voltage, in the former, the remarkable frequency of 70 Hz and 130 Hz are not observed, but, in the latter the specific frequencies like this are appeared, so that existence or not of the deterioration is determined by investigating the frequency components before or after the superimpose. It is confirmed that these frequency components are 30+2×50= 130 Hz, and |30−2×50|=70 Hz, and they are frequencies which are obtained as the deteriorated signal obtained in a case of superimpose of the two frequencies.

So, when 50 Hz an 30 Hz are superimposed, the deterioration diagnosis is implemented by investigating amplitude of components of 70 Hz and 130 Hz contained in the loss current. Moreover they are not harmonics of the applied voltage, so that the measurement which is affected to harmonics in the applied voltages is implemented by using waves "not clear waves so much" of high containing rate of harmonics.

(5) Method of the present invention (No.2)

So, next changing the frequency f2 of the second voltage which is superimposed to the first voltage (f1=50 Hz, V1=12.7 kV) in (4) between 10 Hz and 150 Hz, it is investigated what frequency components excepting the third harmonic components of the first and second voltage is occurred relatively largely in the loss current in a case applying V2=3.8 kV.

Figure 15:
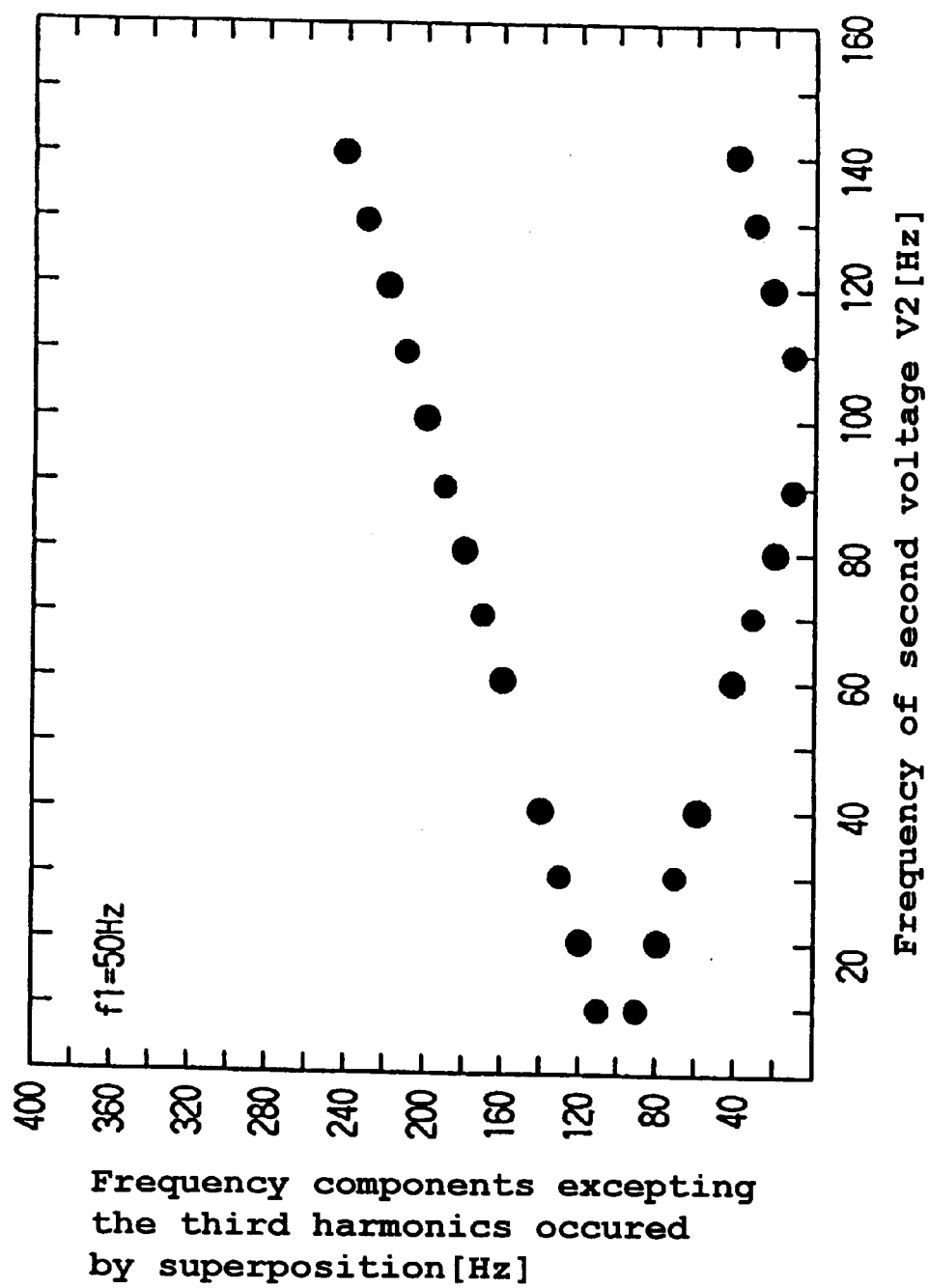
FIG. 15 shows frequency components (excepting the third harmonic of the applied voltage) contained in loss current waves observed in a case superimposing 50 Hz/12.7 kV and 3.8 kV which is not 50 Hz to a deteriorated cable.

The result is shown in FIG. 15. The measurement is implemented by only the deteriorated cable. Referring this, it is known that the occurred frequency is f2+100 Hz and |f2−100| Hz.

(6) Method of the present invention (No.3)

The same, changing the frequency f2 of the second voltage, which is superimposed to the first voltage (f1=60 Hz, V1=12.7 kV) in (5), from 10 Hz to 150 Hz, it is investigated what frequency components excepting the third harmonic components of the first and second voltage is occurred relatively largely in the loss current waves in a case applying V2=3.8 kV, are investigated.

Figure 16:
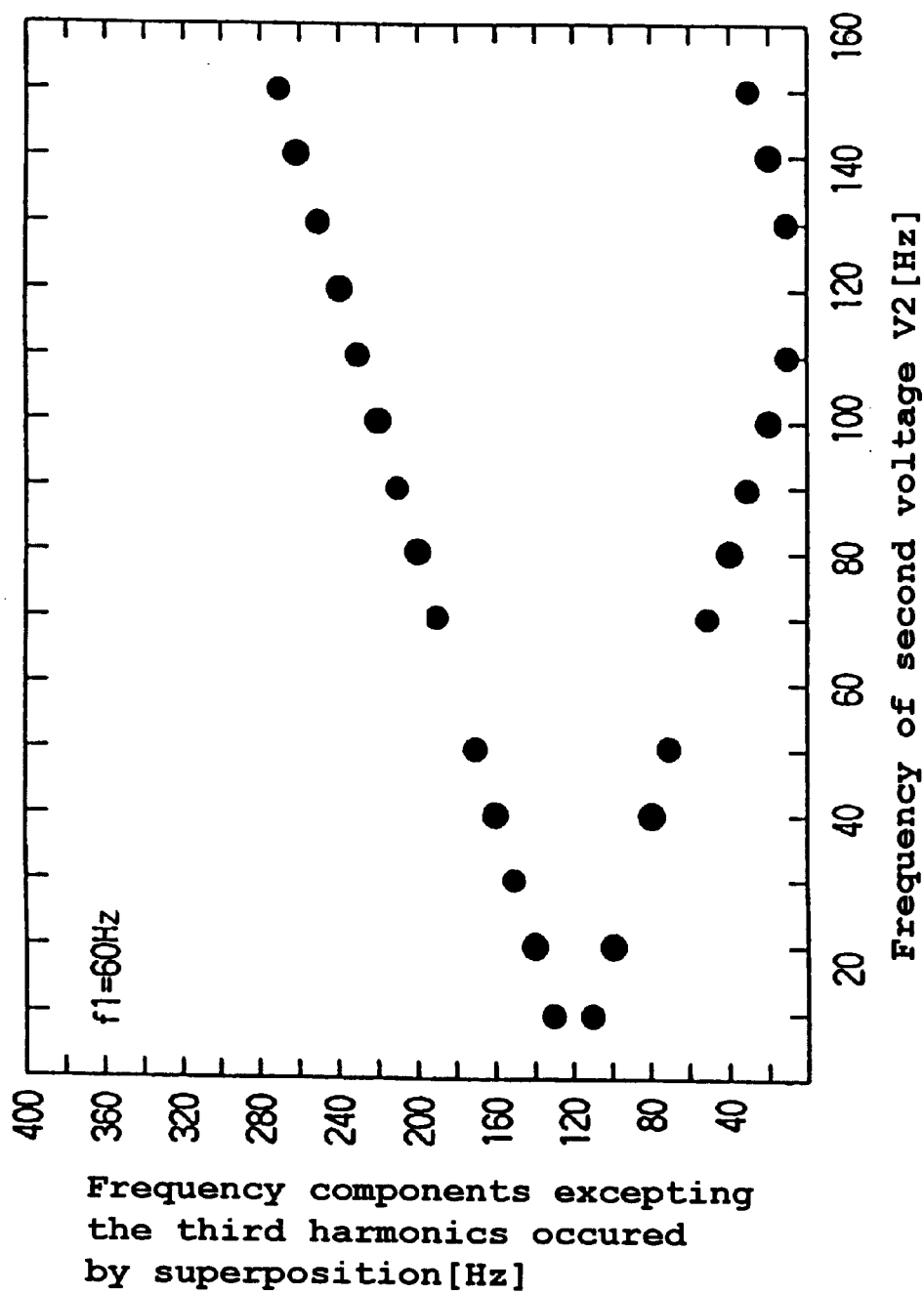
FIG. 16 shows frequency components (excepting the third harmonic of the applied voltage) contained in loss current waves observed in a case superimposing 60 Hz/12.7 kV and 3.8 kV which is not 60 Hz to a deteriorated cable.

The result is shown in FIG. 16. The measurement is implemented by only the above-mentioned deteriorated cable.

Referring to this, the occurred frequencies are f2+120 Hz and |f2−120| Hz is shown.

From the above mentioned results, it is confirmed that the frequency components occurred by superimposing the two frequencies to the deteriorated cable are f2+2×f1 Hz and |f2−2×f1| Hz. Accordingly, the deterioration or no-deterioration of cables is determined by investigating the occurrence of the frequency components defined by the equations.

(7) Method of the present invention (No.4)

The above mentioned examples are that which the voltage of the commercial power supply is used as the first voltage. Of course, if being able to be applied to the cables practically, the first voltage, is not defined to the commercial supply frequency. So the test is implemented, as the first voltage, by using a voltage of low frequency range used many times for lowering the capacity the electric power supply equipment in the case of cable line test.

The used cable is same with the above mentioned (5),(6) and when the very low frequency of the frequency f1=0.1 Hz and V1=20 kV as the first voltage is used, and the frequency of the second voltage is changed to f2=0.15 Hz, 0.2 Hz and 0.25 Hz, and the voltage V2=5 kV is set, the frequency components contained in the loss current are investigated.

In this measurement, as the analyzed frequency of an object is very low, the spectrum analyzer used in the above mentioned (1)–(6) is impossible. So at first, the waves are observed by a digital oscilloscope, and numerical data of the 1 cycle of the waves are taken out, and the frequency is analyzed by discrete fast Fourier transformation. The results are shown in FIG. 17.

Referring the results, the current corresponding to the frequencies of applied voltages and the third harmonic are observed large, but large currents are observed at frequencies which do not correspond to the fundamental and the third harmonic.

Figure 17:
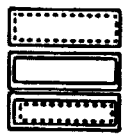
FIG. 17 shows a result of discrete numerical fast Fourier transformation of the loss current measured under the very low frequency voltages.

These are parts pointed out "frequency occurred particularly" in FIG. 17. It is shown that these frequencies are all f2+2×f1 Hz and |f2−2×f1| Hz.

By this, even when the frequency range except the commercial supply frequency is chosen as the frequency of the first voltage, the present invention shows the same effects.

Also any frequency is chosen as the frequency f2, if not same with the frequency f1. But, in this case, the frequencies occurred specifically by the superimpose of the two kinds of voltages should not be odd order harmonics, specifically the third harmonic.

Moreover, of course, any voltage which is easy to measure the loss current as the first and second voltage at the measurement can be chosen.

(8) Method of the present invention (No.5)

Next a measurement is implemented by choosing the commercial supply frequency as the frequency f1 and choosing two times of frequency f1 (commercial power supply frequency) as frequency f2.

As the applied frequencies, the first voltage V1 is commercial power supply frequency (f1=50 Hz) and 12.7 kV, which is the same with the prior art measurement. The aspect of the contained harmonics components of the applied voltage is the same with the FIG. 6. Further, as the second voltage V2, frequency of two times of the commercial supply frequency (f2=100 Hz) of 3.8 kV is used.

Figure 18:
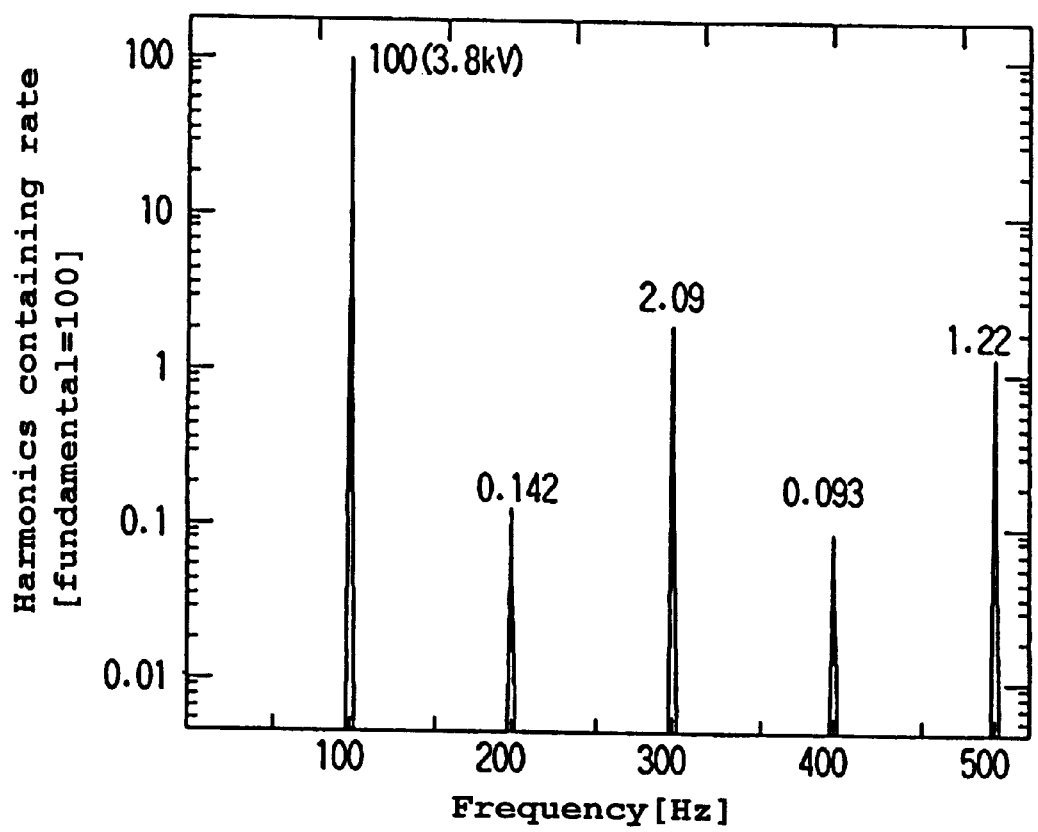
FIG. 18 shows a result of the frequency analysis of alternative voltage of 100 Hz/3.8 kV in which suppression of the containing rate of harmonics is not considered particularly.

The containing rate of the harmonics of the second voltage V2 does not contain even order harmonics such as the second harmonic, the fourth harmonic almost (under 0.2%) as shown in FIG. 18, and odd order harmonics such as the third and the fifth fourth are contained many like shown in FIG. 18, and has the same characteristics with the V1 characteristics shown in FIG. 6.

The measurement of the present embodiment is implemented by using the measuring circuit shown in FIG. 9(a), (b) mentioned above and by superimposing the first voltage V1 and the second voltage V2 to the cable.

In the measurement, the loss current is measured, applying only the first voltage V1 to the new cable and deteriorated cable, and keeping the balance of the measured bridge at this time, currents (equivalent to the loss current under the voltage superimposed two kind of frequency) output from the measuring bridge the second voltage V2 are measured.

Figure 19:
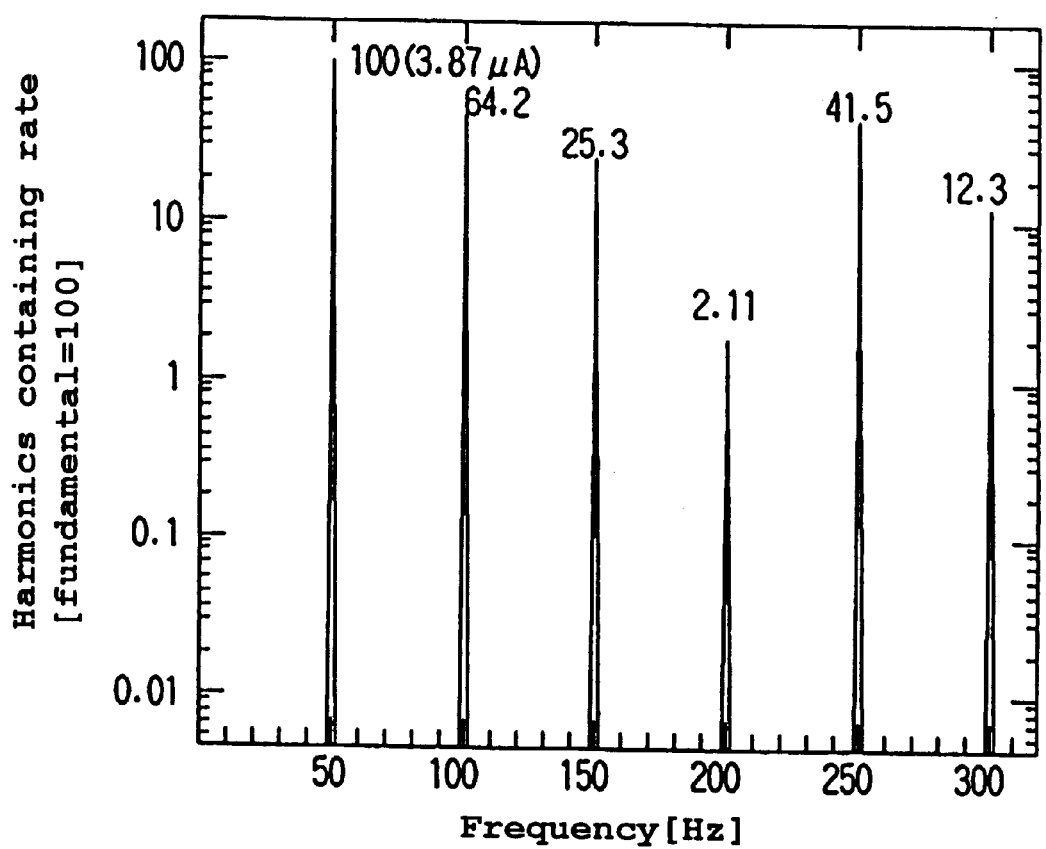
FIG. 19 shows a result of frequency analysis superimposing alternative voltage of 50 Hz/12.7 kV and alternative voltage of 100 Hz/3.8 kV, in which suppression of the a containing rate of harmonics is not considered particularly, to a new cable.
Figure 20:
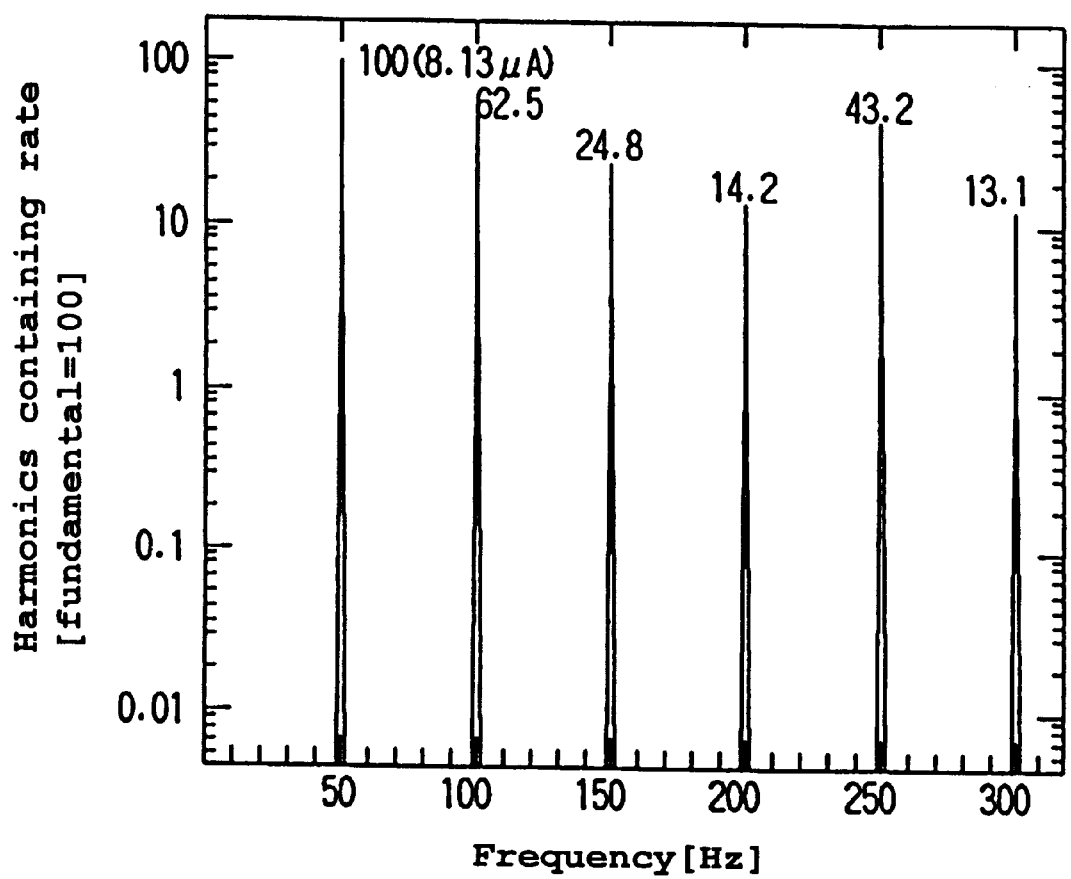
FIG. 20 shows a result of frequency analysis superimposing alternative voltage of 50 Hz/12.7 kV and alternative voltage of 100 Hz/3.8 kV, in which suppression of the containing rate of harmonics is not considered particularly, to a deteriorated cable.

When measuring only by the voltage V1 (equivalent to the prior art), the results of the frequency analysis of the loss current are almost same to those of FIG. 7 and FIG. 8. On the other hand, the results of the frequency analysis for the results of the loss current after superimposing by the voltage V2 shows a clear difference between the new one and the deteriorated one. The frequency analysis are shown in FIG. 19 and FIG. 20.

Shown clearly by comparing two results, concerning to the components of 200 Hz, that of new one is 2.1% for the fundamental component of the loss current, and that of the deteriorated one reaches to the degree of 14%.

As there are no difference between the new one and the deteriorated one concerning to another frequency components, it is confirmed that the this 200 Hz component (f2+2×f1) is occurred by the deterioration. By the way, it is considered that the 200 Hz component of 2.1% observed for the new one is appeared based on the 200 Hz components contained originally in the applied voltage V1 and V2, but, even order harmonics such as the second, fourth harmonic contained in the applied voltage are very small comparing to odd order harmonics, so that they are not generally main elements occurring errors which are problem in the prior art.

(9) Method of the present invention (No.6)

The above mentioned embodiment (8) is that which the frequency f2 is two times of f1 (commercial supply frequency), but the same effects are obtained by that which the frequency f2 is 1/n times of f1 (n is a 3 or more integer ($\geq$3)) commercial supply frequency). Moreover, when frequency f2 lower than the commercial supply frequency, the size of the power supply equipment is small, and effects in this point are great.

So effects when frequency f2 is 1/n times of f1 are investigated.

The sample, measuring circuit, analyzing method of the measured results, and the first applied voltage of V1 (12.7 kV) and frequency (50 Hz) are same with the embodiment of (8), and, for the second voltage, the voltage is common 3.8 kV, but for the frequency f2, four kinds cases of 1/2 (25 Hz), 1/3 (16.7 Hz), 1/4 (12.5 Hz), and 1/5 (10 Hz) of commercial supply frequency are investigated.

In the measurement of the above mentioned four kinds of combination of f1 and f2, if a clear difference between the new one and the deteriorated one appears in the frequency components of f2+2×f1, |f2−2×f1|, it may be confirmed that the embodiment of the present invention has the effects.

Comparing the new one and the deteriorated one, the results of the frequency analysis results for four kinds of the loss current are shown in FIG. 21. Frequency components except shown in the table does not show the clear difference between the new one and the deteriorated one.

As shown in FIG. 21, in the measured results used the 1/2 of the commercial supply frequency as the frequency f2, there is not any meaning difference between the new one and the deteriorated one concerning the frequency components of 75 Hz and 125 Hz of which occurrences are expected as the deterioration signal. Also, in the measured result using 1/3 of the commercial supply frequency as the frequency f2 too, there is not any meaning difference between the new one and the deteriorated one concerning the frequency components of 83.3 Hz of which occurrence are expected as the deterioration signal.

These are because of correspondence to the third or fifth harmonic of these frequencies f2. But except these examples, when the frequency components of f2+2×f1, |f2−2×f1|, which are defined as deteriorated signals, being used, the new one and the deteriorated one are distinguished.

In the above mentioned embodiment of (8), (9), a case of the frequency f1 of 50 Hz as the first voltage V1 is investigated, the effects of the present invention are not lost in a case of 60 Hz. Concerning to the value of the V1 and V2, it is not necessary for the V1 and the V2 to be same with the above mentioned embodiments, and they are chosen by considering cable lines or restrictions in the measurement.

B. Embodiment 2: the deterioration diagnosis which measures the current components of frequency of 4f, changing superimpose phases of the second voltage V2.

As mentioned when a voltage having a frequency of two times of the frequency of fundamental (in the following, it called as the second harmonic voltage) is superimposed, current components of frequency of four times of the fundamental (in the following, it is called as the fourth harmonic current) is obtained as the deteriorated signal.

Water trees have non-linear voltage-current characteristics, and when voltages of fundamental and a voltage of the second harmonic are applied simultaneously to the non-linear system, the fourth harmonic occurs. But, even implemented to the non-deteriorated system, which has a linear characteristic of voltage-current, the fourth harmonic does not appear.

So, inventors of the present invention have investigated more, it is appeared that the fourth harmonic current is usable for diagnosing the deterioration. The fourth harmonic current is occurred by superimposing a second harmonic voltage to the fundamental voltage, and changing the timing of superimposing the second harmonic voltage to the fundamental voltage, that is, changing the superimposing phase, the fourth harmonic current changes. As the result of the investigation applying this characteristic to various kinds of deterioration degree of cables, the following interesting phenomena are found.

When the fundamental voltage and the second harmonic voltage are expressed each as V1 sin($\omega$t) and V2 sin {2($\omega$t+ $\theta$v2)}, the superimposing phase of the second harmonic voltage to the fundamental voltage is $\theta$v2, of which value is allowed as $-90° \leq \theta v2 \leq 90°$.

Figure 22:
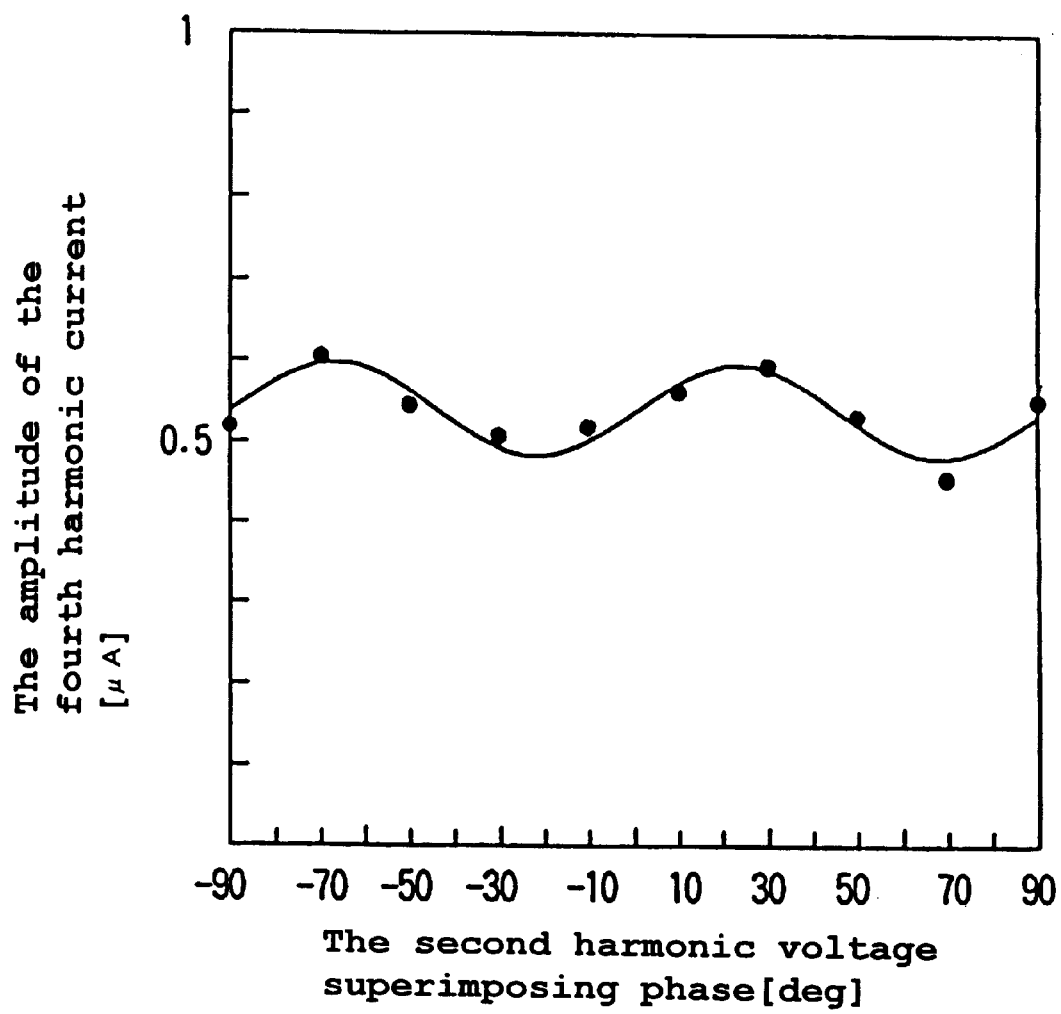
FIG. 22 shows an example data showing change of the amplitude of the fourth harmonic current for superimposing phase of second harmonic voltage.

So for samples of which insulators are deteriorated, in the cases of changing $\theta$v2, from −90° to 90°, the fourth harmonic current values are investigated. As illustrated in FIG. 22, it is appeared that the fourth harmonic changes with appearance of oscillation of two cycles with a constant amplitude in $-90° \leq \theta v2 \leq 90°$.

As the results of the investigation how the change of the fourth harmonic to the change of $\theta$v2 is for the degree of the cable deterioration, it is found that, when the deterioration is advanced, the changing width of the fourth harmonic current to the change of the $\theta$v2 is large, and when the deterioration is not advanced, the changing width of the fourth harmonic current is small.

Therefore, the degree of the deterioration is determined by the investigation of the change of the fourth harmonic to the change of $\theta$v2.

By the above mentioned method, the detection of the deterioration is implemented by using the fourth harmonic as even order harmonics which is low containing rate generally, so that the diagnosis of the deterioration of the electric power cable based on the loss current measurement is implemented without accepting affections of the third harmonic components which are contained in the commercial power supply voltage.

Next, the concrete embodiment is explained. In the present embodiment, the following experiments are implemented, the effects are confirmed by comparing the prior art method.

(1) supplied sample

In the present embodiment, two kinds of 22 kV XLPE cable of 1×150 mm$^2$ (insulation thickness 6 mm) having water tree deterioration, and new cables of the same size with them are provided for the measurement.

The water tree deterioration is investigated by sampling and the water tree occurrence state in the insulator is observed, and those which have the vented water trees from outer semi-con of maximum of about 3 mm (heavy deteriorated one), and the vented water trees from outer semi-con of maximum of about 1 mm (light deteriorated one) are confirmed. Further, the AC break down voltage is investigated, the former are distributed in the range of 40~80 kV, and the latter are distributed in the range of 120~200 kV. The length of the each cable is 20 m at the measurement.

(2) Measurement method

The procedure of the measurement of the loss current of the above mentioned cable is the followings.

[1] The voltage of 6 kV of commercial supply frequency of 50 Hz is applied between the conductor and the sheath of the cable.

[2] By the loss current measurement bridge, the capacitive current components contained in the current from the sheath of the cable to the ground are rejected, the loss current before superimposing of the second harmonic voltage is measured.

[3] The balance state of the loss current measurement bride is kept.

[4] The second harmonic voltage 100 Hz/2 kV is applied between the conductor and the [shield layer] sheath of the cable. The superimposing phase $\theta v2$ is measured at the time.

[5] The fourth harmonic current contained in the loss current is measured.

[6] the above mentioned [1]~[5] are measured for plural of $\theta v2$ in the range $-90° \leq \theta \leq 90°$. In this case, the measuring point numbers may be a degree which expresses two cycles of the fourth harmonic oscillation in the range.

As the circuit measuring the loss current, the circuits shown in FIG. 9 and FIG. 10 of the above mentioned description are used, and, at first, the basic voltage (=6 kV) of the frequency f1 (=50 Hz) is applied between the conductor and the sheath of the cable 4 from the power supply 1, and further rejects the components which the phase of 90° to the applied voltage leads by a standard capacitor 5.

Next, the balance state of the loss current measurement bride 3 is kept in the state, and the second harmonic voltage (=2 kV) of frequency f2(=100 Hz) is applied between the conductor and the sheath of cable 4 from the power supply 2 to measure the fourth harmonic current in loss current. The output of the loss current measurement bridge 3 is guided to the wave measuring device 7 through an optical fiber 6, and the waves are analyzed by a wave analyzing device 8 such as a spectrum analyzer.

In the above mentioned measurement, changing the phase of the power supply 2, for $\theta v2$ of plural in the range of $-90° \leq \theta v2 \leq 90°$, the fourth harmonic current is measured.

(3) Measurement example (No.1)

In the first experiment, a measurement by a power supply of which containing rate of harmonics is suppressed in an ideal state is measured.

Figure 23:
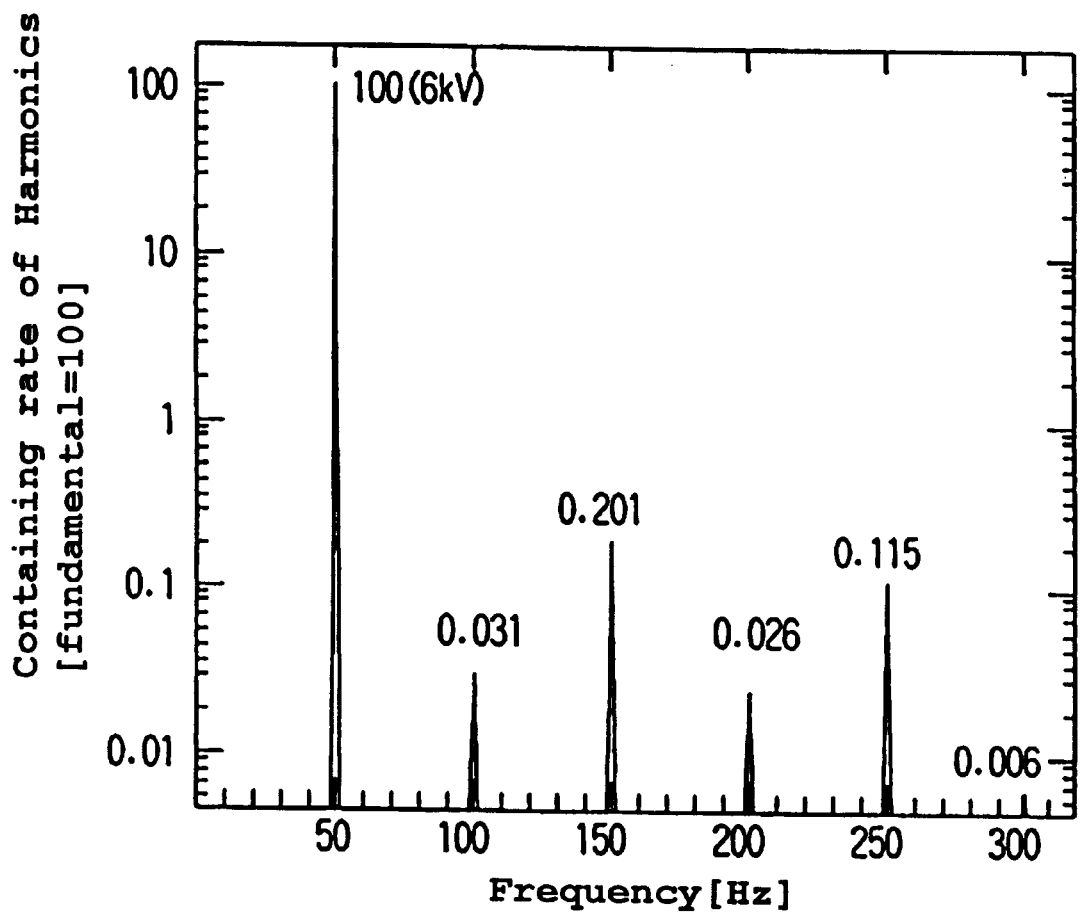
FIG. 23 shows a result of frequency analysis of a test power supply in which containing rate of harmonics is suppressed.

The result of the frequency analysis of the power supply used in the measurement is shown in FIG. 23. It is shown that the containing rate of the third harmonic, which has possibility for causing the problem in the prior art, is low.

The three kinds of the fore mentioned new cable, light deteriorated cable and heavy deteriorated cable are used for measuring the loss current by the voltage.

The measurement result of the third harmonic current obtained by applying only the fundamental voltage of prior art is shown in FIG. 4.

Referring the result, it is found that the order of the amplitude of the third harmonic current is the new one<the light deteriorated one<the heavy deteriorated one. This shows that the distinction of the degree of the deterioration by the prior art method is possible in the case that harmonics in power supply is suppressed.

Next, based on the present embodiment method the fourth harmonic current is measured after applying the second harmonic voltage in addition to the fundamental voltage. The results are shown in FIG. 25 (new one), FIG. 26(light deteriorated one) and FIG. 27(heavy deteriorated one).

Figure 25:
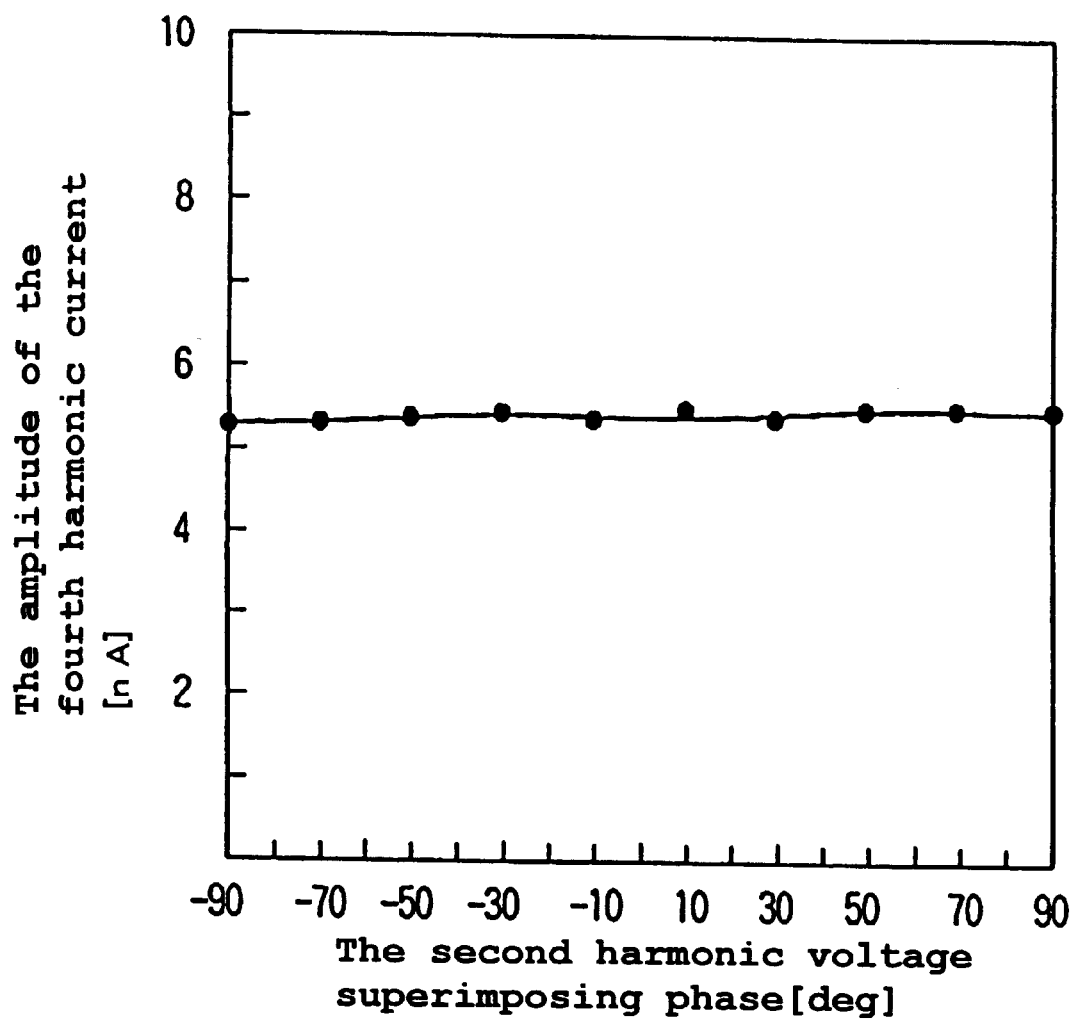
FIG. 25 shows the change of the amplitude of the current of the fourth harmonic for superimposing phase of the second harmonic voltage measuring a new cable by a test power supply in which containing rate of harmonics is suppressed.

Now, as shown in FIG. 25, the fourth harmonic current measured in the new cable is not changed, even the superimposing phase being changed. This shows that only noise level signals are occurred. That is, it is shown that the fourth harmonic current is not occurred in the new cable, even if the second harmonic voltage is superimposed.

Figure 26:
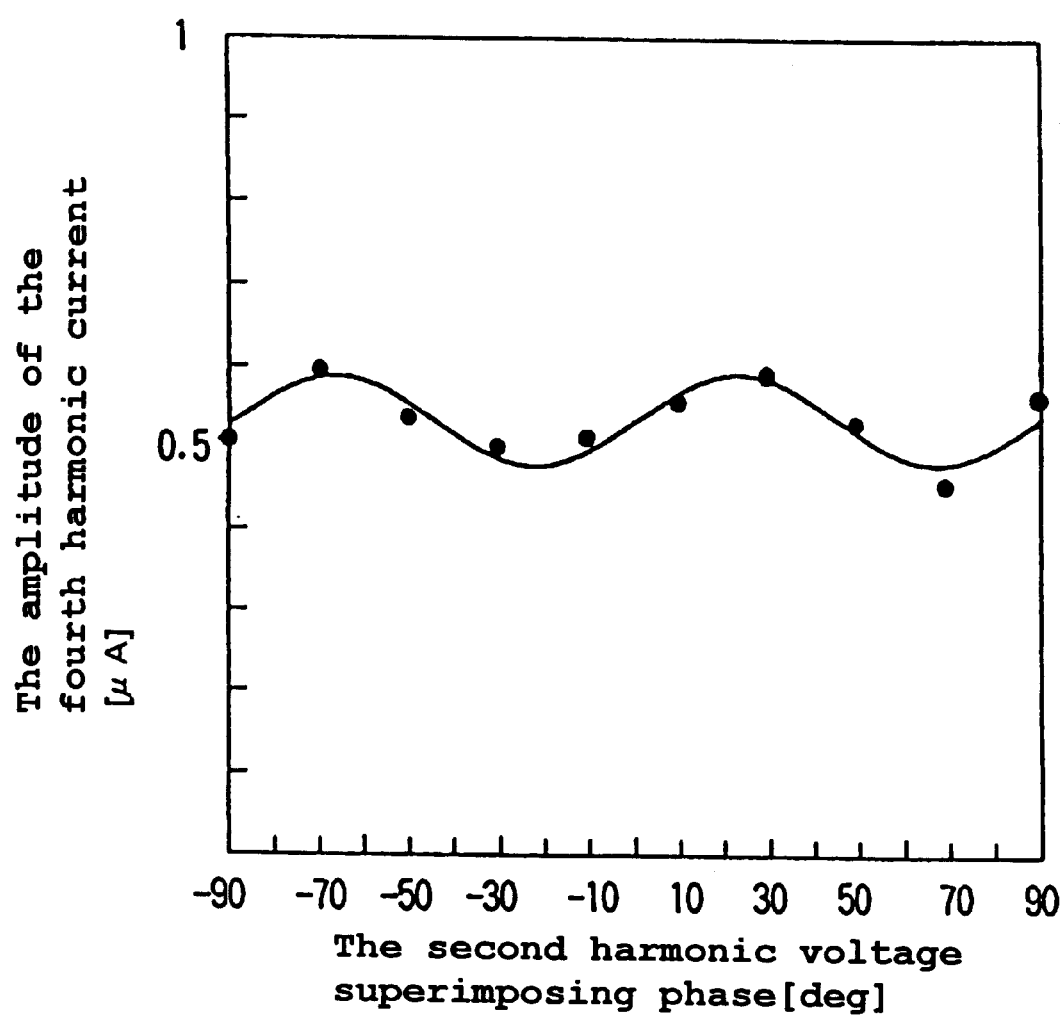
FIG. 26 shows the change of the amplitude of the current of the fourth harmonic for superimposing phase of the second harmonic voltage measuring a light deteriorated cable by a test power supply in which containing rate of harmonics is suppressed.

Next the fourth harmonic current measured in the light deteriorated cable has a little dependency of the superimposing phase of the second harmonic voltage as shown in FIG. 26, it is shown that the change of two cycle in the range $-90° \leq \theta v2 \leq 90°$. The change width to the average of the cycle change value is about 13% by calculation.

Figure 27:
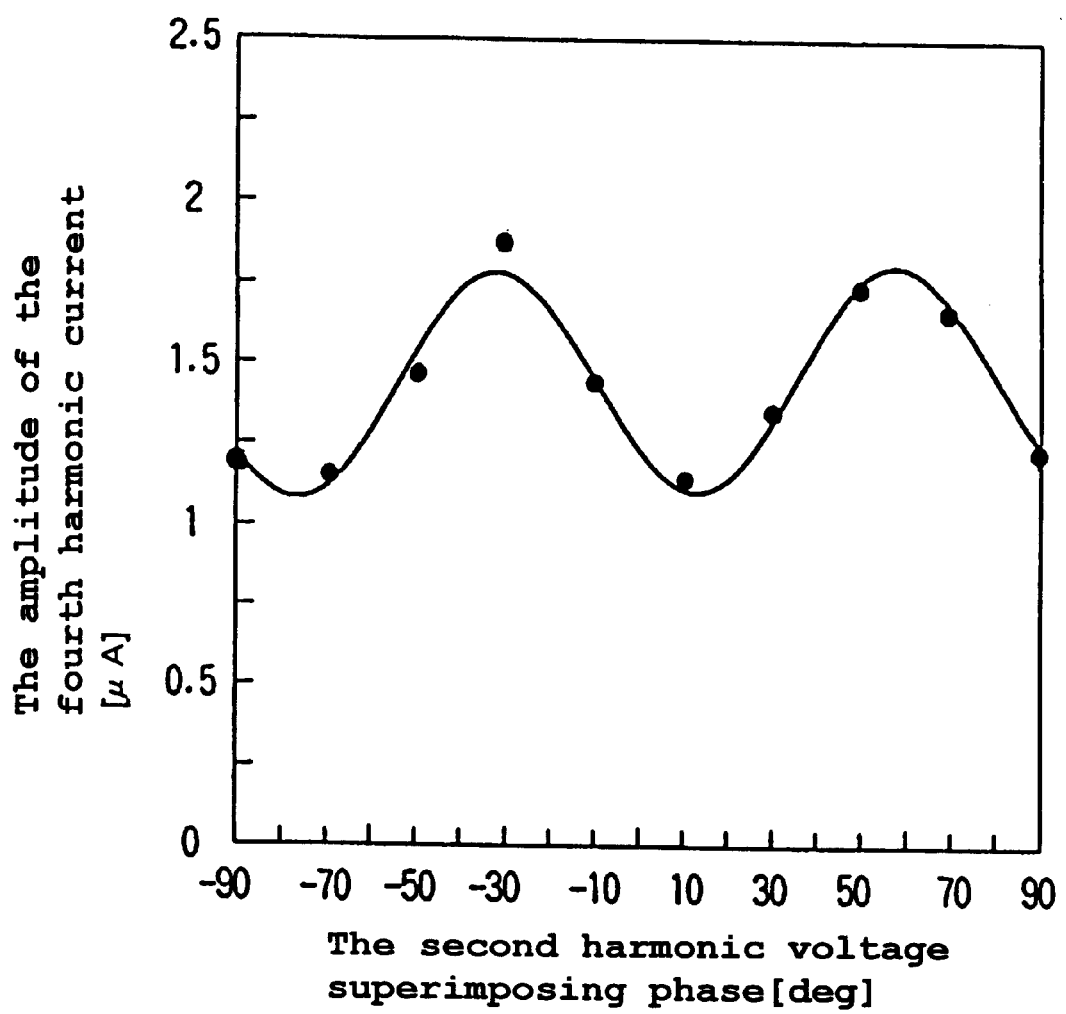
FIG. 27 shows the change the amplitude of the current of the fourth harmonic for superimposing phase of the second harmonic voltage measuring a heavy deteriorated cable by a test power supply which containing rate of harmonics is suppressed.

Further next, the fourth harmonic current measured in the heavy deteriorated cable is shown in FIG. 27, and the dependency of the superimposing phase $\theta v2$ of the second harmonic is very high. It is found that the change of two cycles in the range $-90° \leq \theta v2 \leq 90°$. The change width to the average of the cycle change value is about 28% by calculation.

As mentioned above, it is confirmed that, according to the embodiment of the present invention, the determination of the deterioration state of cables is implemented easily by measuring the amplitude of change of the fourth harmonic by changing the superimposing phase of the second harmonic voltage, in the present invention. This corresponds to the third harmonics wave in the case of the use of the ideal power supply in the prior art, so that the cross check with the prior art method for the confirmation test is implemented.

(4) Measurement example (No.2)

Figure 28:
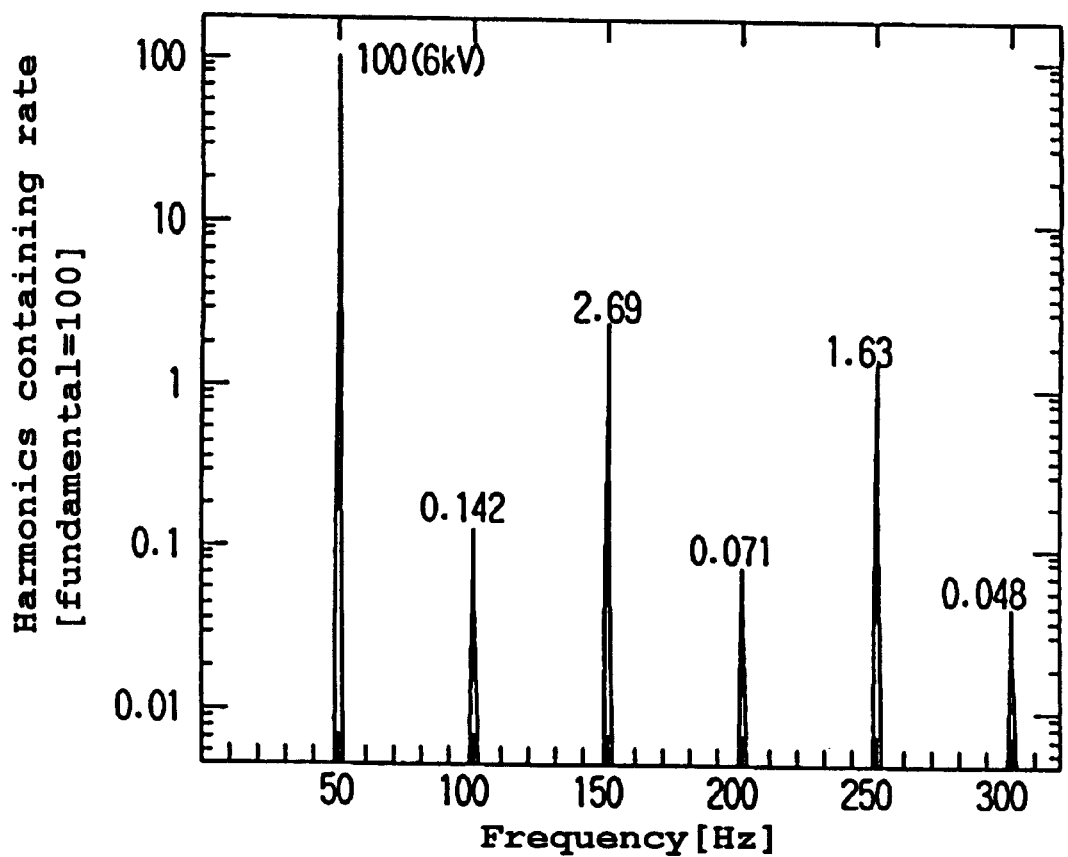
FIG. 28 shows a result of frequency analysis of a test power supply in which containing rate of harmonics is not suppressed.

The next experiment is measured using a general power supply in which the containing rate of the harmonics is not suppressed. The frequency analysis of the power supply output used in the measurement is like shown in FIG. 28. It is shown that the containing rate of the third harmonic, which could be problem, is a little high.

The loss currents of the new one, the light deteriorated one and the heavy deteriorated one are measured under the voltages.

The results of the third harmonic current measurement applied only the fundamental voltage of the prior art is shown in FIG. 29.

Referring the results, the third harmonic current of the new one, the light deteriorated one and the heavy deteriorated one are almost same. This shows that, when the harmonic in the power supply is not suppressed, the third harmonic contained in the power supply affects to the measurement results, so that the distinction of the deterioration state is impossible.

Next, based on the present invention method, the fourth harmonic current is measured after applying the second harmonic voltage in addition to the fundamental voltage. The results of the measurement is shown in FIG. 30 (the new one), in FIG. 31 (the light deteriorated one) and in FIG. 32 (the heavy deteriorated one).

Figure 30:
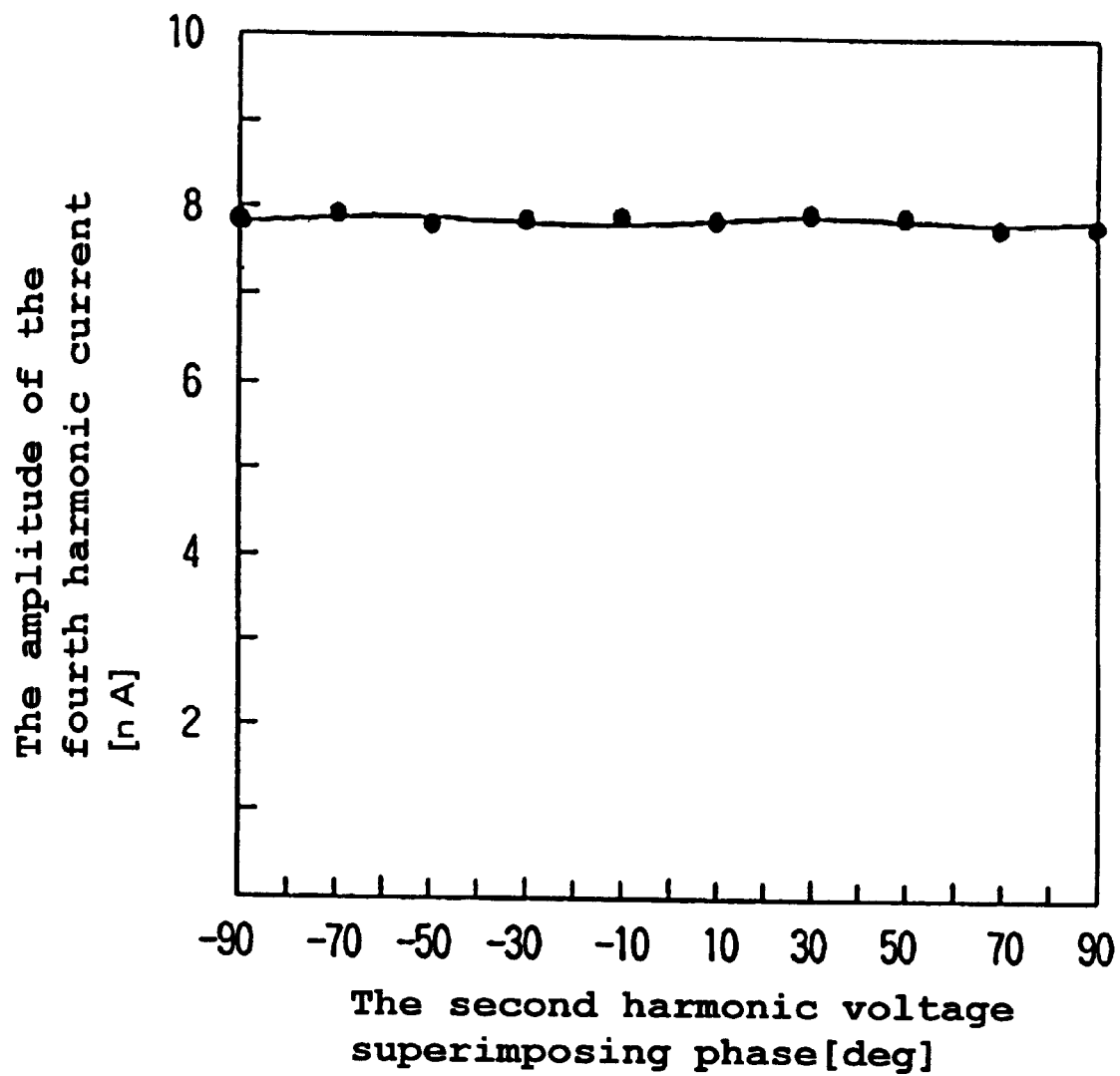
FIG. 30 shows the change of the amplitude of the current of the fourth harmonic for superimposing phase of second harmonic voltage measuring a new cable by a test power supply in which containing rate of harmonics is not suppressed.

The fourth harmonic current measured in the new one is not changed to the change of the superimposing phase of the second harmonic voltage as shown in FIG. 30. This is because of the same reason with the measurement example (No.1).

Figure 31:
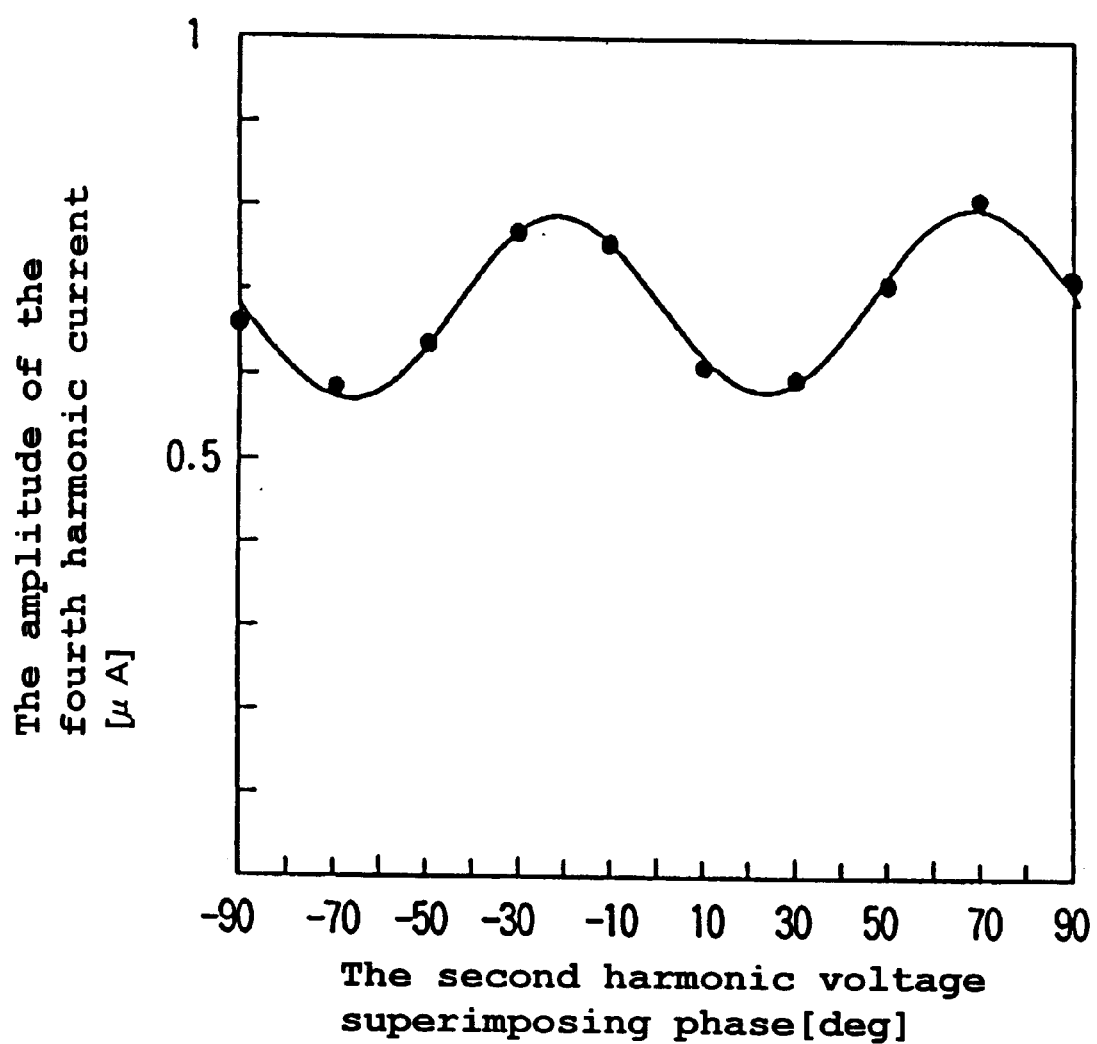
FIG. 31 shows the change of the amplitude of the current of the fourth harmonic for superimposing phase of second harmonic voltage measuring a light deteriorated cable by a test power supply in which containing rate of harmonics is not suppressed.

Next, the fourth harmonic current measured in the light deteriorated one has slight dependency for the superimposing phase θv2 of the second harmonic as shown in FIG. 31, and it is shown that two cycles change in the range of −90°≦θv2≦90°. The change width for the average of the cycle change value is about 14% by calculation.

Figure 32:
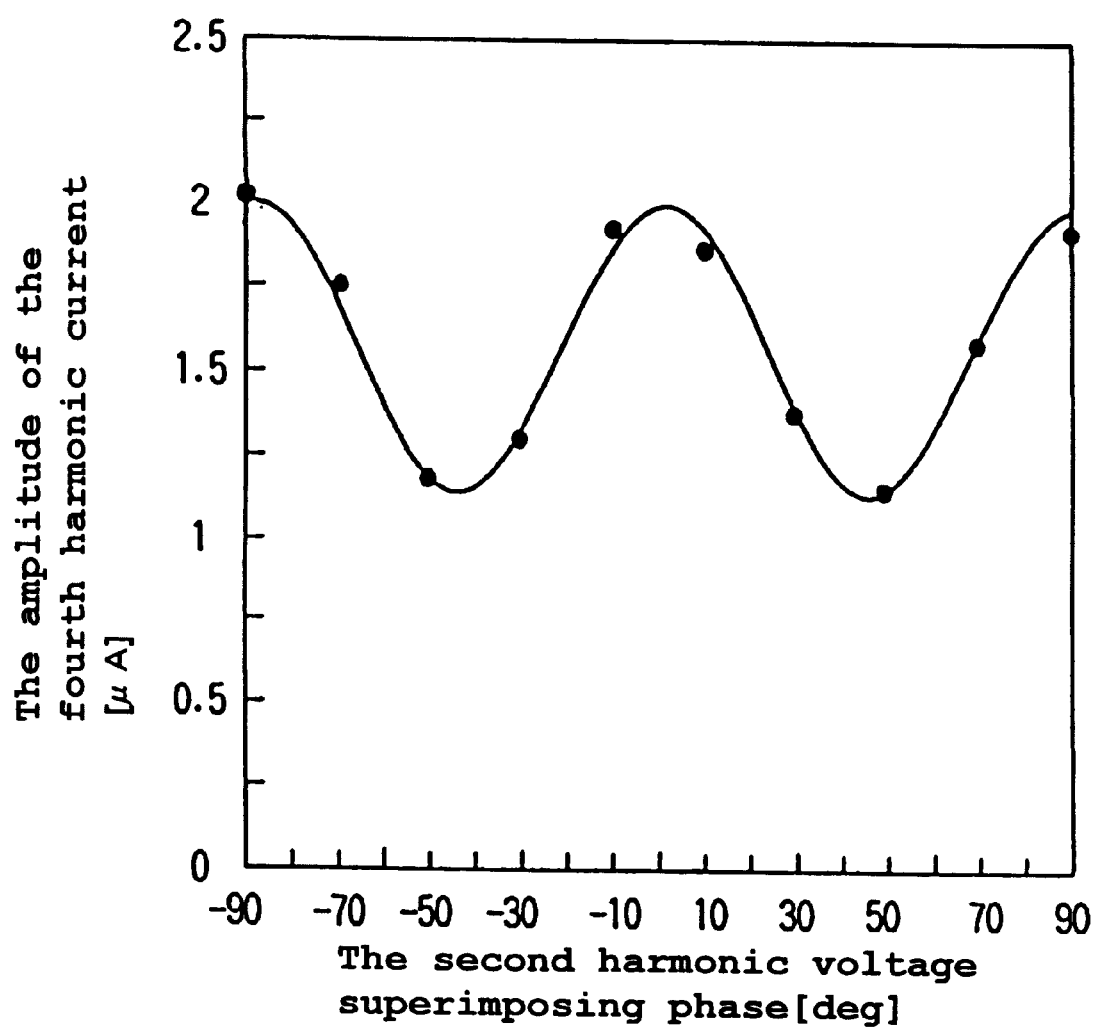
FIG. 32 shows the change of current of the fourth harmonic for superimposing phase of second harmonic voltage measuring a heavy deteriorated cable by a test power supply in which containing rate of harmonics is not suppressed.

Next, the fourth harmonic current measured in the heavy deteriorated one is shown in FIG. 32, and it has a great dependency for the superimposing phase θv2 of the second harmonic, which is greater than the light deteriorated one, the same with the measurement example (No.1). It is shown that two cycles change in the range of −90°≦θv2≦90°. The change width for the average of the cycle change value is about 31% by calculation. Also the state of change is almost same level comparing with the FIG. 28.

By the above mentioned experiments, it is confirmed that, even if the harmonics component in the applied voltage are large, the distinction of the deterioration state of cables are measured easily by the change width of the fourth harmonic when the superimposing phase of the second harmonic is changed. On the other hand it is found that the distinction of the new one, the light deteriorated one and the heavy deteriorated one is impossible at all by the prior art because of the affection of harmonics contained in the power supply used for the measurement.

This shows that the method of the present invention is effective by using even a general power supply containing relatively many harmonics.

C. Embodiment 3: Deterioration diagnosis based on relations of the superimposed phase of the second voltage for the first voltage V1 and it of the fourth harmonic component of the loss current for the first voltage (No.1)

For example, by using the above mentioned measuring circuit such as FIG. 9, the loss current is measured by an operation applying the first voltage V1 (fundamental voltage) having the frequency f (fundamental frequency). Next, keeping the above mentioned first voltage V1 and the balance state of the loss current measuring circuit, and next, loss current being measured in the case of superimposing of the second voltage V2 (superimposed voltage) having the second frequency 2f of two times of the fundamental, the current component of frequency 4f (the fourth harmonic to basic frequency) of the four times of the fundamental contained in the current is appeared.

The intensity of the fourth harmonic current component becomes high corresponding to the advance of the deterioration, so that the degree of the deterioration is estimated by using the fourth harmonic current components.

The fourth harmonic current components, which is considered as the deterioration signal in the present invention, is the same with the occurrence of the third harmonic in the prior art method, in the point of occurrence based on the non-linear characteristic caused by the water tree. But as it uses phenomenon which the two kinds of frequencies are acted mutually in the non-linear characteristics of the water tree to occur the signals which do not correspond to the odd order harmonic of the applied voltage, the diagnosis is implemented without affection of the third harmonic component contained in the applied voltage.

So, as the result of the investigation of the relation between the deterioration degree of the cables and the occurred fourth harmonic current, it is found that the superimposed phases of the fourth harmonics are changed by the deterioration degree of the electric power cables same as the case of the third harmonic components.

But, as the fourth harmonic currents occurs by superimposing the frequency f of the fundamental voltage V1 and the frequency 2f of two times of the fundamental voltage, and by the mutual action of the two kinds of frequency voltages in the non-linear characteristics of water trees, so that the superimposed phases (it is express as the phase difference θ4 for the fundamental voltage) of the fourth harmonic component occurred in the loss currents also changes in response to the superimposed state of fundamental voltage V1 and superimposed voltage V2, that is, superimposed phase (θv2), of course, so that obtaining only the superimposed phase of the fourth harmonic component is not sufficient.

So, in the present embodiment, the deterioration diagnosis is implemented by using a relation between the superimposed phase difference θv2 of the second voltage V2 to the first voltage V1, and the superimposed phase θ4 of the fourth harmonic component in the loss currents.

So, the relation between the superimposed phase difference θv2 and the super imposed phase θ4 is investigated.

Figure 33:
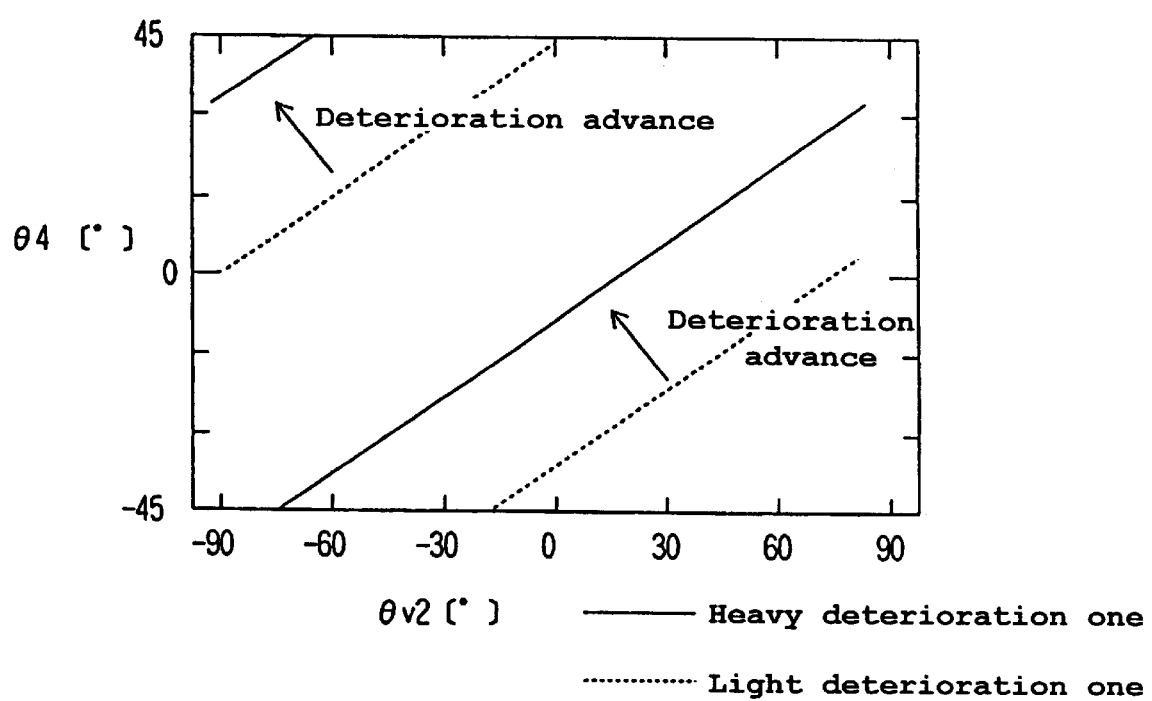
FIG. 33 shows a relation between fundamental voltage and superimposed phases $\theta v2$ of a superimposed voltage to a fundamental voltage and superimposed phases $\theta 4$ of the fourth harmonic current in loss current measured under the superimposed voltage.

As the results, it is found that between the superimposed phase difference θv2 of the first voltage V1 and the second voltage V2, and for the superimposed phase θ4 of the fourth harmonic component in the loss currents, the transition is accompanied with the deterioration of the cable shown in FIG. 33.

Now, when the fundamental voltage is V1 sin ωt, the superimposed voltage is V2 sin(2(ωt+θv2)), the fourth harmonic current is I4 sin(4(ωt+θ4)), as shown in the figure, the allowable range of the two kinds of the voltages of the superimposed phase θv2 and the superimposed phase θ4 of the fourth phase harmonic current are each −90°≦θv2≦90°, −45°≦θ4≦45°.

By this, the superimposed phase difference θv2 is set in a side of the generator of the superimposed voltage, and the superimposed phase θ4 of the fourth harmonic components in the loss current of the cable is measured, the superimposed phase θ4 moves from minus side to plus side according to the deterioration of the cable, so that the diagnosis of the deterioration degree of the cable is implemented.

Also by using the relation between the superimposed phase difference θv2 and the superimposed phase θ4 of the fourth harmonic component in the loss currents is approximated by a line having a constant slope determined by the degree of the deterioration as shown in FIG. 33, the deterioration degree of the electric power cable is diagnosed by the superimposed phase of the fourth wave component measured under the superimposition of some voltages and the superimposed phase of the second voltage at that time, without setting in advance the superimposed phase difference θv2 in the superimposing voltage generator device, and this makes easier the diagnosis.

That is, the relation of the superimposed phase θv2 of two kinds of voltages and the superimposed phase θ4 of the fourth harmonic current is approximated by a line of the same slope in any deterioration degree of cables as shown in FIG. 33, and the deterioration degree corresponds to the location of the plotted line. The deterioration advancing, the line moves to minus direction of θv2 (positive direction of θ4).

From this, the deterioration is diagnosed by obtaining both of the superimposed phase θ4 of the fourth harmonic component and the superimposed phase difference θv2 by implementing the measurement under a state of the superimposed phase (superimposed phase difference θv2). By this, the measurement of the plural superimposed phase difference θv2 is not necessary (only one suitable measurement under a condition is necessary).

That is, the deterioration of cables can be diagnosed only by obtaining relation between the superimposed phase θv2 and the superimposed phase θ4 of the fourth harmonic current of two kinds of voltages under one condition.

In the following, it is explained that, even in a case impossible for diagnosing the deterioration by the prior art because of the harmonics of the applied voltage, the diagnosis is implemented without these affections, and the diagnosis method of the deterioration without measuring the plural superimposed phase is explained.

(1) Measured example 1: the deterioration diagnosis of the present invention and the prior art are compared for two cases that the harmonics are contained in the applied voltage and not contained.

Two kinds of 22 kV XLPE cables of 150 mm$^2$(insulation thickness of 6 mm), having water trees, and a new cable of same size for comparing are provided as the samples.

The two kinds of deteriorated cables are the light deteriorated cable and the heavy deteriorated cable. By investigations for another samples of the same kinds, these deterioration rate is confirmed that the light one has vented water trees from outer semi-con of about 1 mm at maximum and AC break down voltage distributing between 120–200 kV, and the heavy deteriorated one has vented water trees from outer semi-con of about 3 mm at maximum and AC break down voltage distributing between 40–80 kV. In the following measurements of embodiments, the length is unified to 20 m for all cables.

The measurement is implemented by a circuit shown in FIG. 9(b). Shown in the figure, a standard capacitor 5 is connected parallel to the electric power cable 4, the standard capacitor 5 is connected to one of terminals of the loss measuring bridge 3, and another terminal of the loss current measuring bridge 3 is connected to the sheath of the cable 4.

At first, frequency 50 Hz of commercial supply frequency voltage 6 kV is applied between the center conductor to the sheath of the cable 4 from the power supply 1, the loss current is measured by rejecting the capacitive current from the current in the cable insulation. Next keeping the applied voltage and the balance state of the loss current measuring bridge 3, the loss current is measured by superimposing the frequency 100 Hz of 2 kV of the power supply 2.

The obtained loss current is input to a wave analyzing device 8 composing from a computer etc. as discrete numerical data, and separated to the fundamental and their harmonics by a discrete numerical fast Fourier transformation process etc. and intensity of the third harmonic current, the fourth harmonic current and value of the superimposed phases are obtained.

Also the applied voltage is input into the wave analyzing device 8 through the divider not shown in the drawing at the same time, and the situation of the containing rate of the harmonics and value of the fundamental and the superimposed phases θv2 of the superimposed voltage are confirmed.

The measurement of the loss current by the superimposed voltages of the two kinds frequencies is implemented by the superimposed phases θv2 at plural points in the range of −90°~90°.

The occurrence of the voltage of frequency 100 Hz is obtained by stepping-up output voltage of a stabilized alternating power supply which is settable optionally the output frequency with superimposing transformer. Also the fundamental voltage is step-upped the voltage of a commercial supply power source. The commercial frequency is 50 Hz in East Japan as nominal value, but it has deviations of ±some integer×10$^{-1}$, the deviation is changed generally also by time.

Because of this, when the embodiment is implemented, it is apprehensive that the frequency of the superimposed voltage is, strictly speaking, not exact two times of the fundamental voltage, so that the effects of the present invention is not exhibited, but, by the following reason, the problem does not occurred.

Now, when the frequency of the fundamental voltage is (50±ε)Hz (here, ε is the deviation of the commercial frequency nominal value), principally, the deterioration signal appears in the loss current (200±2 ε) Hz. The reasonable deviation ε would be 0.3 at maximum, in this case, the deterioration signal appears in a frequency range of 199.4–200.6 Hz. Even if 200 Hz components is extracted by Fourier series development as fundamental of 50 Hz, the value is not different with 1% at maximum comparing to 200 Hz component obtained by the exact frequency of 50 Hz of the fundamental and the superimposed voltage of frequency of exact 100 Hz. That is, even the frequency of the fundamental voltage has the deviation from the nominal value of the commercial frequency, the effects of the present invention are not lowered remarkably, so that, it should be said that the influence does not appeared.

By using the above mentioned measuring circuit, the prior art method and the present invention method are implemented in both cases that the harmonics are not almost contained in the applied voltage and that the harmonics are contained in the applied voltage.

(a) a case that the harmonics are not almost contained

Figure 34:
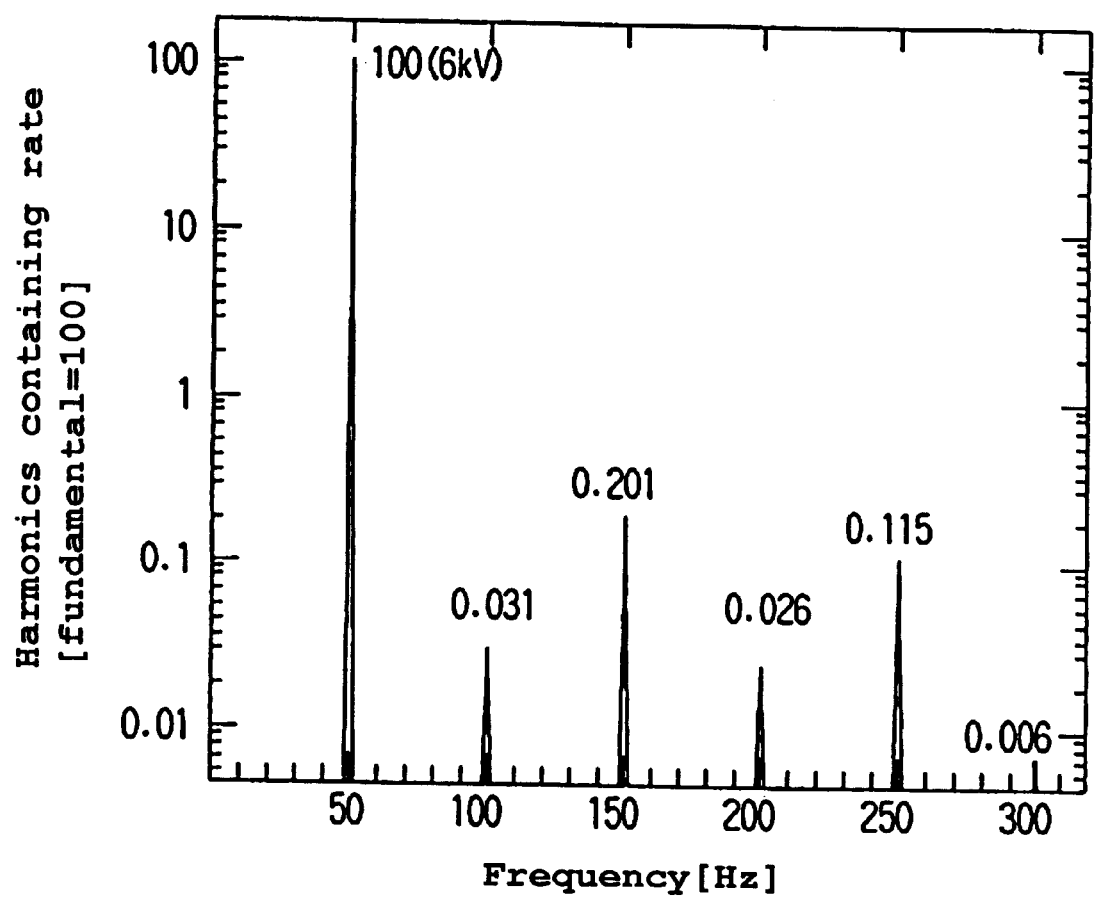
FIG. 34 shows a containing rate state of harmonics of fundamental voltage of frequency 50 Hz which scarcely contain harmonics components.

The measurements of the new one, the light deteriorated one and the heavy deteriorated one by the prior art method and the present invention are implemented with the applied voltage (fundamental voltage) of frequency 50 Hz having the containing rate of harmonics like shown in FIG. 34. The third harmonic component (150 Hz) of the applied voltage, which might be feared in the prior art method, is about 0.2% to the fundamental components as illustrated in FIG. 34.

The prior art method is that which diagnoses the deterioration only by the amplitude or the superimposed phases of third harmonic in the loss current obtained by the apply of the fundamental voltage.

The data gained by this time embodiment are shown in FIG. 35.

As shown clearly in FIG. 35, the third harmonic current is increased according to the progress of the deterioration, at the same time, the superimposed phase of the third harmonic moves to the positive direction, and it shows that the diagnosis of the deterioration of cables is possible without problems even by the prior art in the case of the containing rate of the harmonics of 0.2% of the applied voltage.

Next the measurement of the present invention is implemented by superimposing frequency of 100 Hz, voltage of 2 kV to the fundamental voltage.

Figure 36:
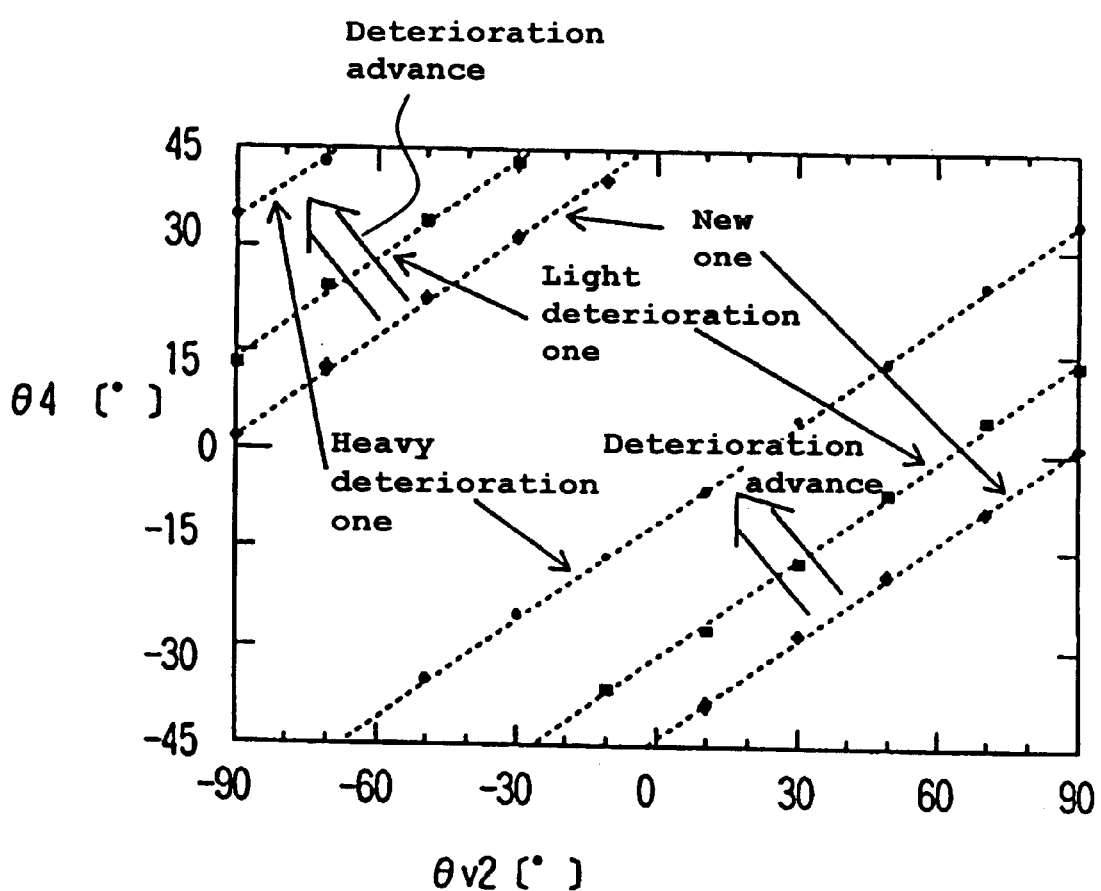
FIG. 36 shows a result measured by the present invention method using a fundamental voltage of frequency 50 Hz which scarcely contain harmonics components.

As the result, the relation between the superimposed phase θ4 of the fourth harmonic current in the loss current and the superimposed phase θv2 of the superimposed voltage of two kinds of frequencies (50 Hz and 100 Hz) are shown in the FIG. 36.

As shown in FIG. 36, a line showing a relation between θv2 and θ4 are moved according to the degree of the deterioration, and the diagnosis of the deterioration of cables is possible.

As mentioned above, it is confirmed that the diagnosis of the deterioration of cables is possible by the prior art method by ideal applied voltage which does cot contain almost the harmonics, and at the same time, it is confirmed that the present invention method is effective to the diagnosis of the deterioration.

(b) a case that the harmonics are contained in the applied voltage

Figure 37:
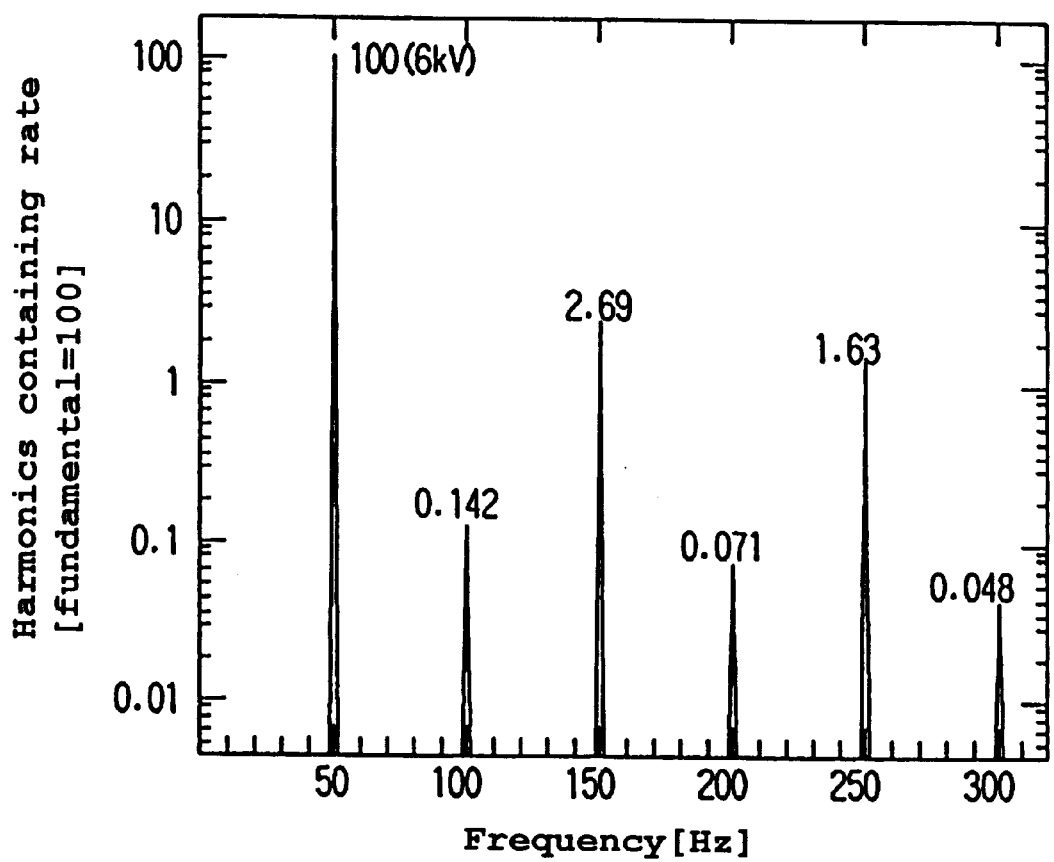
FIG. 37 shows a containing rate state of harmonics of fundamental voltage of frequency 50 Hz containing harmonics components.

Next, the measurements of the new one, the light deteriorated one and the heavy deteriorated one by the prior art method and the present invention are implemented with the applied voltage (fundamental voltage) of frequency 50 Hz having the containing rate of harmonics like shown in FIG. 37.

The third harmonic component of the applied voltage, which might be feared in the prior art method, is about 2.7% relatively high.

Results of the measurement implemented by the prior art which is the same as the above mentioned embodiment are shown in FIG. 38.

As shown clearly in FIG. 38, the harmonics amplitude and the superimposed phase are not changed according to the change of the deterioration degree, so that, data which is corresponding to the deterioration degree are not obtained. This shows the third harmonic current amplitude appeared in the loss current as effects of the third harmonic in the applied voltage is greater than the third harmonic current amplitude occurred by the deterioration, so that it shows that the exact diagnosis of the deterioration is impossible by the prior art method.

Next the measurement is implemented by superimposing the frequency of 100 Hz, voltage of 2 kV to the fundamental voltage.

Figure 39:
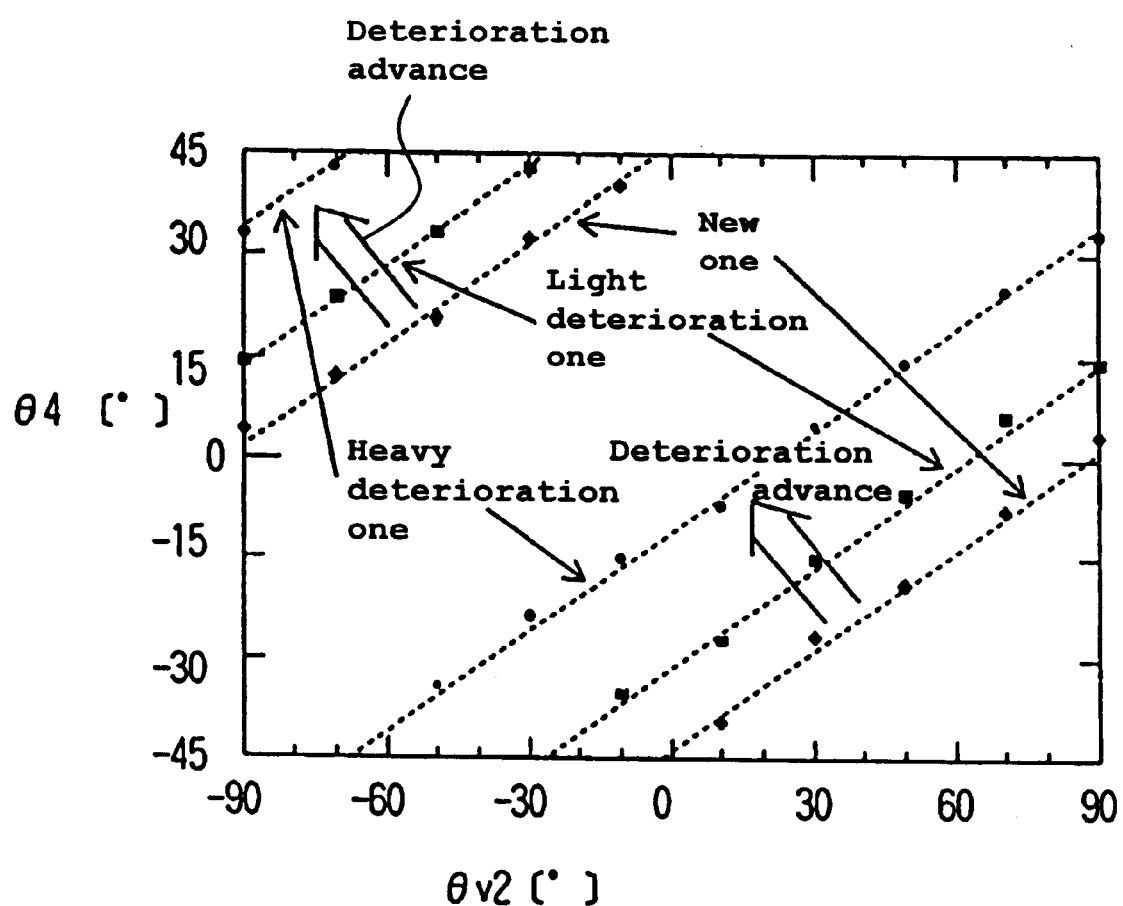
FIG. 39 shows a result measured by the present invention method using a fundamental voltage of frequency 50 Hz containing harmonics components.

As the result, the relation between the superimposed phase $\theta 4$ of the fourth harmonic current in the loss current and the superimposed phase $\theta v2$ of the superimposed voltage of two kinds of frequency (50 Hz and 100 Hz) are shown in the FIG. 39.

As shown in FIG. 39, a line showing a relation between $\theta v2$ and $\theta 4$ are moved corresponding to the degree of the deterioration, and it is confirmed that almost the same relation between $\theta v2$ and $\theta 4$ with those obtained by applying the voltage not contained almost the harmonics are obtained.

That is, it is confirmed that an exact diagnosis of the deterioration of cables by the present invention, in spite of the harmonics (particularly the third harmonic) contained in the applied voltage or not, is possible.

(2) Measured example 2: The diagnosis of the deterioration which is not implemented by plural superimposed phases In the measured example, the measurement by plural superimposed phase $\theta v2$ is implemented for knowing the relation of the superimposed phase $\theta v2$ of the voltage of two kinds frequencies and superimposed phase $\theta 4$ of the fourth harmonic current in the loss current measured by the superimposed voltage.

But as shown in the above mentioned results, considering the proportional relation between both of them and the constancy of the slope ($\theta 4/\theta v2=1/2$), it is not necessary the plural superimposed phases $\theta v2$ to be measured, and the diagnosis of the deterioration is possible by measuring the superimposed phases $\theta v2$ under one condition. This method is explained by examples in the following.

(a) One example method is that which implements the measures by fixing the superimposed phase $\theta v2$ of the superimposed voltage of frequency 100 Hz for the fundamental voltage of frequency 50 Hz always to a constant value.

Figure 40:
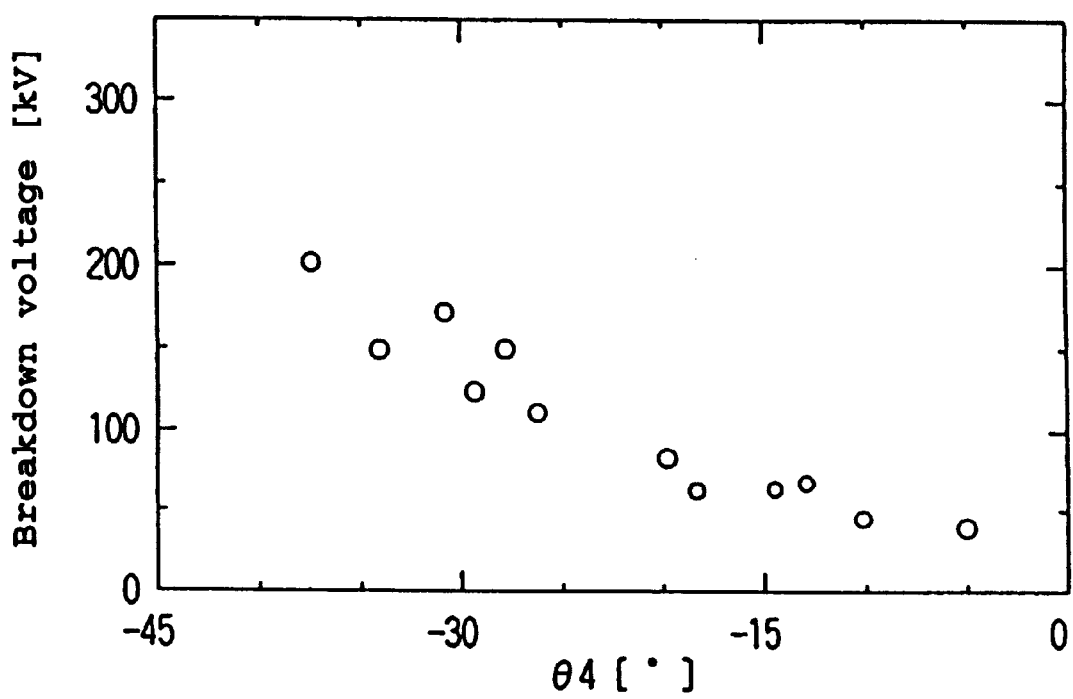
FIG. 40 shows a relation of break down voltages and $\theta 4$ measured by keeping a phase of superimposing voltage $\theta v2$ constant (0°)

FIG. 40 shows a relation between the superimposed phase $\theta 4$ (horizontal axis) and the breakdown voltage (vertical axis) obtained under the condition being kept $\theta v2$ of the superimposed phase to 0°. The sample provided to this is the same with the cables of the above mentioned examples, and the value of fundamental voltage and superimposed voltage and the measuring process are same with the above mentioned examples.

Referencing FIG. 40, it is shown that, according to decreasing of the breakdown voltage of samples, that is the progress of the deterioration, the $\theta 4$ moves to the plus direction by a very good correlation. Like this, the superimposed phase $\theta 4$ of the fourth harmonic in the loss current obtained by fixing the superimposing phase $\theta v2$ of the fundamental voltage of the frequency 50 Hz and the superimposed voltage of frequency 100 Hz is treated as the correspondence of the degree of the deterioration of the cable. Also the value of the superimposed phase $\theta v2$ is not limited to 0° of the example, if it is unified at any value in the measurement, the value $\theta 4$ corresponds to the deterioration degrees.

(b) Another method is that which implements the measures by not fixing the superimposed phase $\theta v2$ of the superimposed voltage of frequency 100 Hz for the fundamental voltage of frequency 50 Hz, further using that the relation of the $\theta v2$ and the $\theta 4$ is always shown by a line having the constant slope ($\theta 4/\theta v2=1/2$), the $\theta 4$ is corrected by the voltage superimposed phase $\theta v2$ at each measurement.

That is, the relation of the $\theta v2$ and $\theta 4$ is shown the following relation (1), so that a unknown k is determined by inserting the $\theta v2$ and $\theta 4$ to the equation (1), the line showing the deterioration degree of the sample shown in FIG. 33, FIG. 36 and FIG. 39 can be determined.

$$\theta 4=\theta v2/2+k (k \text{ is constant}) \tag{1}$$

Accordingly, by using, the equation $\theta 4$ at any superimposed phase $\theta v2$ is obtained. That is, the correction being implemented for the measured result to obtain the $\theta 4$ at the fixed superimposed phase $\theta v2$, it is possible that they are evaluated as data by the unified condition of the superimposed voltage.

The measured results by using the same sample with the above mentioned embodiment, and by the same applied voltages and same measuring process, but not fixing the superimposed voltage phase $\theta v2$ is shown in FIG. 41.

Figure 42:
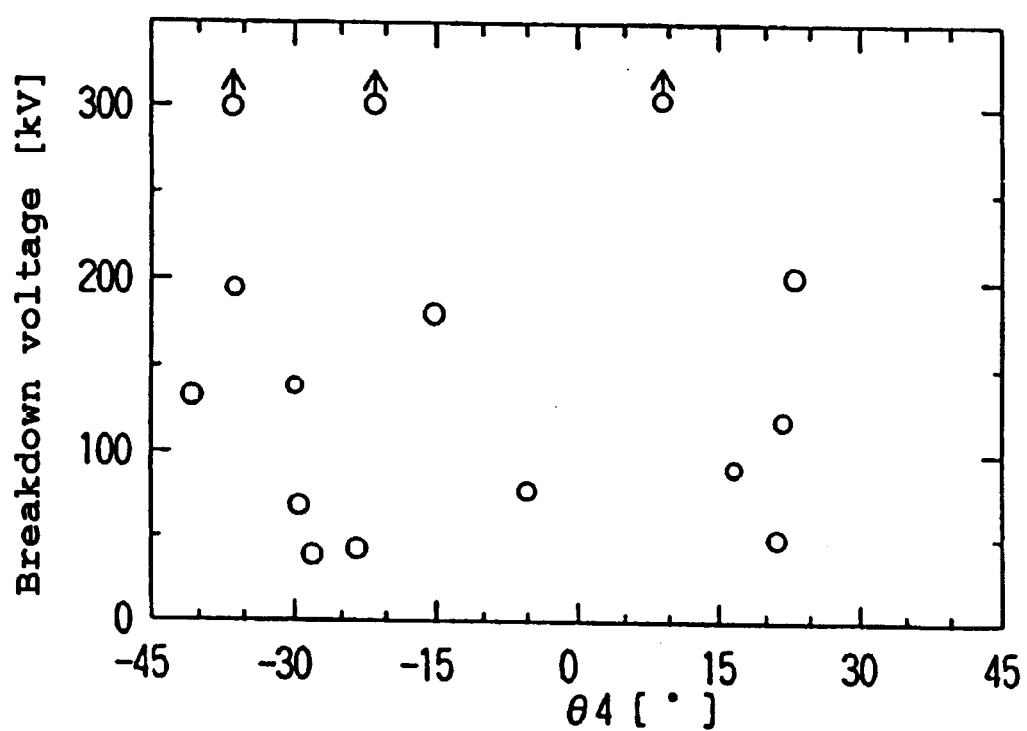
FIG. 42 shows a result measured in condition of superimposing phase $\theta v2$ which is not kept to any constant value.

Also the obtained relation between $\theta 4$ and the breakdown voltage is shown in FIG. 42. Like this, the superimposed voltage phases $\theta v2$ are not unified, the obtained relation between $\theta 4$ and the breakdown voltage, that is, the correlation of the deterioration degree is not shown.

So, $\theta 4$ at $\theta v2=0$ (this is identical with k in the equation(1)) are obtained by the measured result of each samples by using the equation (1). The results are shown in FIG. 43.

Figure 44:
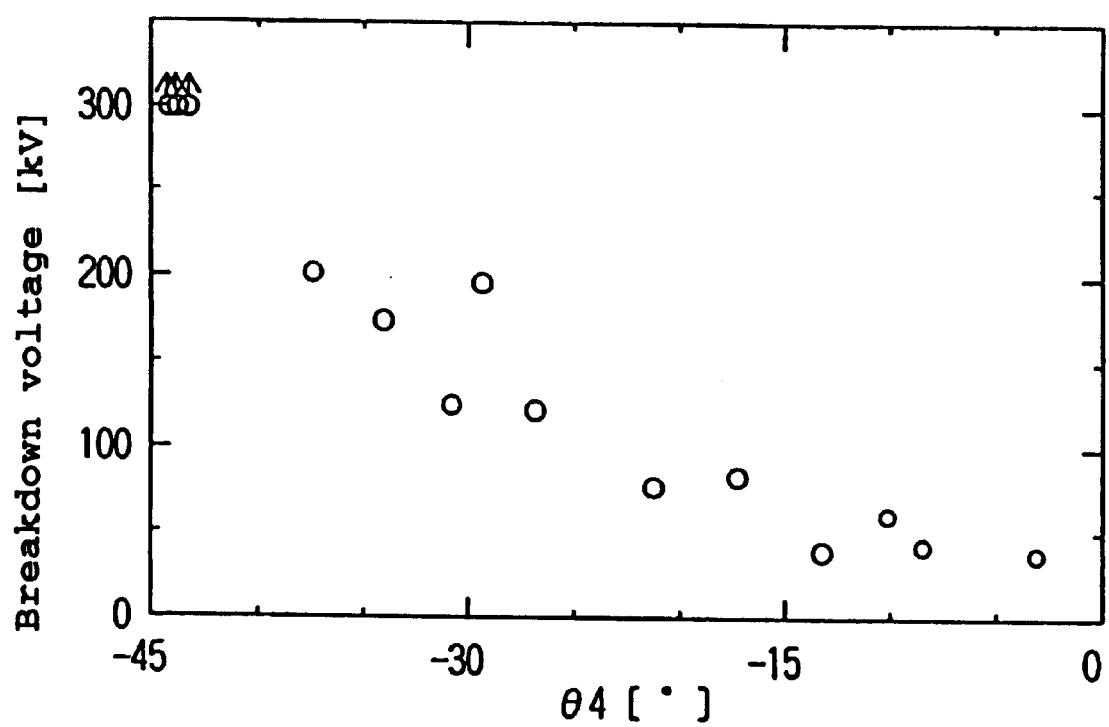
FIG. 44 shows a result which is corrected the result measured in condition of phase of superimposing of voltage θv2, which is not kept to any constant value.

Also the relation of $\theta 4$ and the breakdown voltage is shown in FIG. 44. As shown in the figure, arranging the measured results by using the relation that the relation between $\theta v2$ and $\theta 4$ is always constant slope, it is known that the $\theta 4$ moves to plus direction corresponding to the advance of the deterioration degree.

Like this, it is shown that, even if the measurement is implemented by not fixing the superimposed voltage phase $\theta v2$ to be a predetermined value, using the relation of $\theta v2$ and $\theta 4$, the results having the good correlation of the deterioration degree of cables are obtained by obtaining the $\theta 4$ from the unified the superimposed voltage phase $\theta v2$ from the each measured results.

As mentioned above, it is confirmed that the measurement at the plural superimposed phases $\theta v2$ is not always necessary, but by implementing the measurement concerning to the superimposed phase $\theta v2$ under one condition, the sufficient diagnosis of the deterioration is possible.

In the above mentioned embodiments, cases of the fundamental voltage of frequency of 50 Hz are explained, of course, even if the frequency is 60 Hz, the effects of the present invention are not lost, or another frequencies may be chosen.

Also, the fundamental voltage and the superimposed voltages values are not always same with the values of the embodiments, they are determined by considering the restriction of the objects cable and the measurement.

D. Example 4: Deterioration of diagnosis based on relations between the superimposed phase of the second voltage for the first voltage V1 and it of the fourth harmonic component of the loss current for the first voltage (No.2)

In the present invention, the same with the third embodiment, using the circuit shown in FIG. 9(b), the first voltage (fundamental voltage) of frequency f (fundamental) being applied to the cable to operate measuring the loss current, and next keeping the balance state of the aforementioned first voltage and the loss current, which is measured in a case of superimposition of the second voltage (superimposed voltage) of frequency of 2f of two times of the fundamental is superimposed is measured.

Further, the applied voltage for the cable being V1 sin $(\omega t)$+V2 sin$\{2(\omega t+\theta v2)\}$, and the fourth harmonic current in the case being I4sin$\{4(\omega t+\theta 4)\}$ (now, V1: amplitude of voltage of frequency f (fundamental voltage), V2: amplitude of voltage of frequency 2f (superimposed voltage), I4: amplitude of fourth harmonic current component in the loss current, $\theta v2$: superimposed phase of the voltage of frequency 2f, $\theta 4$: superimposed phase of the fourth harmonic current, $\omega$=2 $\pi$f), the diagnosis of the deterioration of the cable is implemented estimating by I4 and $\theta 4$. Now, particularly it is confirmed that the I4 changes with a fixed relation depending to $\theta v2$, so that noticing of this point, fixing the $\theta v2$ to be a predetermined value, the measurement is implemented really under a unified condition or amending the measured $\theta 4$ by a value concerning to a condition of an unified predetermined $\theta v2$ is necessary.

As the fourth harmonic component current I4 in the loss current is increased by the advance of the deterioration degree of cables, that is, according to the growth of the water trees, the deterioration degree of the cables is diagnosed by estimating the value.

Also, as the superimposed phase $\theta 4$ of the fourth harmonic current shows values corresponding to the deterioration degree under a unified condition of the superimposed phase $\theta v2$ of frequency 2f, the deterioration of the cable is diagnosed by using this.

Like this, both of the above mentioned I4 and $\theta 4$ reflect the deterioration degree of cables, and the diagnosis of the deterioration of cables is measured by estimating each value separately, but there will be a case of the following defect.

That is, as the fourth harmonic component of the current I4 changes corresponding to the growth of the water trees, and depends to the occurred water trees in the cable, so that estimating the results measured on a particular cable regularly does not occur inconvenience, but in cases that the diagnosis for cables in which amount of the occurred water trees are different, there will be a case wrongly determined.

On the other hand, information concerning to amount of water trees occurrence does not be contained in the superimposed phases $\theta 4$ of the fourth harmonic current, so that, it is convenient to measure the growing rate of the water tree, but it is not determined whether the deterioration is occurred all over a cable or in a part of a cable.

Like this, both of the I4 and the $\theta 4$ are corresponding to the deterioration degree, but they reflect mainly the different properties of the deterioration degree. Accordingly by estimating together both of them, the deterioration degree of cables is measured in detail, and the reason is explained in the following.

Also the deterioration degree of cables are estimated more exactly by keeping the ratio of the first voltage V1 of frequency f and the second voltage V2 of frequency 2f to a constant value, measuring at two kinds of voltage at least, and estimating voltage characteristics of the obtained the fourth harmonic current I4 and the superimposed phases $\theta 4$ to the first voltage V1.

The fourth harmonic current is occurred based on the non-linear of voltage-current characteristic caused by the water trees, and the non-linear is increased according to the growing degrees. Accordingly a cable in which the degree of water trees deterioration is heavier, the voltage characteristic of the fourth harmonic current, which is the deterioration signal, becomes distinguishable.

Using this feature, when the almost same values of I4 or $\theta 4$ are obtained based on an applied voltage condition for plural cables, or more detailed estimation concerning to the deterioration degree is necessary, the characteristics of I4 and $\theta 4$ are compared by implementing the measurement based on the different applied voltage, those which are conspicuous for the voltage characteristics (those which the increasing rate of I4 or $\theta 4$ for voltage is great) are determined as those which the deteriorated degree is advanced.

In the following, effects of the present invention are explained by concrete measured examples.

As supplied samples, two kinds of cables of 22 kV XLPE cable of 150 mm$^2$ (insulation thickness 6 mm) having water trees deterioration, and new XLPE cables of the same size with them are provided for the measurement.

The provided deteriorated cables of two kinds are a light deteriorated cable and a heavy deteriorated cable, which the deterioration degrees are different.

Concerning to the deterioration degree, it is confirmed by investigations for another samples of same kinds that the light deteriorated one has vented water trees from outer semi-con of about 1 mm at maximum and which AC break down voltage is distributed between 120–200 kV, and the heavy deteriorated one has vented water trees from outer semi-con of about 3 mm at maximum and which AC break down voltage is distributed between 40–80 kV.

In the following measurement, the length of the each cable is unified as 20 m in the measurement.

On a circuit shown in FIG. 9(b), at first, frequency 50 Hz of commercial frequency voltage 6 kV is applied to the center conductor and sheath of the cable, and executes a balance operation for rejecting the capacitive current from the current in the cable insulator by using current in standard capacitor 5 connected parallel to the cable with the loss current measuring bridge.

Next keeping the applied voltage and the balance state of the loss current measuring bridge, the loss current is measured by superimposing the frequency 100 Hz of 2 kV of the power supply. The obtained loss current is input into a computer as discrete numerical data, and separated the fundamental and its harmonics by a discrete numerical Fast Fourier Transformation process etc. and the intensity I4 of the fourth harmonic current and the superimposed phases $\theta 4$ are obtained.

Now, as the fundamental voltage and superimposed phase $\theta v2$ for applying to the cables, the measurement is implemented under a condition of $\theta v2$=0° at all times. Also, as the measurement for estimating the voltage characteristics, by a combination of superimposed voltage of 3 kV of frequency 100 Hz to voltage of 9 kV of frequency 50 Hz, and a combination of superimposing of voltage 12 kV of frequency 50 Hz and voltage 4 kV of frequency of 100 Hz, the same measurements are implemented.

(1) Estimating method by combination of the amplitude of the fourth harmonic current I4 and the superimposed phase θv4

Figure 45:
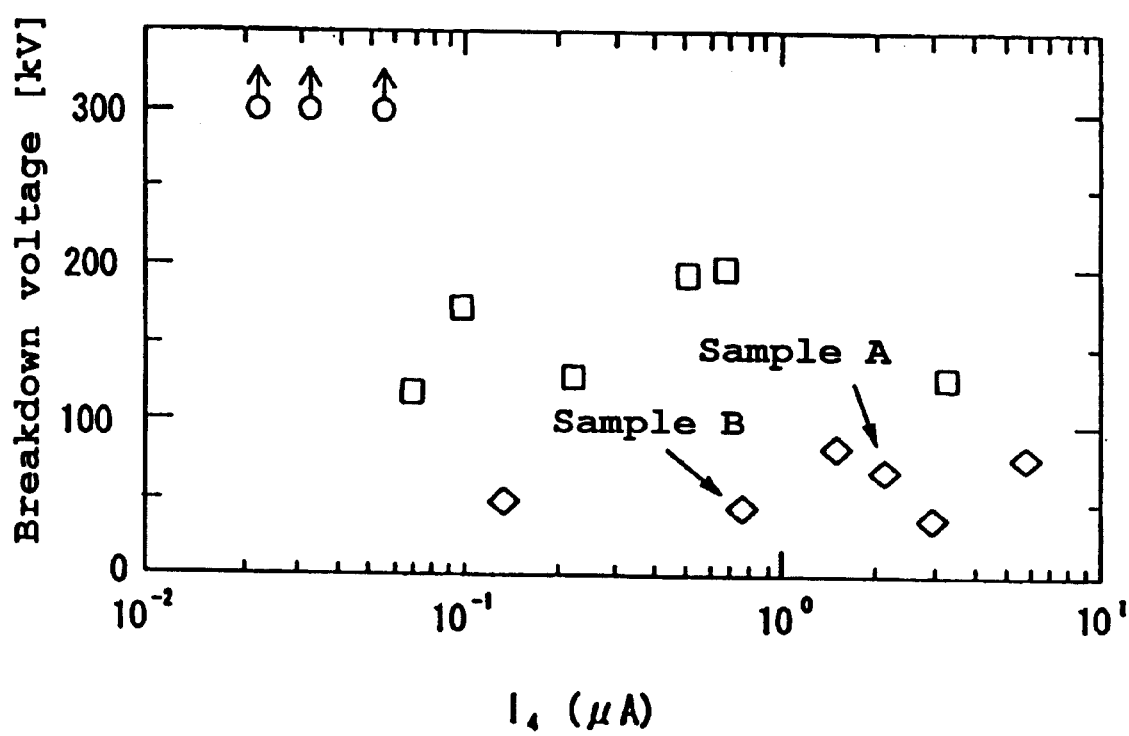
FIG. 45 shows a relation of amplitude of the fourth harmonic current I4 and break down voltage of a cable.

The relation of the amplitude of the fourth harmonic current I4 and the breakdown voltage of samples measured in each sample is shown in FIG. 45.

Figure 46:
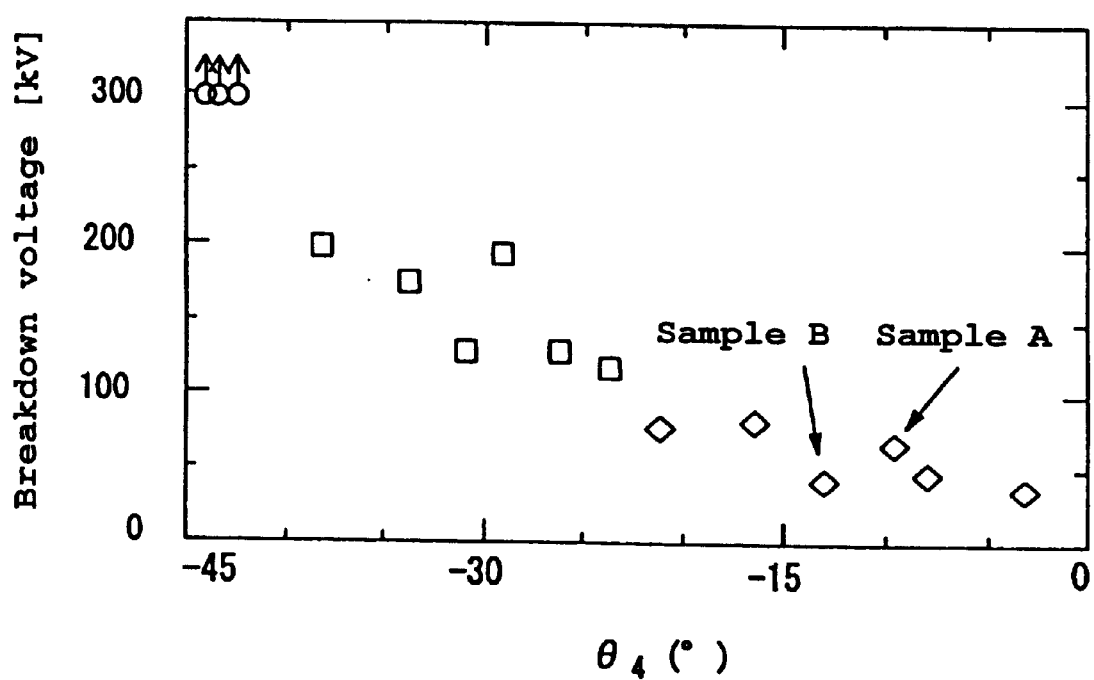
FIG. 46 shows a relation of superimposing phases θ4 of the fourth harmonic and break down voltages of a cable.

Also the relation of the fourth harmonic phase θ4 and the breakdown voltage of samples measured in each sample is shown in FIG. 46.

In these figures, ○ marks show the breakdown voltage of 300 kV or more ($\geqq 300$ Kv), □ marks show ones of over 100 kV under 300 kV, ◊ marks show ones of 100 kV and below ($\leqq 100$ kV).

At first, concerning to the fourth harmonic current I4, slight increase of the I4 is seen but it is under scattered a lot, corresponding to the decrease of the breakdown voltage, that is, the advance of deterioration.

This is due to that I4 reflects the amount of the water tree. Length of each cable is the same but, total amount of occurred water tree is different in each sample.

On the other hand, as shown in FIG. 46, the relation of the superimposed phase θ4 of the fourth harmonic current to the breakdown voltage has a good correlation.

In the breakdown of the deteriorated cables, the longest length water tree occurs the breakdown. So that FIG. 46 shows θ4 is not affected by the amount of the water tree because the θ4 reflects the length of the water tree occurred in the cable, particularly the information of the longest water tree.

The deterioration diagnosis is expected not only for estimating the deterioration degree of cables at the time, but also for casting the prospective life after the time. When estimating the progress of the deterioration after a time point, the amount of the water tree occurrence is important information. That is, more the amount of the water tree, which is a factor lowering the cable performance, is, higher the probability of the existence of water, which grows rapidly after the time is.

So, for estimating both of the state of the deterioration state at a time point and the possibility of the deterioration progress after the time, it is necessary for both of the degree of the water tree growth and the amount of the occurrence of the water tree to be estimated.

Figure 47:
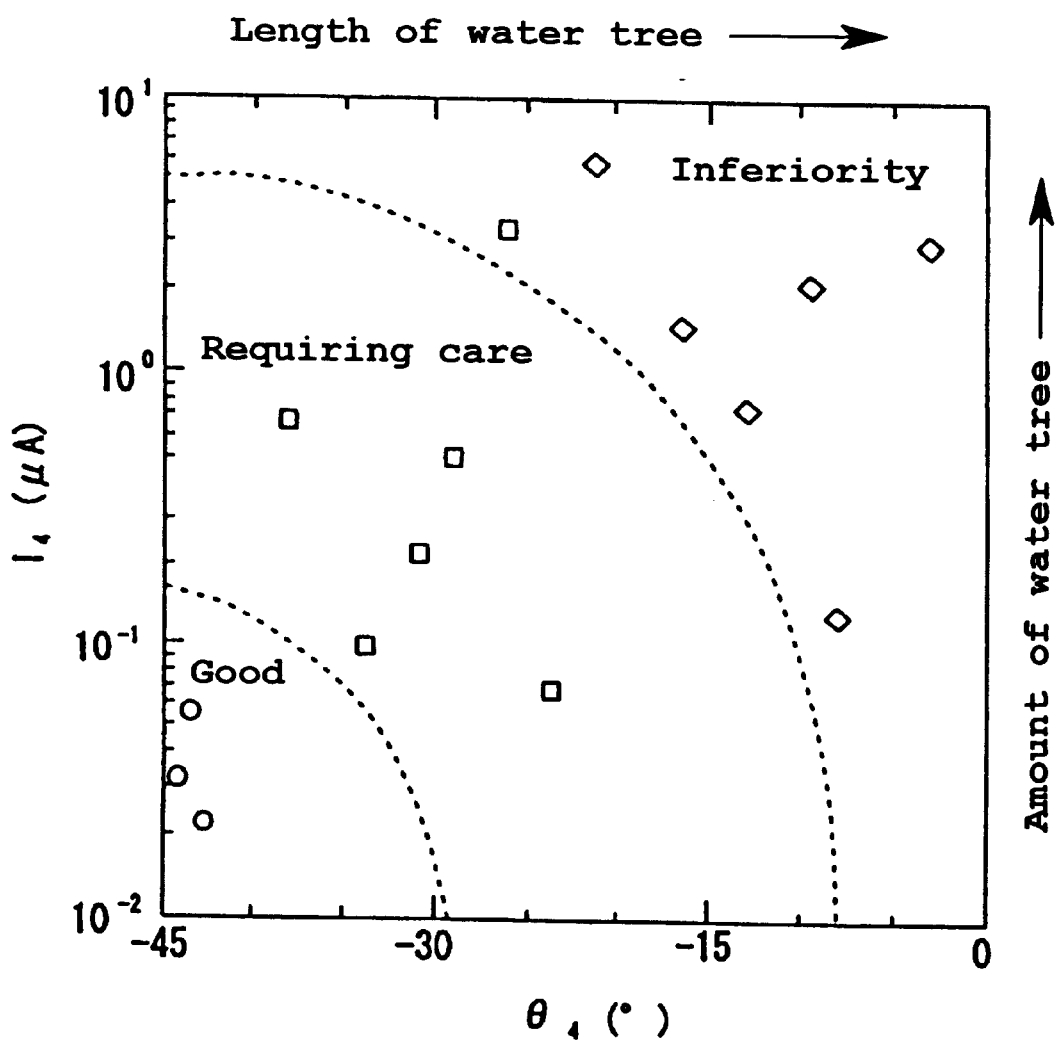
FIG. 47 shows a drawing for estimating together both of amplitude of the fourth harmonic current I4 and superimposing phases θ4.

FIG. 47 shows plots of the measured result for the samples, of which horizontal axis is θ4 and vertical axis is I4. Like this, estimating the deterioration state of both of the θ4 and the I4 on a same plain, for example, a diagnosis considering the prospective life, which is shown in the region marked by the dotted line, is possible.

(2) Estimating method of the deterioration by the voltage characteristic of I4 and θ4

There are not a little data that the tendency of the I4 and θ4 and the deterioration degree (breakdown voltage) of cables are not accorded in the above mentioned data of the embodiments. When the voltage characteristics of the I4 and θ4 of such cables are estimated, more precise diagnosis of the deterioration degree are implemented.

For example, the measured value of I4 and θ4 of the sample A and sample B shown in FIG. 45 and FIG. 46 are shown in FIG. 48, and concerning to both of I4 and θ4, these show a tendency that the sample A is more deteriorated than the sample B. But these breakdown voltage are 70 kV for the sample A and 45 kV for the sample B, so that the measured results do not correspond to the their deterioration degree.

Figure 49:
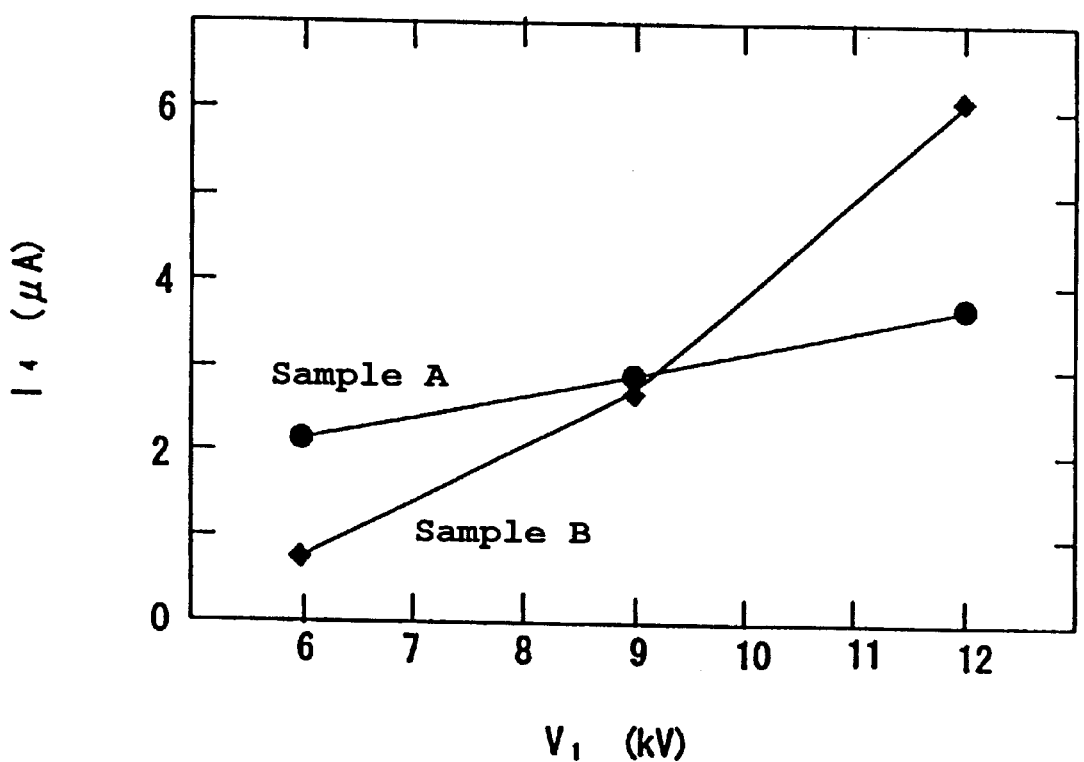
FIG. 49 shows a voltage characteristics of amplitude I4 of fourth harmonic current.
Figure 50:
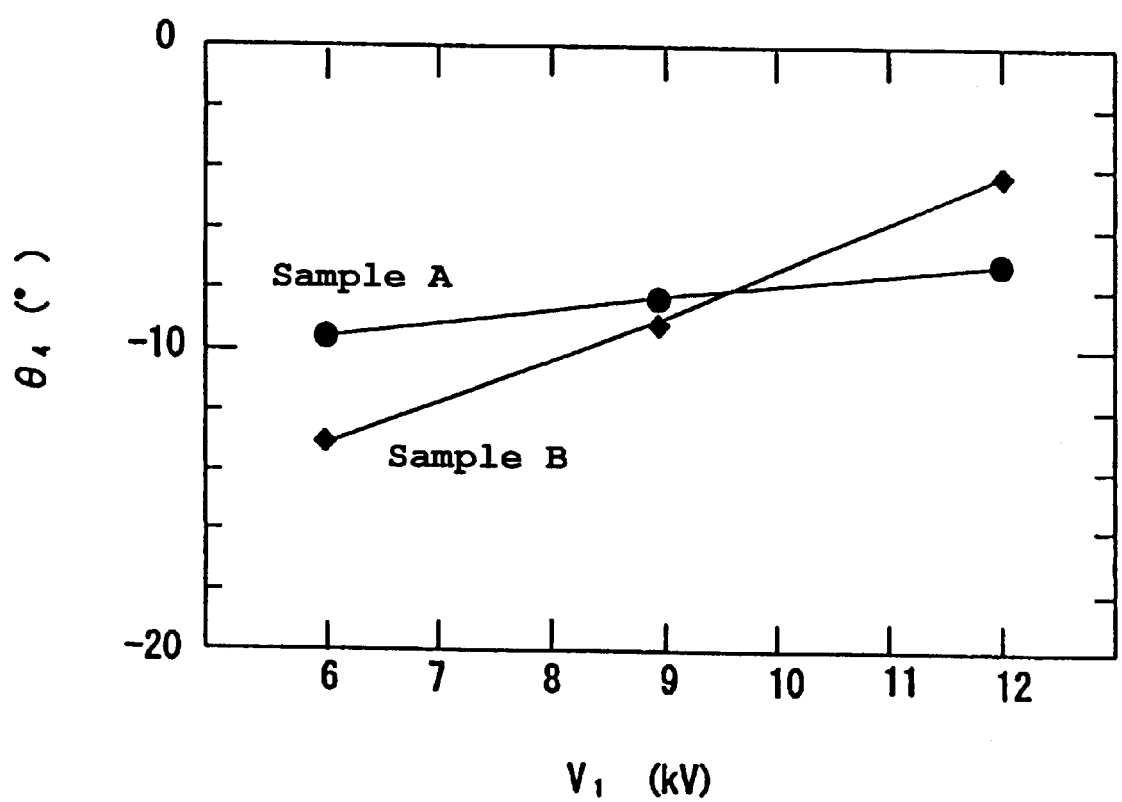
FIG. 50 shows a voltage characteristics of superimposing phases θ4 of the fourth harmonic current.

Now, the voltage characteristic of I4 and θ4 at the sample A and the sample B are shown in FIGS. 49 and 50, the increasing rate of the measured value according to the increase of the voltage at the sample B is greater in both of the I4 and the θ4, and the voltage characteristic appears remarkably.

So it may be estimated that the non-linearity of the water tree in the sample B is greater than the sample A, and the deterioration progress is greater. Like this, when the results by only the applied voltage condition are not estimated clearly, the more precise estimation of the deterioration diagnosis is possible by the measurement of voltage characteristic in plural voltage, so that more exact deterioration diagnosis is realized.

As mentioned above, the embodiments estimate current components I4 and current phase θ4 of frequency 4f (forth harmonic current) in loss current measured by superimposing the second voltage V2 of the frequency 2f to the first voltage V1 of frequency f together. Therefore the embodiments make it possible to diagnose the deterioration degree of cables at the time and also to forecast the prospective life after the time.

Also by the diagnosis method which estimates the voltage characteristics of I4 and θ4, more exact estimation of the deterioration degree of the sample is possible and more precise diagnosis is realized in the case when the estimation of the results measured by one condition of an applied voltage is not clear By the way, the above mentioned embodiment 2~embodiment 4, the deterioration diagnosis is explained by the cases which measure the amplitude of the fourth harmonic current appearing in the loss current by superimposing the voltage of frequency of two times of the fundamental to the fundamental, or the superimposed phase of the forth harmonic for the first voltage, but also the deterioration diagnosis is implemented by superimposing the voltage having 1/n times of frequency of the fundamental.

E. Embodiment 5: Large reduction of total cost necessary for the deterioration diagnosis.

As mentioned above, the deterioration diagnosis of the electric power cables are necessary for a big capacity transformer, and particularly, for a case of GIS line, there is a problem such as needing the cost for the gas treatment, so that the reduction of the total cost is desired.

For reduction of the total cost necessary for the diagnosis, lowering largely the measurement voltage to make the equipment small and light weight is basically necessary. Further voltage applying method without gas treatment for the GIS ended line is necessary.

Because of this, as the result of various investigations it is found that, a grounding terminal, which is used for so called megar check and is mounted between outer case of GIS conductor of end terminal of a cable, is usable for applying voltage to the cable conductor without gas treatment only by switch operation.

It is found clearly that the withstand voltage of this part is about 10 kV of DC voltage. So when applying the voltage by using the grounding terminal, it is allowed, to apply voltage below this voltage.

As this voltage is lower than the voltage for operation voltage 12.7 kV of 22 kV cable, diagnosing the deterioration effectively at this voltage cannot be applied to all diagnosis method.

The low measuring voltage means a low detecting sensibility of the deterioration signal, it is a phenomenon caused by that the noise level becomes large relatively to the deterioration signal.

Noises, which are problem in the deterioration diagnosis by alternative current, are direct current noise, same frequency components noise with the applied voltage, odd order harmonics noise of the frequency of the applied voltage and particularly the third harmonic.

On the other hand, for many diagnosis of the deterioration, the deterioration signals usually appear at DC on the same frequency band with the applied voltage, and on the odd order harmonics band of the applied voltage, so that when the measuring voltage is lowered, the deterioration signal is buried, so that there are many cases that the effective diagnosis does not implemented.

But, by superimposing the first voltage of frequency f as an AC voltage and the second voltage of frequency 2f having lower voltage than the first voltage to the cable, by observing the loss current obtained by rejecting the capacitive current component of frequency f which is leading 90° for the first AC component from the total current flowing out from the cable, it is found that the deterioration signal having frequency component of 4f is obtained as the deterioration signal.

By this method, the frequency component of 4f is even order harmonics for both of the two applied frequency components to the cable, and the deterioration signal occurs in the originally low noise level region, the necessary detection sense is obtained, even if the signal level is small.

However, it is not allowed to lower the voltage to any degree, the necessary lowest level exists. As the result of various experiments, it is found that the effective measurement of the lowest degree is possible by applying the electric field of about 0.1 kV/mm rms, it concerns to the line condition, however.

Like this, lowering the measuring voltage to make the equipment size of the transformer for the test small, the operation becomes easy, and the working cost is reduced.

Further, lowering voltage of the measurement is possible, so that the voltage applying through the GIS ground terminal is possible, and neglects the gas treatment of the GIS part to reduce the cost. At the same time, as the deterioration diagnosis measurement, it is possible to prevent lowering the sensitivity caused by lowering the measurement voltage, and deterioration diagnosis method which keeps a level of an accuracy and which is low cost is obtained.

Next present embodiments are explained by concrete examples.

(1) Provided sample

As the provided sample, two kinds of the following samples are used.

Water tree deteriorated, field aged cable

A cable of the insulation thickness of 6 mm of 22 kV XLPE cable with conductor size 150 mm$^2$, which is removed after 25 years use in water, is used. That was fabricated by the wet cross linking process and the inner semi-con layer made by extrusion and the outer semi-con layer is tape winding, that is so called E-T type.

In an investigation after removement, the breakdown voltage by AL voltage was verified and found that it was about 40–70 kV, and those which in this class were expected 150 kV or more ($\geqq$150 kV) in the fabricated time, so that the insulation property is lowered to 1/2 and below at that time. By the water tree investigation of sampled ones, it was found that the bow tie shaped tree is propagated to about 1000–2000 μm in the region near the inner semi-con, and water tree from outer semi-con is propagated to about 3000–4000 μm.

A new cable for comparing

As a no-deteriorated cable, a new one which is the insulation layer of 6 mm of XLPE cable with conductor size 150 mm$^2$ is used. The breakdown voltage is over 350 kV, and it has good characteristics as a cable made by the present fabrication technique level.

(2) Measuring example 1

Using the above-mentioned cable, results of the deteriorated signals measured by the lowered applied voltage are compared for two cases, one of which is a case measuring the third harmonic in loss current applying only the commercial frequency AC voltage, and another one of which is a case measuring the fourth harmonic in the loss current superimposing the AC current of the frequency of two times of the commercial AC voltage.

In this experiment, for the following three cases, measurements are implemented by pretty lower measuring voltages than the operation voltage of 12.7 kV.

[1] A case measuring the third harmonic in the loss current applying only the AC voltage 3 kV of the commercial supply frequency of 50 Hz.

[2] A case measuring the fourth harmonic (200 Hz) in the loss current applying the AC voltage 2 kV of the commercial supply frequency of 50 Hz, and voltage of 0.6 kV of frequency of 100 Hz.

[3] A case measuring the fourth harmonic (200 Hz) in the loss current applying the AC voltage 1 kV of the commercial supply frequency of 50 Hz, and voltage of 0.3 kV of frequency of 100 Hz.

In the experiment, the cable length is 50 m.

Figure 51:
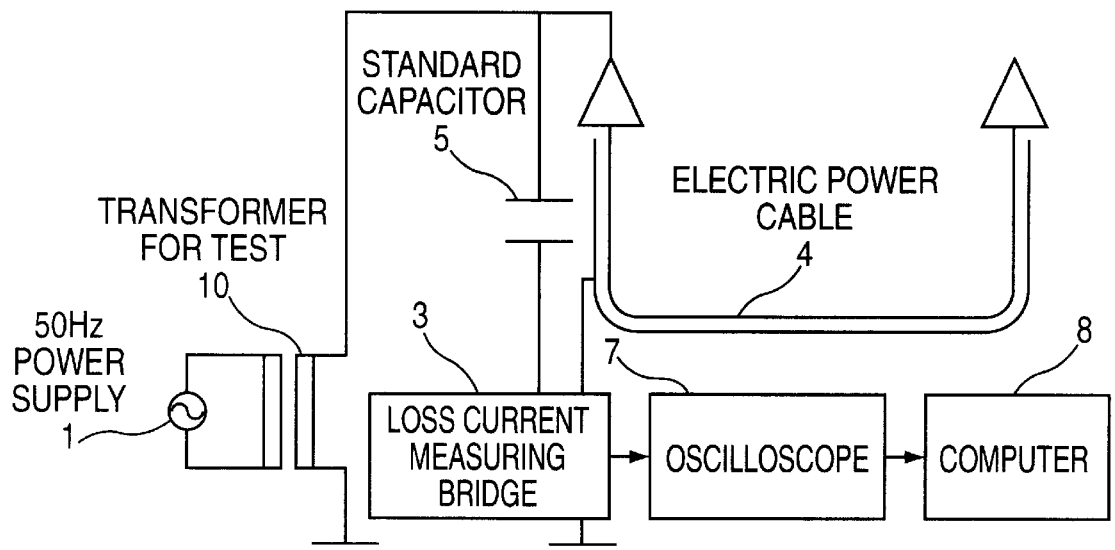
FIG. 51 shows a measuring circuit which is used for measuring the third harmonic in loss current by applying only the commercial supply alternative voltage.

In the case of [1], applying the voltage to the cable is implemented by a test transformer on a circuit shown in FIG. 51.

That is, as shown in the figure, a standard capacitor 5 is connected to an electric power cable 4 in a parallel, the voltage is applied by the power supply 1 (frequency f1) through the test transformer 10, and the current flowing in the insulator of the electric power cable 4 and the loss current flowing in the standard capacitor 5 are input into the loss current measurement bridge 3. Further, rejecting the components leading 90° for the first voltage V1 from the current flowing in the insulator, the loss current is obtained. Further, the output of the loss current measurement bridge 3 is guided to the oscilloscope 7, and the waves are analyzed by the computer 8.

Figure 52:
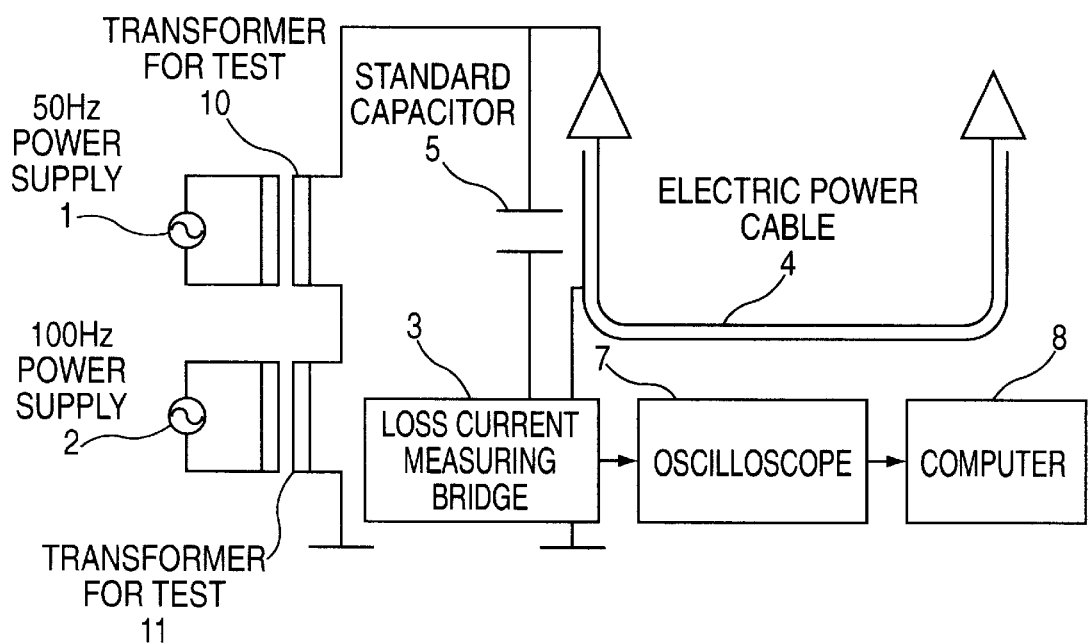
FIG. 52 shows a measuring circuit which is used for measuring the fourth harmonic in the loss current by applying the commercial frequency alternative voltage and the voltage of frequency of two times of commercial frequency.

In the case of [2], [3], the test transformer is used on a circuit shown in FIG. 52. That is, a standard capacitor 5 is connected to a electric power cable 4 in a parallel, the voltage is applied by the power supply 1 (frequency 50 Hz) and the power supply 2 (frequency 100 Hz) through the test transformer 10, 11, and the current flowing in the insulator of the electric power cable 4 and the current flowing in the standard capacitor 5 are input into the loss current measurement bridge 3. Further, rejecting the components leading 90° for the first voltage V1 from the current flowing in the insulator, the loss current is obtained. Further, the output of the loss current measuring bridge 3 is guided to the oscilloscope 7, and the waves are analyzed by the computer 8.

Power supply in the [1] is taken care for the harmonics, particularly taking care suppressing the third harmonic to some degree, as the result, the containing rate of the third harmonic in the applied voltage is suppressed to about 0.4%.

On the other hand, in the [2], [3], when superimposing the 100 Hz for voltage 50 Hz, the zero cross coincidence such as to be A sin($\omega$t)+B sin(2$\omega$t), and the harmonics occurring in the voltage are not taken cares particularly in the experiment. As a process of the experimental data, results arranged by the amplitude of the measured current are shown in FIG. 53.

As shown clearly in the figure, both of the field aged cable and the new cable show the same measurement results, and the progress of the existence of the deterioration cannot be determined in the case of [1].

For this, in the cases [2], [3], there are clear difference of the amplitude of the measured deterioration signals between the field aged cable and the new cable. In the [1], even considering so as the applied voltage not to be contained the harmonics at the measurement, the existence or no-existence of the deterioration progress is not determined, however. But, in the [2], [3], the existence or no-existence of the deterioration progress is determined without taking consideration for the harmonics. Like this there are remarkable difference between them.

Like this, when the deterioration diagnosis is implemented by applying the voltage of mono frequency and the third harmonic and lowering the measurement frequency, effective deterioration measurement is impossible. On the other hand, the effects of the deterioration diagnosis method which, applying the fundamental voltage having frequency f and superimposing a voltage having the frequency 2f of two times of the frequency f, measures the fourth harmonic of the fundamental voltage is confirmed principally.

(3) Measuring example 2

Next, it has been investigated about what voltage is the lower limit for implementing the effective deterioration diagnosis of the present invention. In this experiment, changing the voltage of 50 Hz, and superimposing the 100 Hz voltage corresponding to 30% of the voltage, the fourth harmonic current has been measured.

The results are shown in FIG. 54.

The fourth harmonic current measured in the new cable does not change greatly, when the applied voltage changes. This means the measured current is noise.

For this, it is found that the fourth harmonic current measured in the field aged cable is lowered according to the drop of the applied voltage.

From this, even if the voltage of frequency of two times of a basic frequency is superimposed to the fundamental, and the deterioration diagnosis is implemented by measuring the fourth harmonic current, when the measuring voltage is lowered excessively, the effectiveness of the deterioration diagnosis is lost. So the lower limit voltage which is allowed is investigated.

Now, a reference is that which the current obtained as the deterioration signal is no less than two times of the noise level or not. That is S/N ratio, when this level is over two, to distinguish the noise and the signal is possible. Referring FIG. 54 in this viewpoint, it is found that, when the basic voltage is over 0.6 kV, it is satisfied.

The provided sample for this time is insulator thickness of 6 mm, so that the mean stress is 0.1 kV/mm. So applying the stress of this degree at least, the measurement of the sufficiently large S/N ratio is possible.

(4) Investigation

On the other hand, for making the measured deterioration signals large, it is proper to make the applied voltage large, but, as the measurement has a feature of on site measurement, it is necessary for the test transformer for on site measurement to be small. The size and weight of the transformer is decided by maximum applied voltage and load capacitance of a cable line.

Investigating the capacitance of cable lines for diagnosing the deterioration, it is found that, when considering about 3 $\mu$F as the maximum value, cable lines of over 90% can be covered.

Now, calculations for obtaining the test transformers weight has been tried for various voltages on the conditions of maximum capacitance of 3 $\mu$F, fundamental voltage of frequency 50 Hz, superimposed voltage of frequency 100 Hz and its maximum voltage of 30% of the fundamental voltage. This includes equipment of electricity system containing all subsidiary device as a voltage controller, a compensation reactor and control panel etc. The results are shown in FIG. 55.

Considering to aspect of mobility of the deterioration diagnosis, satisfying a condition carrying the test equipment with wide use on site is necessary. From this aspect, it is desirable that loading on a car of 4 t burden which is driven by an ordinary car driving license possible. From this view, maximum output voltage of 10 kV is the upper limit. A test equipment less with small output voltage can be carried in a field without a special car driving license which is not wide use, such as a driving license for a large-sized truck.

(5) Summary

As the result of the experiments and investigations, implementing the measurement satisfying the following condition, the deteriorating state is determined by a sufficient measuring sensitivity, and the measurement is implemented by a test device, which has mobility, considering the on site testing and wide use, is possible.

[1] As measuring method, the following is adopted, that is, superimposing voltage to a cable, the first voltage of frequency f as a AC voltage components, and the voltage of frequency 2f as the second AC voltage components having lower voltage than the first voltage, and observing the fourth harmonic component in the loss current obtained by rejecting the capacitive current component of frequency f which is leading 90° for the first AC voltage component from the total charging current running out from the cable, the deterioration is implemented.

[2] That the applied stress by the first AC voltage components at the measurement is, at least, 0.1 kV/mm and more.

[3] That the maximum value of the first alternative voltage component at the measurement is 10 kV and below.

F. Another embodiment

In the embodiments 1–5 mentioned above, as measuring method of the loss current component, the following method is explained, that is, applying the voltage V1 of frequency f1 to the electric power cable, and measuring the loss current component rejecting the capacitive component of frequency f1 contained in the total current flowing in the insulation of the electric power cable, investigating the current waves and its frequency components, next, keeping the first voltage, superimposing the voltage V2 of frequency f2 (V1$\geq$V2). But, the measuring method of the loss current is not limited the above mentioned method, for example, the following method is possible.

That is, applying the voltage V1 of frequency f1 to the electric power cable, and measuring the loss current component rejecting the capacitive component of frequency f1 contained in the total current flowing in the insulation of the electric power cable, next, keeping still the operation rejecting the above mentioned capacitive components, and changing the first voltage V1 of frequency f1 to apply a composed voltage wave of the voltage of frequency f1 and the voltage V2 of frequency f2 (V1$\geq$V2).

Concretely, it is the following method, that is, implementing a bridge operation for measuring the loss current by applying the first voltage V1, and keeping the valance state, making the voltage V1 off. After this, waves that the voltage V1 and the voltage V2 are previously composed are applied to a cable directly to measure the bridge output.

By this method, it is not necessary for two power supplies for 50 Hz and 100 Hz to be provided separately for each, when there is an oscillator capable for generating any composite wave+power amplifier+transformer, one power supply is only needed.

5 Usable field for industry

As explained above, even if harmonics contained in a voltage for measurement is large, and the diagnosis by the third harmonic in loss current cannot be implemented exactly, the deterioration diagnosis of the electric power cable is implemented exactly without affection of the harmonics in the power supply by the present invention.

Because of this, when the removal of the harmonics from the measuring current is difficult in a case such as measurement on site, or a deterioration diagnosis of the electric power cable which cost for the countermeasure is high, the present invention has a lot of merits.

Also, as the present invention having necessary and sufficient signal detection sensitivity, and implementing the deterioration diagnosis by using a test equipment which is a wide use and portable type, a deterioration diagnosis method being good practical use on site and having mobility is realized.

What is claimed is:

1. A method of deterioration diagnosis of an insulation of an electric power cable comprising the steps of:
    (a) superimposing a first voltage V1 of frequency f1 and a second voltage V2 of frequency f2 (V1≧V2) to an electric power cable,
    (b) measuring a loss current component exclusive of a capacitive component of said frequency f1, in a current flowing between a ground and an electric power cable through an insulation,
    (c) investigating frequency components contained in said loss current, and
    (d) diagnosing deterioration by examining frequency components except for said frequency component f1, said frequency f2 and the third harmonic of said frequency f1, f2.

2. A method of deterioration diagnosis of said electric power cable in claim 1 comprising:
    considering frequency components of f2+2×f1 or |f2−2×f1| in said frequency component contained in said loss current.

3. A method of deterioration diagnosis of said electric power cable in claim 1 comprising:
    as combinations of said frequency f1 and f2 of AC voltage, using a combination that said frequency f2 is 1/n times of said frequency f1 (n is a 3 or more integer (n≧3)).

4. A method of deterioration diagnosis of said electric power cable in claim 1, comprising:
    when superimposing said first voltage V1 of said frequency f1 to said electric power cable, measuring a loss current component obtained by rejecting a capacitive component of said frequency f1 contained in said current in said insulator of said electric power cable, investigating a current wave and a frequency component contained in said loss current
    next, keeping the first voltage, measuring said loss current in the case superimposing the voltage V2 of frequency f2 (V1≧V2),
    investigating said current wave and said frequency components contained in said loss current, and diagnosing deterioration by said frequency components excepting said frequency f1, f2 and the third harmonic of said frequency f1, f2 in both loss current.

5. A method of deterioration diagnosis of electric power cables in claim 1, comprising:
    when superimposing said first voltage V1 of said frequency f1 to said electric power cable, measuring a loss current component obtained by rejecting a capacitive component of said frequency f1 contained in said current in said insulator of said electric power cable,
    next, when keeping still an operation rejecting said capacitive components, and changing said first voltage V1 of said frequency f1, applying a composed voltage wave of said voltage f1 of said frequency f1 and said voltage V2 of said frequency f2 (V1≧V2), said loss current component is measured,
    investigating said current wave and said frequency components contained in said loss current, and diagnosing deterioration by said frequency components excepting said frequency f1, f2 and the third harmonic of said frequency f1, f2 in both loss current.

6. A method of deterioration diagnosis of said electric power cable in claim 1, comprising:
    said first voltage V1 is a commercial supply frequency.

7. A method of deterioration diagnosis of said electric power cable in claim 1 comprising:
    as combinations of said frequency f1 and f2 of AC voltage, using a combination that said frequency f2 is two times of said frequency f1.

8. A method of deterioration diagnosis of said electric power cable in claim 7, where measures a current component of frequency of four times of said first voltage in said frequency components contained in said loss current comprising:
    changing a phase of a voltage having a frequency of two times of said first voltage for said first voltage, and measuring a change width of said current component having said frequency of four times of said first voltage.

9. A method of deterioration diagnosis of said electric power cable in claim 7, where measures a current components of frequency components of four times of said first voltage in said frequency components contained in said loss current comprising:
    both of an amplitude of said current components I4 of said fourth harmonic in said loss current, and superimposed phases θ4 of said fourth harmonic components for said first voltage are estimated together.

10. A method of deterioration diagnosis of said electric power cable in claim 7, where measures a current components of frequency components of four times of said first voltage in said frequency components contained in said loss current comprising:
    keeping a rate of said first voltage to said second voltage same, measuring for two values of voltage at least, and estimating a voltage characteristics a current component of said fourth harmonic I4, and a voltage characteristic of a superimposed phases θ4 of said fourth current components for said first voltage.

11. A method of deterioration diagnosis of said electric power cable in claim 7, where measures said current components of frequency components of four times of said first voltage in said frequency components contained in said loss current comprising:
    from relation between a superimposed phase θv2 of said second voltage V2 for said first voltage V1, and a superimposed phase θ4 of a fourth harmonic component in said loss current for said first voltage V1, deterioration degree of said cable is implemented.

12. A method of deterioration diagnosis of said electric power cable in claim 11 comprising:
    using relations between said superimposed phase θv2 of said second voltage V2 for said first voltage V1, and said superimposed phase θ4 of said fourth harmonic component in said loss current for said first voltage V1 is approximated by a constant slope of a line defined corresponding to a degree of the deterioration, said deterioration diagnosis is implemented by said superimposed phase θ4 of said fourth harmonic component measured under a superimposed voltage, and said superimposed phase θv2 of the second voltage.

* * * * *

UNITED STATES PATENT AND TRADEMARK OFFICE
CERTIFICATE OF CORRECTION

PATENT NO. : 6,340,891 B1
DATED : January 22, 2002
INVENTOR(S) : Yagi et al.

It is certified that error appears in the above-identified patent and that said Letters Patent is hereby corrected as shown below:

Title page, Item [54] and Column 1, line 1,
Title, cancel the Title and insert -- METHOD FOR DIAGNOSING THE DETERIORATION OF THE INSULATION OF AN ELECTRIC POWER CABLE --

Column 8,
Line 28, cancel "$\geq$" insert -- $\leqq$ --

Signed and Sealed this

Twelfth Day of November, 2002

Attest:

JAMES E. ROGAN
Attesting Officer  Director of the United States Patent and Trademark Office